United States Patent
Masuda et al.

(10) Patent No.: US 10,373,994 B2
(45) Date of Patent: Aug. 6, 2019

(54) IMAGE SENSOR, FOR SUPPRESSING OCCURRENCE OF NOISE COMPONENTS

(71) Applicant: Sony Corporation, Tokyo (JP)

(72) Inventors: Yoshiaki Masuda, Kumamoto (JP); Takeshi Matsunuma, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 24 days.

(21) Appl. No.: 13/972,019

(22) Filed: Aug. 21, 2013

(65) Prior Publication Data

US 2014/0063303 A1    Mar. 6, 2014

(30) Foreign Application Priority Data

Aug. 30, 2012  (JP) ................. 2012-190661

(51) Int. Cl.
*H01L 27/146* (2006.01)
*H01L 27/148* (2006.01)

(52) U.S. Cl.
CPC .. *H01L 27/14625* (2013.01); *H01L 27/14629* (2013.01); *H01L 27/14685* (2013.01); *H01L 27/14812* (2013.01); *H01L 27/14818* (2013.01)

(58) Field of Classification Search
CPC ............... H01L 27/14818; H01L 22/12; H01L 27/14812
See application file for complete search history.

(56) References Cited

U.S. PATENT DOCUMENTS

2010/0078744 A1*  4/2010  Wano ................ H01L 27/14629
                                                    257/432
2010/0084728 A1*  4/2010  Yamada ............ H01L 27/14621
                                                    257/432

FOREIGN PATENT DOCUMENTS

JP    2010-093081    4/2010
JP    2011-023455    2/2011

* cited by examiner

*Primary Examiner* — Amar Movva
(74) *Attorney, Agent, or Firm* — Chip Law Group

(57) ABSTRACT

There is provided an image sensor having a plurality of pixels, each pixel including a light receiving portion configured to receive incident light, a waveguide configured to guide the incident light from a light incident surface to the light receiving portion, and a light shielding portion disposed between the light incident surface and the light receiving portion, for blocking the incident light. The light shielding portion has an opening formed near a light emitting surface of the waveguide. The light receiving portion receives the incident light passing through the waveguide and the opening. A width of a core of the waveguide and a width of the opening are set so that the widths increase as a wavelength of the light incident on a pixel becomes longer.

12 Claims, 33 Drawing Sheets

CROSS SECTION OF A-A

FIG. 3
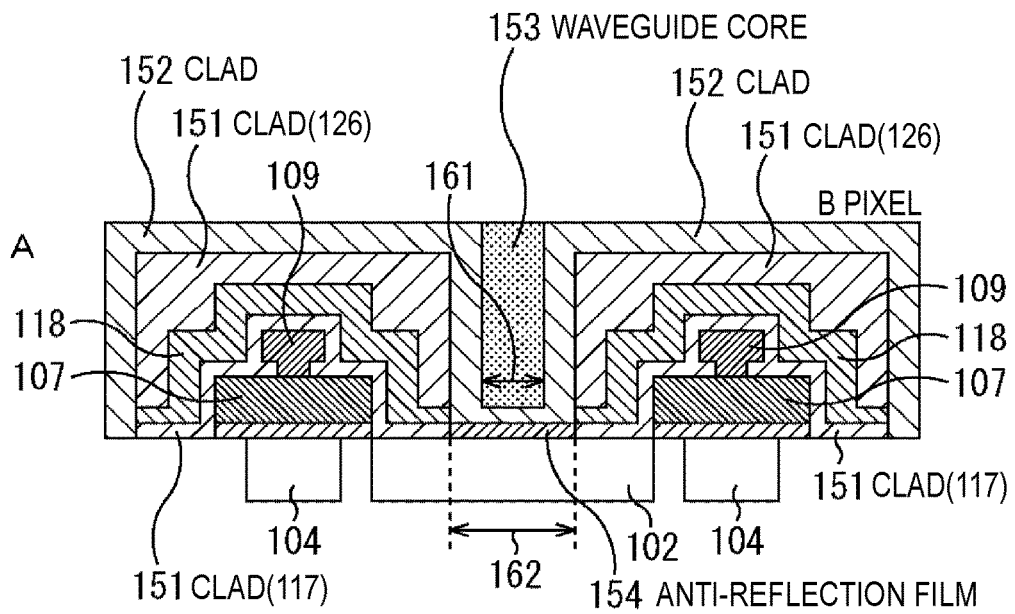
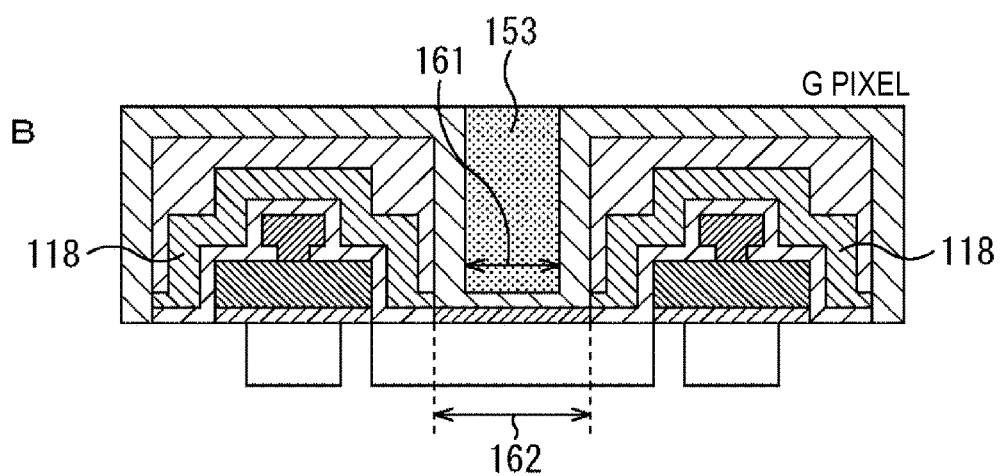
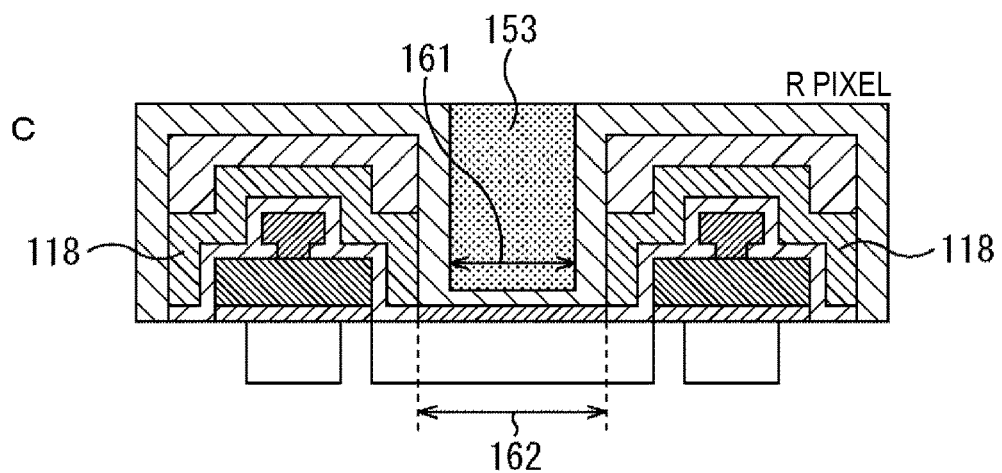

CROSS SECTION OF A-A

CROSS SECTION OF A-A

FIG. 11
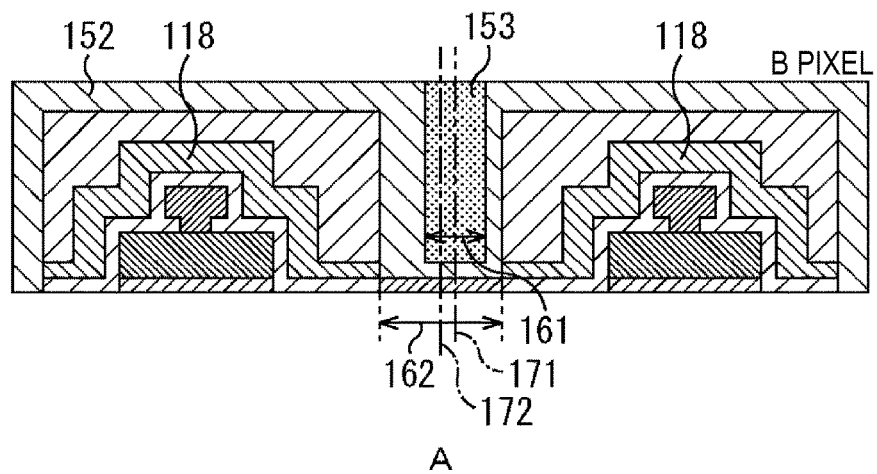
A
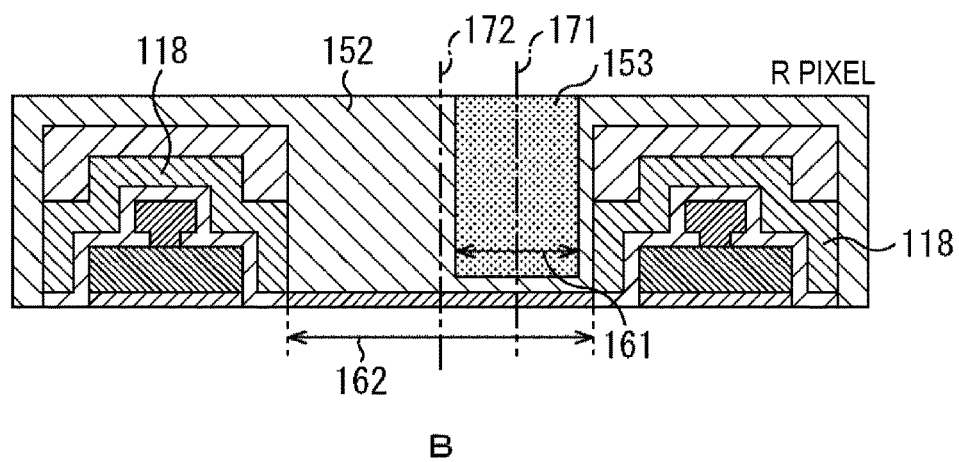
B
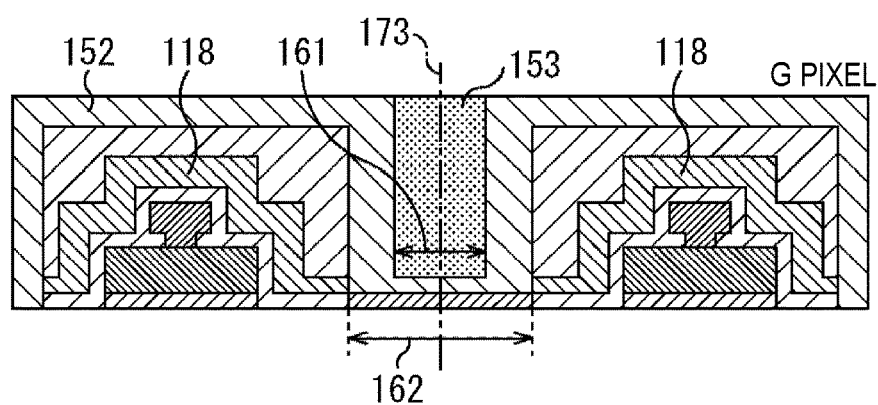
C

FIG. 12
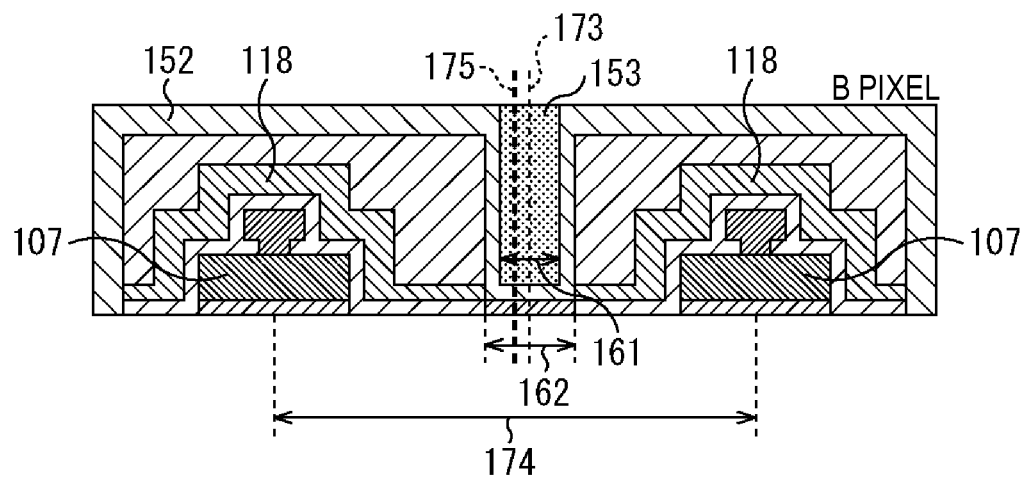
A
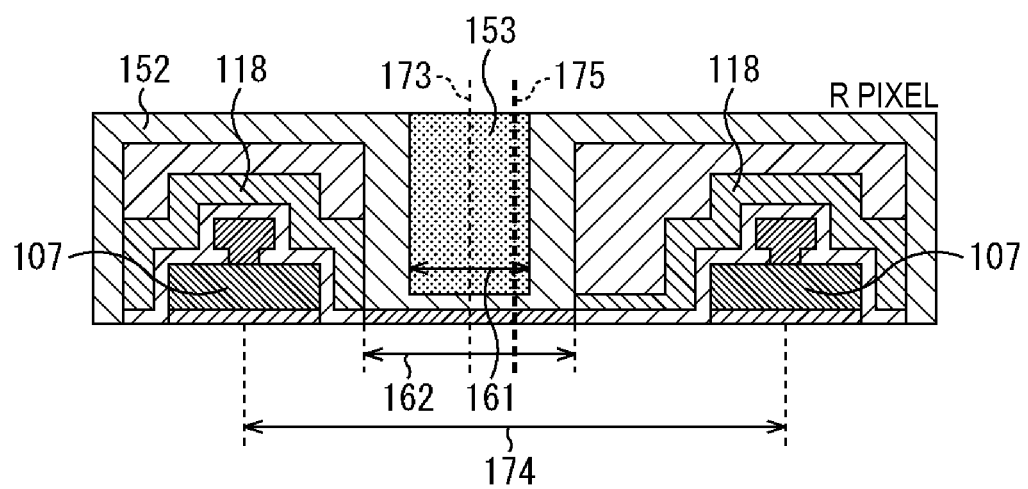
B

FIG. 18
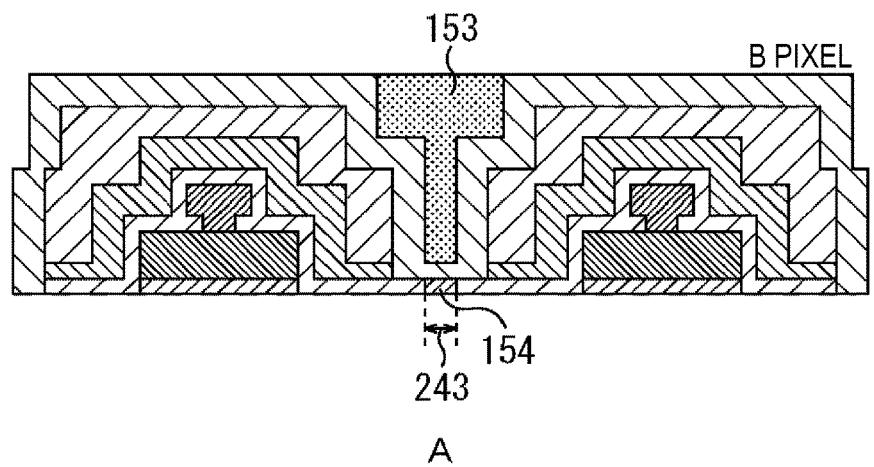
A
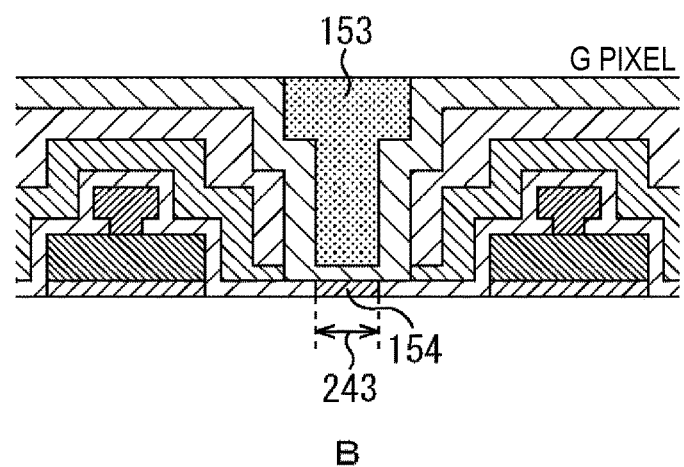
B
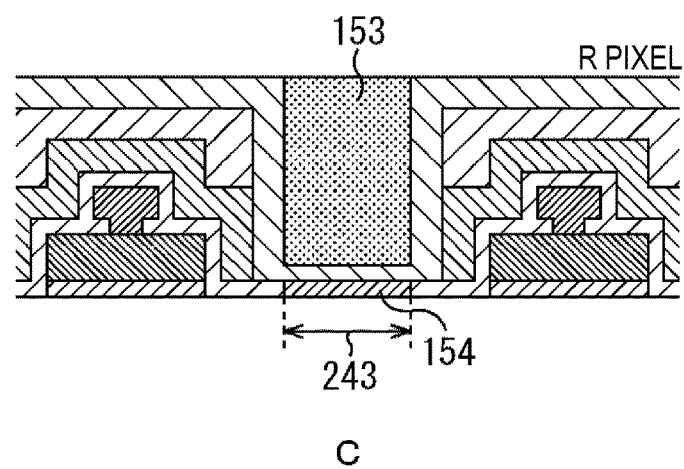
C

FIG. 19
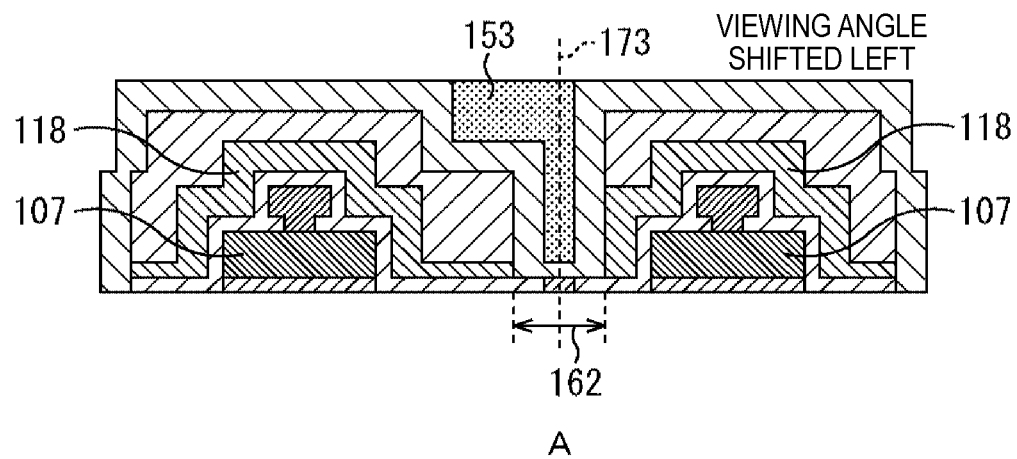
A
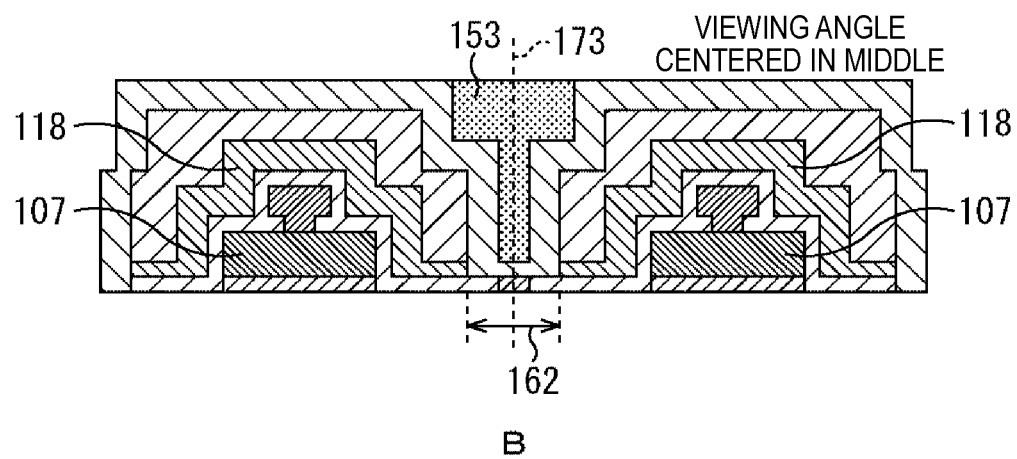
B
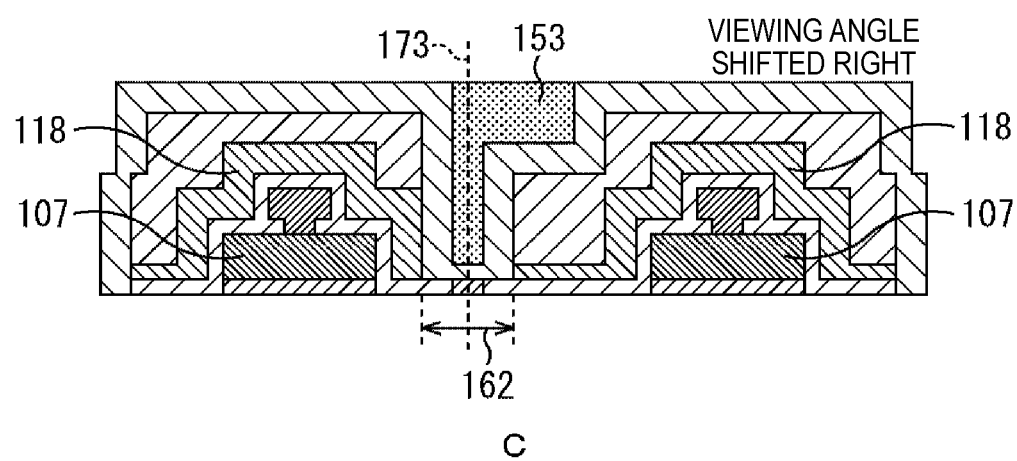
C

FIG. 28
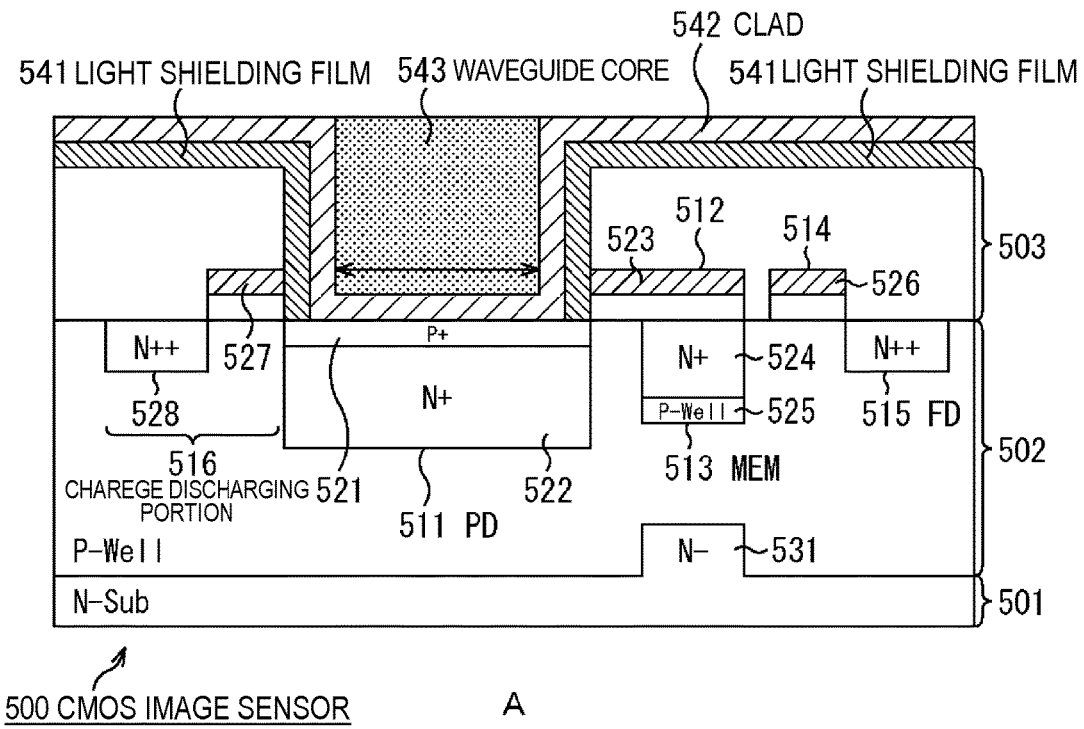
A
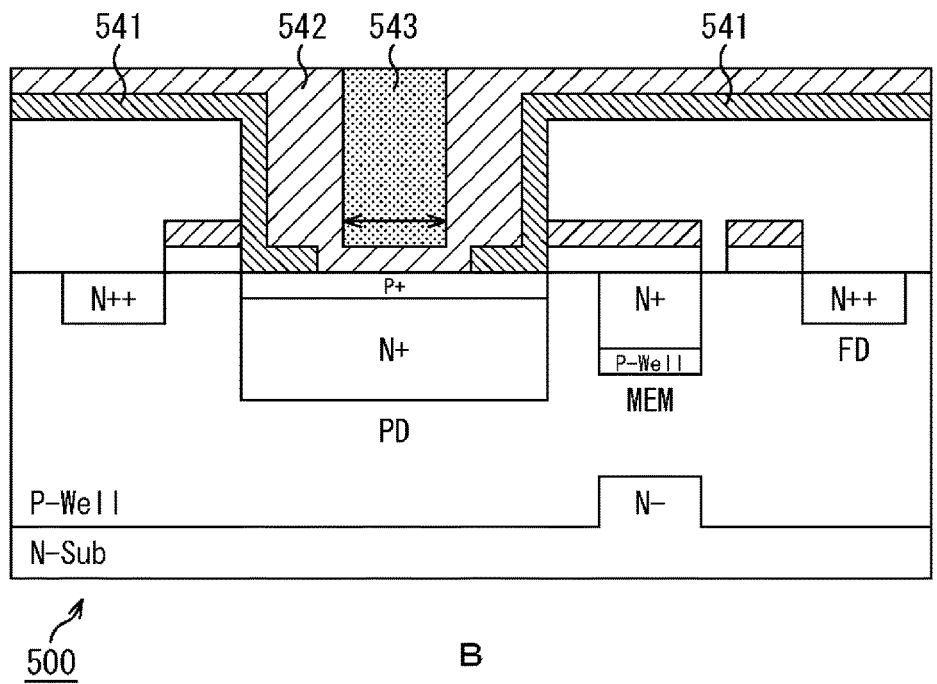
B

FIG. 31
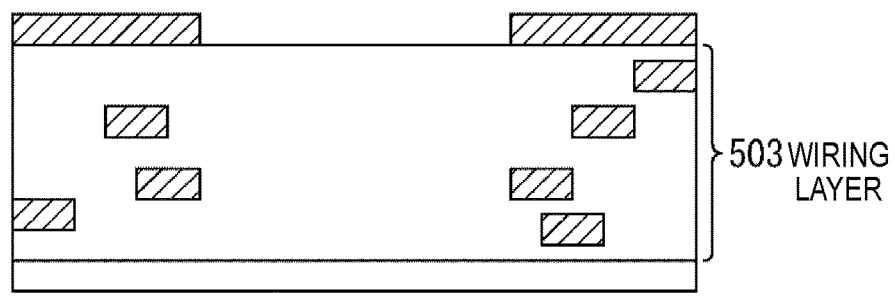
A
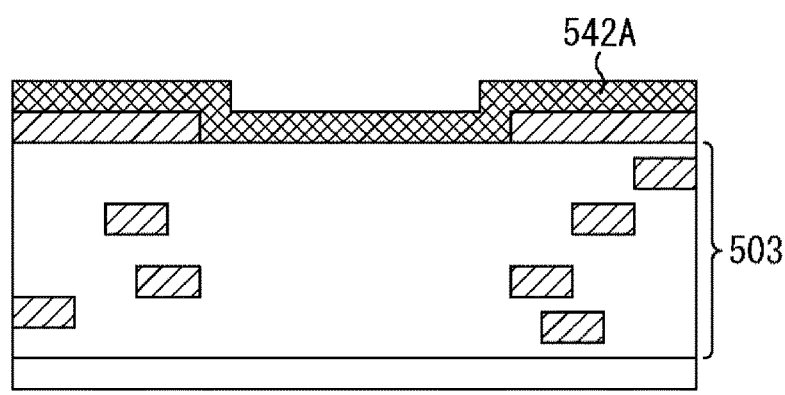
B
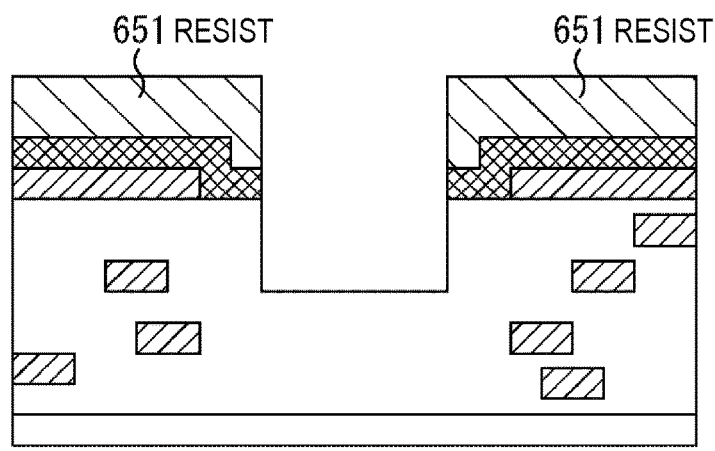
C

FIG. 32
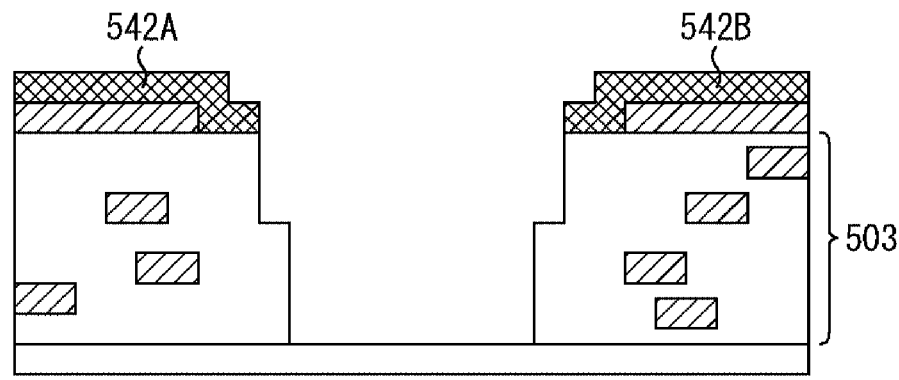
A
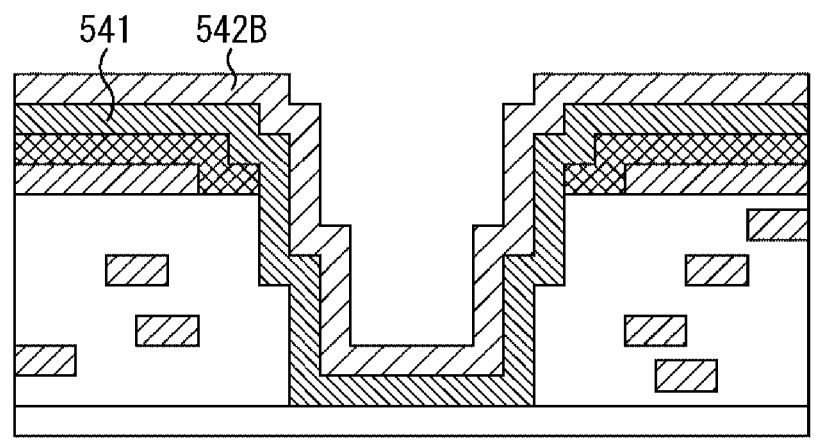
B
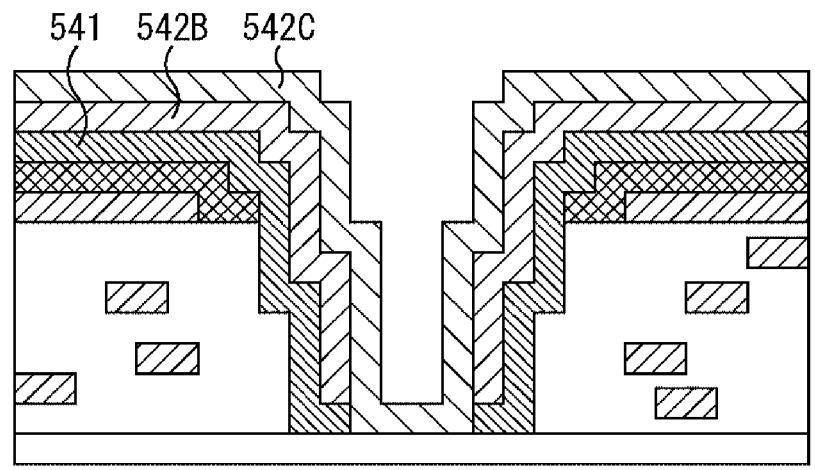
C

IMAGE SENSOR, FOR SUPPRESSING OCCURRENCE OF NOISE COMPONENTS

BACKGROUND

The present technology generally relates to an image sensor, an imaging apparatus, and an apparatus and method for manufacturing the image sensor. More particularly, the present technology relates to an image sensor, an imaging apparatus, and an apparatus and method for manufacturing the image sensor, capable of suppressing occurrence of noise components.

Recently, for an image sensor adapted to perform photoelectric conversion of incident light, a technique for concentrating incident light by on-chip lens or inner lens and guiding light confined within a waveguide to a sensor (light receiving portion) has been employed. Unfortunately, even in the image sensor having such a waveguide structure, light condensing characteristics may be deteriorated with pixel miniaturization.

For example, the diffraction limit of visible light with pixel miniaturization makes it difficult to guide light from a lens to a waveguide, to confine it within the waveguide, and to control diffracted light from a waveguide core portion and a light shielding material opening. More specifically, as pixel size becomes smaller, noise (smear or color mixture) due to light incident obliquely from adjacent pixels or noise due to diffraction of light from a waveguide core portion and a light shielding material opening may be increased.

In this regard, the structure adapted to be able to change a width of a light shielding material opening for each color has been considered (for example, refer to Japanese Unexamined Patent Application Publication No. 2010-93081). In addition, the structure adapted to be able to change a width of a waveguide core for each color has been considered (for example, refer to Japanese Unexamined Patent Application

SUMMARY

However, in the structure for changing a width of a light shielding material opening as disclosed in Japanese Unexamined Patent Application Publication No. 2010-93081, the amount of reduction in noise components obtained by using the pixel miniaturization technique being used currently is extremely small, and thus it is difficult to substantially suppress occurrence of noise components. In addition, the structure for changing a width of a waveguide core as disclosed in Japanese Unexamined Patent Application Publication No. 2011-23455 is intended to improve sensitivity, thus it is not possible to suppress occurrence of noise components.

An embodiment of the present technology has been made in view of the above, and thus there is provided an image sensor, an imaging apparatus, and an apparatus and method for manufacturing the image sensor, capable of suppressing occurrence of noise components.

According to an embodiment of the present technology, there is provided an image sensor having a plurality of pixels, each pixel including a light receiving portion configured to receive incident light, a waveguide configured to guide the incident light from a light incident surface to the light receiving portion, and a light shielding portion disposed between the light incident surface and the light receiving portion, for blocking the incident light. The light shielding portion has an opening formed near a light emitting surface of the waveguide. The light receiving portion receives the incident light passing through the waveguide and the opening. A width of a core of the waveguide and a width of the opening are set so that the widths increase as a wavelength of the light incident on a pixel becomes longer.

The width of the core and the width of the opening may set to have a size such that oblique incident light is blocked by the light shielding portion and an amount of light in diffracted light at both ends of the opening is decreased, the oblique incident light passing through the opening and being incident on an outside of the light receiving portion.

A width of the core in the light emitting surface of the waveguide may be set to be wider as the wavelength of the light incident on a pixel becomes longer.

A width of the core in the light incident surface of the waveguide may be set to have a size different from the width of the core in the light emitting surface of the waveguide.

The width of the core in the light incident surface of the waveguide may be set to be wider as the wavelength of the light incident on a pixel becomes longer.

The width of the core in the light incident surface of the waveguide may be set to be wider as the wavelength of the light incident on a pixel becomes shorter.

The width of the core in the light incident surface of the waveguide may be set to have a predetermined size regardless of a wavelength of the incident light.

A center of the core may be located at a position determined for each wavelength range of the incident light with respect to a center of the opening.

A center of the core and a center of the opening may each be located at a position determined for each wavelength range of the incident light with respect to a center of a pixel.

The waveguide may include the core with a high refractive index and a clad with a lower refractive index than the core, the clad with a lower refractive index being formed near the core.

The clad may include a plurality of layers and have refractive indexes lowered from an outer layer to an inner layer of the waveguide.

The image sensor may further include an anti-reflection film disposed between the opening and the light receiving portion.

The anti-reflection film may be formed to have a size corresponding to the width of the core.

A pupil correction may be performed on a position of a center of the core and a position of a center of the opening with respect to a center of the light receiving portion, the pupil correction being performed depending on a position of a target pixel in a photoelectric conversion region.

The image sensor may further include a condensing lens configured to condense the incident light, and a filter configured to extract a predetermined wavelength range component from the incident light transmitted through the condensing lens. The incident light of the wavelength range component transmitted through the condensing lens and the filter may be incident on the waveguide.

According to another embodiment of the present technology, there is provided an imaging apparatus including an image sensor having a plurality of pixels, and an image processing portion configured to perform an image processing on an image of a subject obtained by photoelectric conversion in the image sensor. Each of the pixels includes a light receiving portion configured to receive incident light, a waveguide configured to guide the incident light from a light incident surface to the light receiving portion, and a light shielding portion disposed between the light incident surface and the light receiving portion, for blocking the incident light. The light shielding portion has an opening formed near a light emitting surface of the waveguide. The light receiving portion receives the incident light passing through the waveguide and the opening. A width of a core of the waveguide and a width of the opening are set so that the widths increase as a wavelength of the light incident on a pixel becomes longer.

According to yet another embodiment of the present technology, there is provided an apparatus for manufacturing an image sensor, the apparatus including a patterning portion configured to perform patterning of a resist so that a light shielding material and a clad are etched as a wavelength of light incident on a pixel becomes longer with respect to the image sensor formed by stacking the light shielding material and the clad an etching portion configured to etch the light shielding material and the clad based on the resist patterned by the patterning portion, a clad deposition portion is configured to deposit a clad on a surface of the image sensor, the surface being etched by the etching portion, and an embedding portion configured to embed a material with a high refractive index for forming a core of a waveguide in a portion etched by the etching portion.

According to still another embodiment of the present technology, there is provided a method of manufacturing an image sensor in a manufacturing apparatus, the method including performing patterning of a resist so that a light shielding material and a clad are etched as a wavelength of light incident on a pixel becomes longer with respect to the image sensor formed by stacking the light shielding material and the clad, etching the light shielding material and the clad based on the resist, depositing a clad on an etched surface of the image sensor, and embedding a material with a high refractive index for forming a core of a waveguide in an etched portion.

The method may further include prior to depositing the clad, processing the light shielding material and widening a width of a portion having a thin thickness of the light shielding material as the wavelength of the light incident on the pixel becomes longer.

The method may further include depositing an uneven material, processing for causing a width of a portion having a thin thickness of the uneven material to be wider as the wavelength of the light incident on the pixel becomes longer, and depositing the light shielding material and the clad on a surface of the processed uneven material.

In an embodiment of the present technology, in each of a plurality of pixels, there are provided a light receiving portion configured to receive incident light, a waveguide configured to guide the incident light from a light incident surface to the light receiving portion, and a light shielding portion disposed between the light incident surface and the light receiving portion for blocking the incident light. The light shielding portion has an opening formed near a light emitting surface of the waveguide, the light receiving portion receives the incident light passing through the waveguide and the opening, and a width of a core of the waveguide and a width of the opening are set so that the widths increase as the wavelength of light incident on a pixel becomes longer.

In another embodiment of the present technology, there are provided an image sensor having a plurality of pixels and an image processing portion configured to perform an image processing on an image of a subject obtained by photoelectric conversion in the image sensor. Each of the pixels includes a light receiving portion configured to receive incident light, a waveguide configured to guide the incident light from a light incident surface to the light receiving portion, and a light shielding portion disposed between the light incident surface and the light receiving portion for blocking the incident light. The light shielding portion has an opening formed near a light emitting surface of the waveguide, the light receiving portion receives the incident light passing through the waveguide and the opening, and a width of a core of the waveguide and a width of the opening are set so that the widths increase as the wavelength of light incident on a pixel becomes longer.

In still another embodiment of the present technology, for an image sensor formed by stacking a light shielding material and a clad, a resist is patterned so that a light shielding material and a clad are etched as the wavelength of light incident on a pixel becomes longer, the light shielding material and the clad are etched based on the patterned resist, a clad is deposited on an etched surface of the image sensor, and a material with a high refractive index for forming a core of a waveguide is embedded in an etched portion.

According to the embodiments of the present technology, it is possible to process an image. In particular, it is possible to suppress increase in noise components.

BRIEF DESCRIPTION OF THE DRAWINGS

FIG. 3 is a diagram illustrating an example of a cross section of the CCD image sensor;

FIG. 11 is a diagram illustrating an example of a position of a waveguide core;

FIG. 12 is a diagram illustrating an example of the position of a waveguide core and an opening;

FIG. 18 is a diagram for explaining an example of the size of an anti-reflection film;

FIG. 19 is a diagram for explaining an example of pupil correction;

FIG. 28 is a diagram illustrating an example of a cross section of a global shutter CMOS image sensor;

FIG. 31 is a diagram for explaining an example of how to manufacture;

FIG. 32 is a diagram for explaining an example of how to manufacture; and

DETAILED DESCRIPTION OF THE EMBODIMENT(S)

Figure 1:
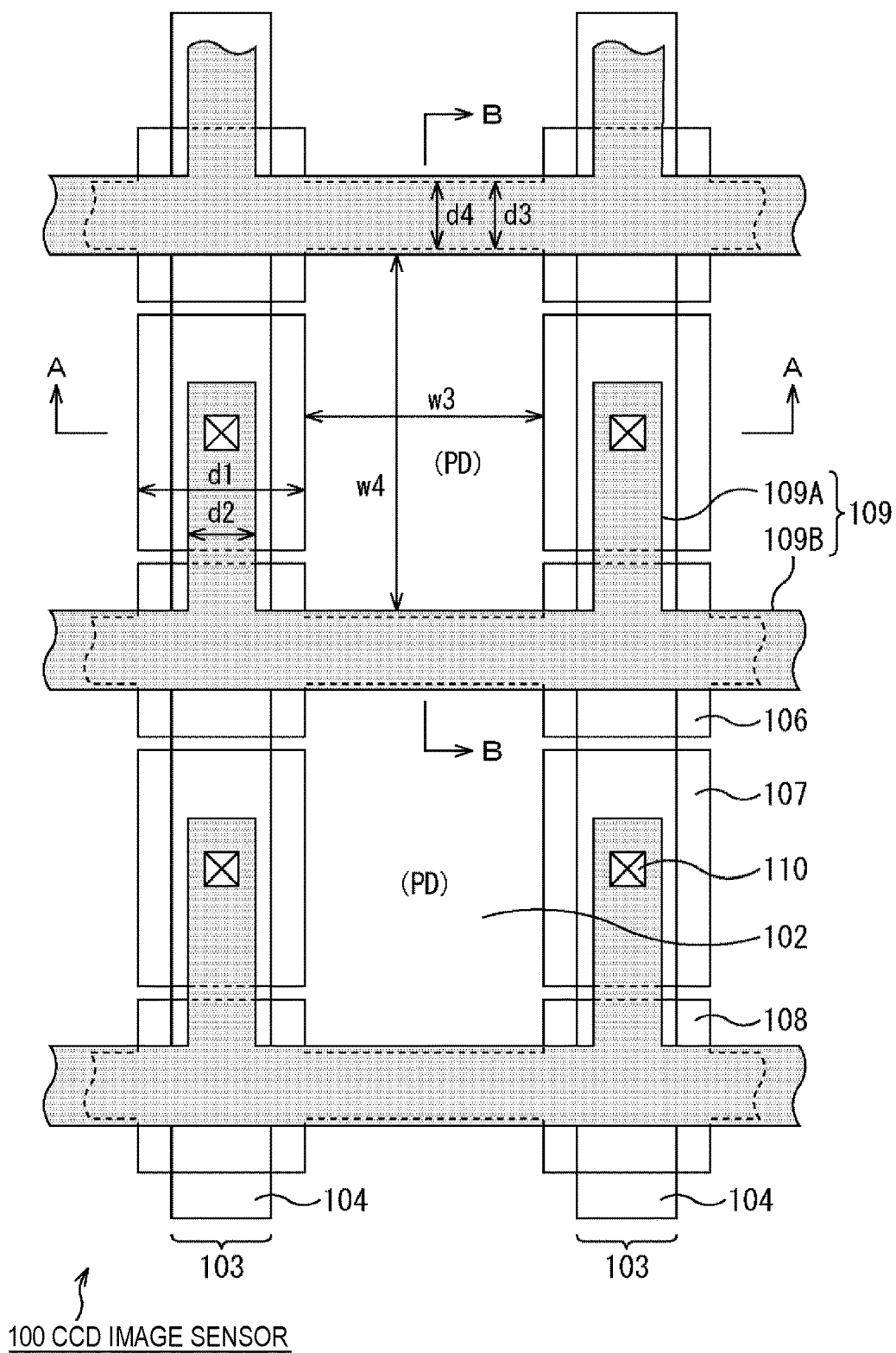
FIG. 1 is a schematic plan view illustrating main parts of a CCD image sensor.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

The description will be given in the following order.
1. First Embodiment (CCD Image Sensor)
2. Second Embodiment (Back-illuminated CMOS Image Sensor)
3. Third Embodiment (Back-illuminated CMOS Image Sensor)
4. Fourth Embodiment (Global Shutter CMOS Image Sensor),
5. Fifth Embodiment (Imaging Apparatus)
<1. First Embodiment>
[CCD Image Sensor]

FIG. 1 is a plan view illustrating an exemplary configuration of a main part of an imaging area of a charge coupled device (CCD) image sensor as an embodiment of an image sensor to which the present technology is applied.

A CCD image sensor 100 illustrated in FIG. 1 has an imaging area in which rectangular light receiving portions 102 are arranged in a two-dimensional array and each of vertical transfer registers 103 of a CCD structure is disposed for an each row of the light receiving portions 102. The light receiving portion 102 is formed as a rectangular shaped opening in which the vertical width (w4) is greater than the horizontal width (w3) (i.e., w4>w3). The light receiving portion 102 is configured to include a photodiode (PD) that serves as a photoelectric conversion element, and has sidewalls in which a sidewall in the vertical direction is longer than that in the horizontal direction. The vertical transfer register 103 is configured to transfer signal charges read out from the light receiving portion 102 sequentially in the vertical direction. The vertical transfer register 103 includes an embedded transfer channel region (hereinafter, referred to as a transfer channel region) 104. The vertical transfer register 103 also includes a plurality of transfer electrodes 106, 107, and 108 which are arranged on the transfer channel region through a gate insulating film in a transfer direction. These transfer electrodes 106 to 108 are formed to serve as first polysilicon films. In this example, these three transfer electrodes 106 to 108 are formed to correspond to a single light receiving portion 102.

Among these transfer electrodes, the transfer electrodes 106 and 108 are formed continuously in the horizontal direction through between the light receiving portions 102 adjacent to each other in the vertical direction so that a pair of the transfer electrodes corresponding to the respective vertical transfer registers 103 are connected to each other. On the other hand, the transfer electrode 107, which also serves as a readout electrode between the transfer electrode 106 and the transfer electrode 108, is formed independently in an island shape in the vertical transfer register 103, and thus is connected to a connecting wire 109 formed as a second polysilicon film. The connecting wire 109 includes a band-shaped portion 109B and an extension portion 109A. The band-shaped portion 109B extends in the form of a band between the light receiving portions 102 adjacent to each other in the vertical direction, and is disposed on the transfer electrode 106 and the transfer electrode 108 through an insulating film. The extension portion 109A extends along the transfer electrode 107 having an island shape. The band-shaped portion 109B and the extension portion 109A are formed as an integral part. The extension portion 109A of the connecting wire 109 is connected to a contact portion 110 of the transfer electrode 107 in the vertical transfer register 103.

Figure 2:
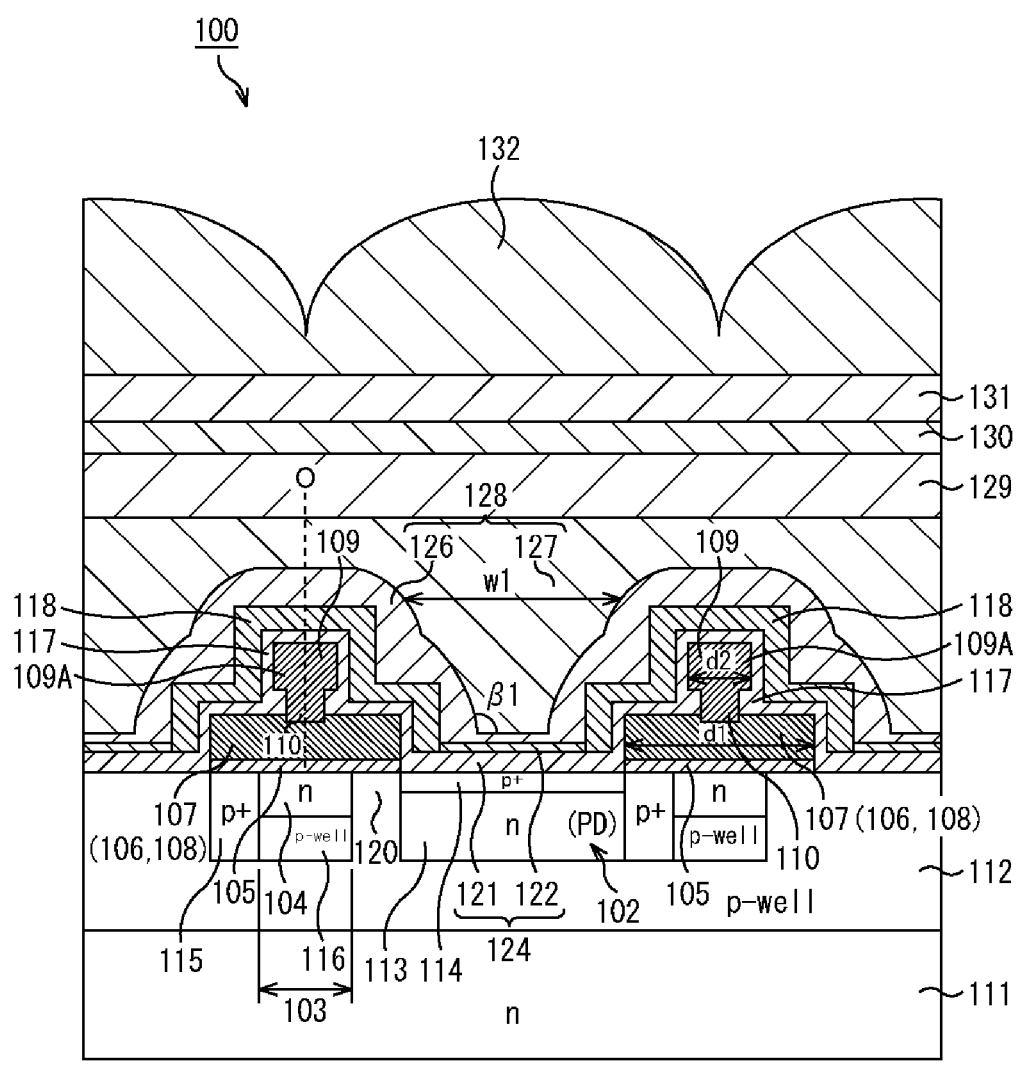
FIG. 2 is a diagram illustrating an example of a cross section of the CCD image sensor.

FIG. 2 is a diagram illustrating an example of a cross section taken along line A-A in FIG. 1. In this cross sectional structure, as illustrated in FIG. 2, a first semiconductor well region 112 of a second conductive type, for example, p-type is formed on a silicon semiconductor substrate 111 of a first conductive type, for example, n-type. A photodiode (PD) which constitutes the light receiving portion 102 is formed in the first p-type semiconductor well region 112. The photodiode (PD) includes an n-type semiconductor region 113 and a p+ semiconductor region 114 which is intended to suppress the dark current in the surface. An n-type transfer channel region 104 and a p+ channel stop region 115 are further formed in the first p-type semiconductor well region 112. A second p-type semiconductor well region 116 is formed immediately below the n-type transfer channel region 104.

The transfer electrode 107 (the transfer electrode 106 or transfer electrode 108 depending on the position of line A-A) serving as a first polysilicon film is formed on the n-type transfer channel region 104 through a gate insulating film 105. In addition, the connecting wire 109 serving as a second polysilicon film is formed on the transfer electrode 107 through an insulating film 117. The extension portion 109A of the connecting wire 109 is connected to the contact portion 110 of the island-shaped transfer electrode 107 through a contact hole of the insulating film 117. The transfer electrodes 106 to 108 are respectively formed across the p+ channel stop region 115, the n-type transfer channel region 104, and a region spanning from the n-type transfer channel region 104 to the edge of the light receiving portion 102. Specifically, the transfer electrode 107 is extended to the readout region 120 spanning from the n-type transfer channel region 104 to the edge of the light receiving portion 102. In addition, a light shielding film 118 is formed to cover the connecting wire 109 and the transfer electrodes 106 to 108 around the light receiving portion 102 except for the light receiving portion 102. For example, a stacked insulating film 124 made of a silicon oxide ($SiO_2$) film 121 and a silicon nitride (SiN) film 122 is formed above a surface of the light receiving portion 102, and functions as an anti-reflection film in a silicon substrate interface for preventing degradation in sensitivity.

A waveguide 128 is formed above the light receiving portion 102 and is configured to focus effectively incident light into the light receiving portion 102. The waveguide 128 according to an embodiment of the present technology will be described later. The waveguide 128 includes a clad made of a material with a low refractive index and a core made of a material with a high refractive index. In addition, an on-chip color filter 131 is formed above the light receiving portion 102 through a passivation film 129 and a planarization film 130, and an on-chip microlens 132 is formed on the on-chip color filter 131. The passivation film 129 is made of, for example, a silicon nitride (SiN or SiON). In addition, the planarization film 130 may be made of an organic coating film such as an acrylic resin.

The waveguide 128 is configured to include a clad 126 and a core 127. The clad 126 is formed along a contour of the surface a stacked structure that includes the transfer electrodes 106 to 108 surrounding the light receiving portion 102, the connecting wire 109, the light shielding film 118, and so on. The core 127 is embedded in a recessed portion surrounded by the clad 126. The clad 126 is made of a material having a low refractive index, for example, a silicon oxide film. The core 127 is made of a material having a high refractive index, for example, a silicon nitride film, a silicon oxynitride film, or the like. The embedded core 127 has the refractive index n1, for example, in the range approximately from 1.60 to 2.20. In addition, the clad 126 has the refractive index n2, for example, in the range approximately from 1.00 to 1.59. The clad 126 is preferably formed so that it is removed to leave a desired film thickness thereof on the insulating film 124 above the light receiving portion 102. If the clad 126 is not formed to leave a desired film thickness thereof (i.e., the case that the clad 126 above the light receiving portion 102 is completely removed by etching or the like), then the core 127 will come into contact with the insulating film 124. This may lead to the case where the silicon (Si) interface in the insulating film 124 fails to achieve anti-reflection effect, and thus there is concern that sensitivity characteristics are impaired. The clad 126 is formed on the insulating film 124, thereby maintaining anti-reflection effect of the insulating film 124.

[Influence of Pixel Miniaturization]

In recent years, in an image sensor having a waveguide structure, the diffraction limit of visible light due to pixel miniaturization makes it difficult to guide light from a lens to a waveguide, to confine it within the waveguide, and to control diffracted light from a waveguide core portion and a light shielding material opening. More specifically, it is difficult to suppress oblique incidence of light from adjacent pixels or occurrence of smear or color mixture due to the diffraction of light out of the waveguide core and light shielding material opening.

Therefore, as disclosed in Japanese Unexamined Patent Application Publication No. 2010-93081, the structure for changing a width of a light shielding material opening for each color has been considered. However, with such a structure, the amount of reduction in noise components obtained by using the pixel miniaturization technique being used currently is extremely small, thus it is difficult to substantially suppress occurrence of noise components such as smear or color mixture.

Furthermore, as disclosed in Japanese Unexamined Patent Application Publication No. 2011-23455, the structure for changing a width of a waveguide core for each color has been considered. However, this technique is intended to improve sensitivity, thus it is not possible to suppress occurrence of noise components.

[Control of Waveguide Core Width and Opening Width between Light Shielding Films]

As illustrated in FIG. 3, the width of the waveguide core and the width of an opening of the light shielding film are controlled according to the wavelength of light incident on a target pixel. That is, the width of the waveguide core and the width of the opening of the light shielding film are set to be wider as the wavelength of light incident on a target pixel becomes longer.

FIG. 3 is a diagram illustrating examples of cross section of pixels having different wavelength regions of incident light in the CCD image sensor 100 of FIG. 1. The cross sectional views shown in FIGS. 3A to 3C illustrate respectively examples of a cross section taken along the line A-A of FIG. 1, in a similar way to FIG. 2. However, for simplicity and clarity of illustration, well-known structures are shown in a simplified form appropriately.

The on-chip color filter 131 of the CCD image sensor 100 is a filter in which any of a plurality of filters transmitting through wavelength regions different from each other is disposed in a predetermined array sequence for each pixel. The wavelength region through which a filter of each pixel transmits, the number of types (wavelength ranges) of the filter, thickness of each filter, and the array sequence are optional. In the following, as an example, the description is based on the assumption that the on-chip color filter 131 is a filter in which color filters of red (R), green (G), or blue (B) are arranged in a Bayer array for each pixel.

FIG. 3A illustrates an exemplary configuration of a cross section of B pixel in which a blue (B) filter is disposed. A clad 151 corresponds to the insulating film 117 and the clad 126 which are illustrated in FIG. 2. A clad 152 corresponds to the upper layer (layer at the surface side) of the clad 126. The clad 151 corresponding to the clad 126 and the clad 152 are manufactured by different processes from each other as described later.

A waveguide core 153 corresponds to the core 127 of the waveguide 128. In addition, an anti-reflection film 154 corresponds to the stacked insulating film 124.

FIG. 3B illustrates an exemplary configuration of a cross section of G pixel in which a green (G) filter is disposed. FIG. 3C illustrates an exemplary configuration of a cross section of R pixel in which a red (R) filter is disposed.

As illustrated in FIGS. 3A to 3C, the width of the waveguide core 153 (the length of a double arrow 161) and the width of an opening of the light shielding film 118 (the length of a double arrow 162) are formed to be different from each other for each pixel according to the wavelength of incident light (i.e., the color of a color filter). The opening of the light shielding film 118 is formed near the anti-reflection film 154. More specifically, the width of the waveguide core 153 and the width of the opening of the light shielding film 118 are formed to be wider as incident light having a longer wavelength is incident on a target pixel. Thus, as illustrated in FIG. 3A, the waveguide core 153 and the opening of the light shielding film 118 are formed to have the narrowest widths for the B pixel on which light having the shortest wavelength region is incident. In addition, as illustrated in FIG. 3C, the waveguide core 153 and the opening of the light shielding film 118 are formed to have the broadest widths for the R pixel on which light having the longest wavelength region is incident. As illustrated in FIG. 3B, for the G pixel, the waveguide core 153 and the opening of the light shielding film 118 are formed to have middle-sized widths between the widths in the cases of B pixel and R pixel.

Figure 4:
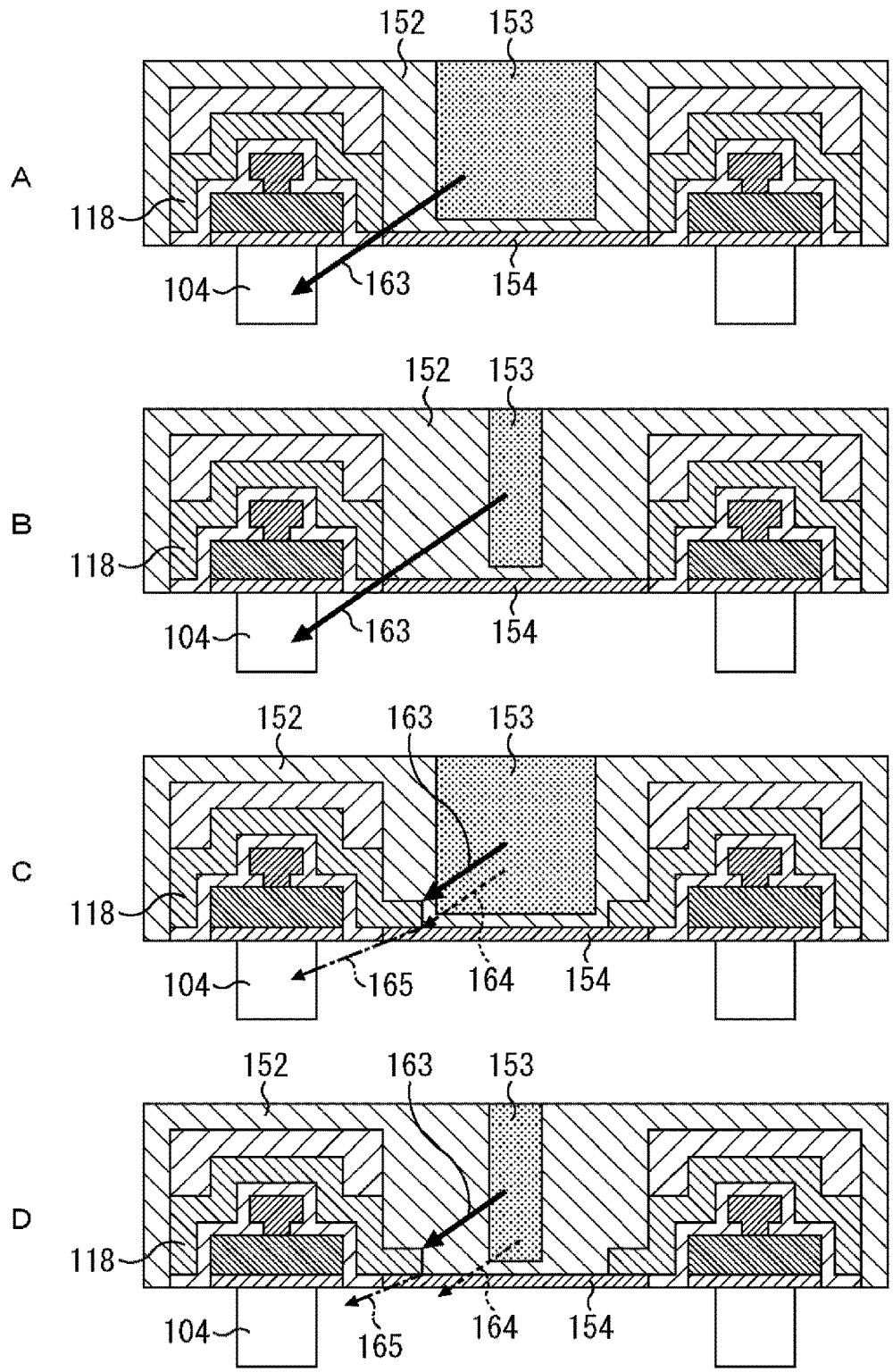
FIG. 4 is a diagram for explaining occurrence of noise.

For example, as illustrated in FIG. 4A, if the width of the waveguide core 153 and the width of the opening of the light shielding film 118 are formed to be wide, then oblique incident light 163 that is obliquely incident on the waveguide may enter easily the n-type transfer channel region 104 (a charge transfer path) at the back side of the light shielding film 118. As a result, there is concern that noise components may be increased due to the oblique incident light 163.

Therefore, for example, as illustrated in FIG. 4B, even if only the width of the waveguide core 153 is narrower than that illustrated in FIG. 4A, the oblique incident light 163 transmits through the clad 152 and enters the n-type transfer channel region 104 (a charge transfer path). Accordingly, the amount of noise that can be reduced is extremely low as compared with the case illustrated in FIG. 4A.

Furthermore, as illustrated in FIG. 4C, if the width of the opening of the light shielding film 118 is narrower than that illustrated in FIG. 4A, it is possible to suppress the entrance of the oblique incident light 163 into the n-type transfer channel region 104 (a charge transfer path) because of extension of the light shielding film 118. In this case, however, diffracted light 164 emerging from the end (a light emitting surface) of the waveguide core 153 strikes the end of the light shielding film 118. Thus, there is concern that noise component caused by diffracted light 165 at the end of the light shielding film 118 may be increased.

As described above, if only one of the width of the waveguide core 153 and the width of the opening of the light shielding film 118 becomes narrow, the reduced amount of noise is, for example, just about 0.1 dB, as a result, it is difficult to suppress substantially the occurrence of noise components.

Therefore, as illustrated in FIG. 4D, both widths of the waveguide core 153 and the opening of the light shielding film 118 are controlled according to the wavelength of incident light for each pixel. That is, as described above with reference to FIG. 3, the width of the waveguide core 153 and the width of the opening of the light shielding film 118 are set to be wider as the wavelength of light incident on a target pixel becomes shorter. More specifically, the width of the waveguide core 153 and the width of the opening of the light shielding film 118 are formed to have a size such that the oblique incident light that passes through the opening and then incident to the outside (for example, a noisy region such as a charge transfer path, a memory area, a light receiving portion of neighboring pixels) of the light receiving portion of a target pixel is blocked by the light shielding film 118 and the amount of light in the diffracted light at both ends of the opening becomes decreased.

With this configuration, as illustrated in FIG. 4D, the entrance of the oblique incident light 163 into the n-type transfer channel region 104 can be significantly suppressed by the light shielding film 118. At the same time, it is possible to prevent the diffracted light 164 emerging at the end (a light emitting surface) of the waveguide core 153 from striking an end of the light shielding film 118. Thus, the entrance of the diffracted light 165 emerging at the end of the light shielding film 118 into the n-type transfer channel region 104 can be sufficiently suppressed. Such a synergistic effect makes it possible to achieve a noise reduction effect that the noise is significantly reduced to, for example, about 0.8 dB.

Figure 5:
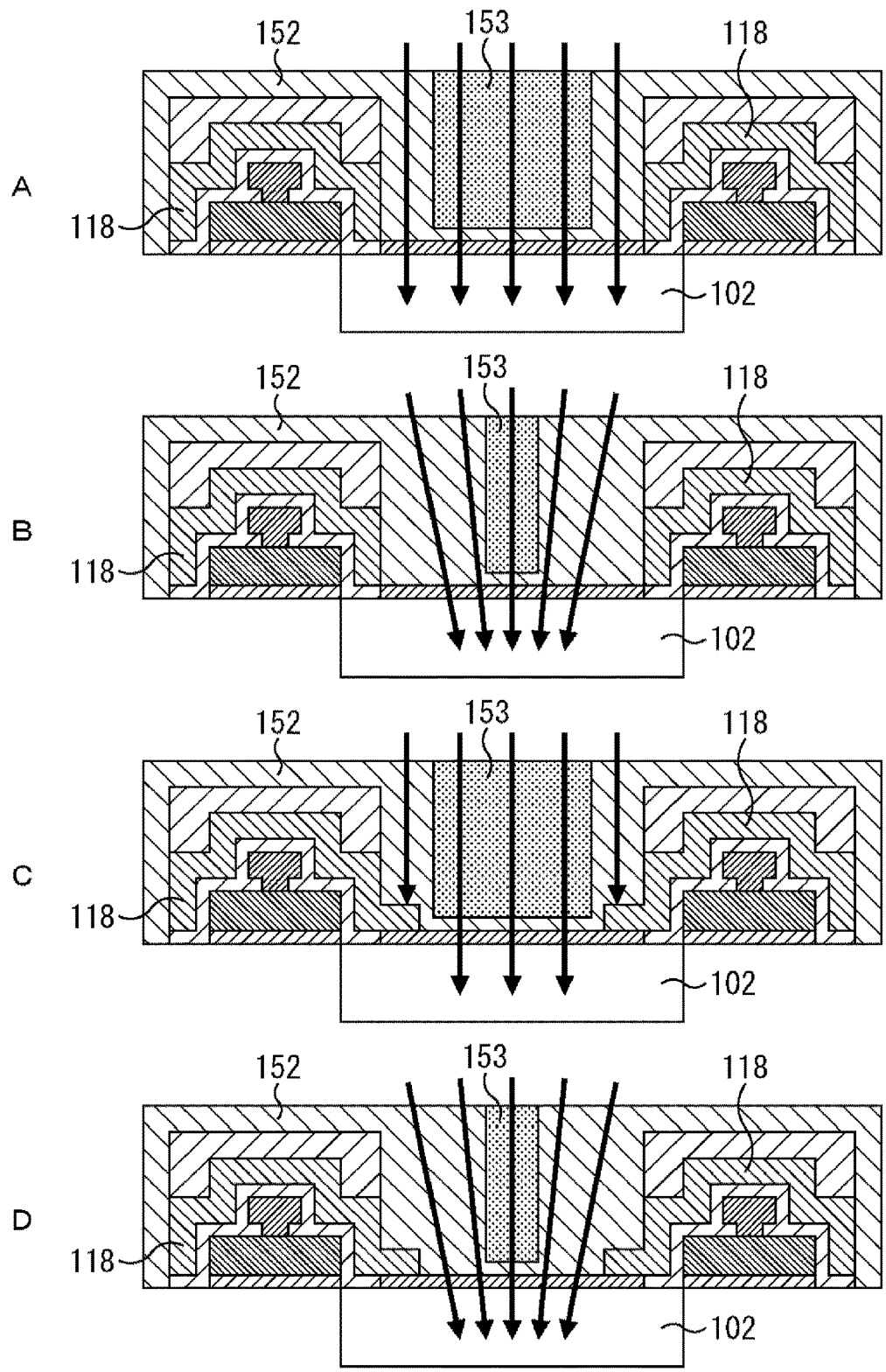
FIG. 5 is a diagram for explaining sensitivity.

Moreover, for example, as illustrated in FIG. 5A, if the width of the waveguide core 153 and the width of the opening of the light shielding film 118 are formed to be wider, the amount of light reaching the light receiving portion 102 is large, thereby increasing sensitivity of the light receiving portion 102.

For example, as illustrated in FIG. 5B, if only the width of the waveguide core 153 is formed to be narrow, the amount of light to be condensed increases. However, the amount of light that is incident on the waveguide and reached the light receiving portion 102 is substantially similar to the case illustrated in FIG. 5A. Accordingly, the sensitivity of the light receiving portion 102 will also be substantially similar to the case illustrated in FIG. 5A.

Meanwhile, for example, as illustrated in FIG. 5C, if only the width of the opening of the light shielding film 118 is formed to be narrow, the amount of light to be blocked by the light shielding film 118 is large (the amount of light reaching the light receiving portion 102 is reduced). Accordingly, there is concern that the sensitivity of the light receiving portion 102 is reduced by as much as the amount of light to be blocked.

On the other hand, as described above, when both widths of the waveguide core 153 and the opening of the light shielding film 118 are formed to be narrow as the wavelength of light incident on a target pixel becomes shorter, the incident light is condensed by the waveguide as illustrated in FIG. 5D. Accordingly, it is possible to suppress reduction in sensitivity of the light receiving portion 102.

Furthermore, the sensitivity of the light receiving portion 102 is dependent on the viewing angle (a viewing angle dependency). For example, the sensitivity of B pixel varies according to the position of a pixel in the effective pixel region as shown in the graph of FIG. 6A.

For example, in the B, G, and R pixels, the width of the waveguide core 153 and the width of the opening of the light shielding film 118 are formed to be common as in the related art, and the width of the waveguide core 153 and the width of the opening of the light shielding film 118 are formed to be sufficiently wide in B pixel. In this case, the viewing angle dependency becomes like that shown in the graph indicated by the square plot of FIG. 6A.

Figure 6:
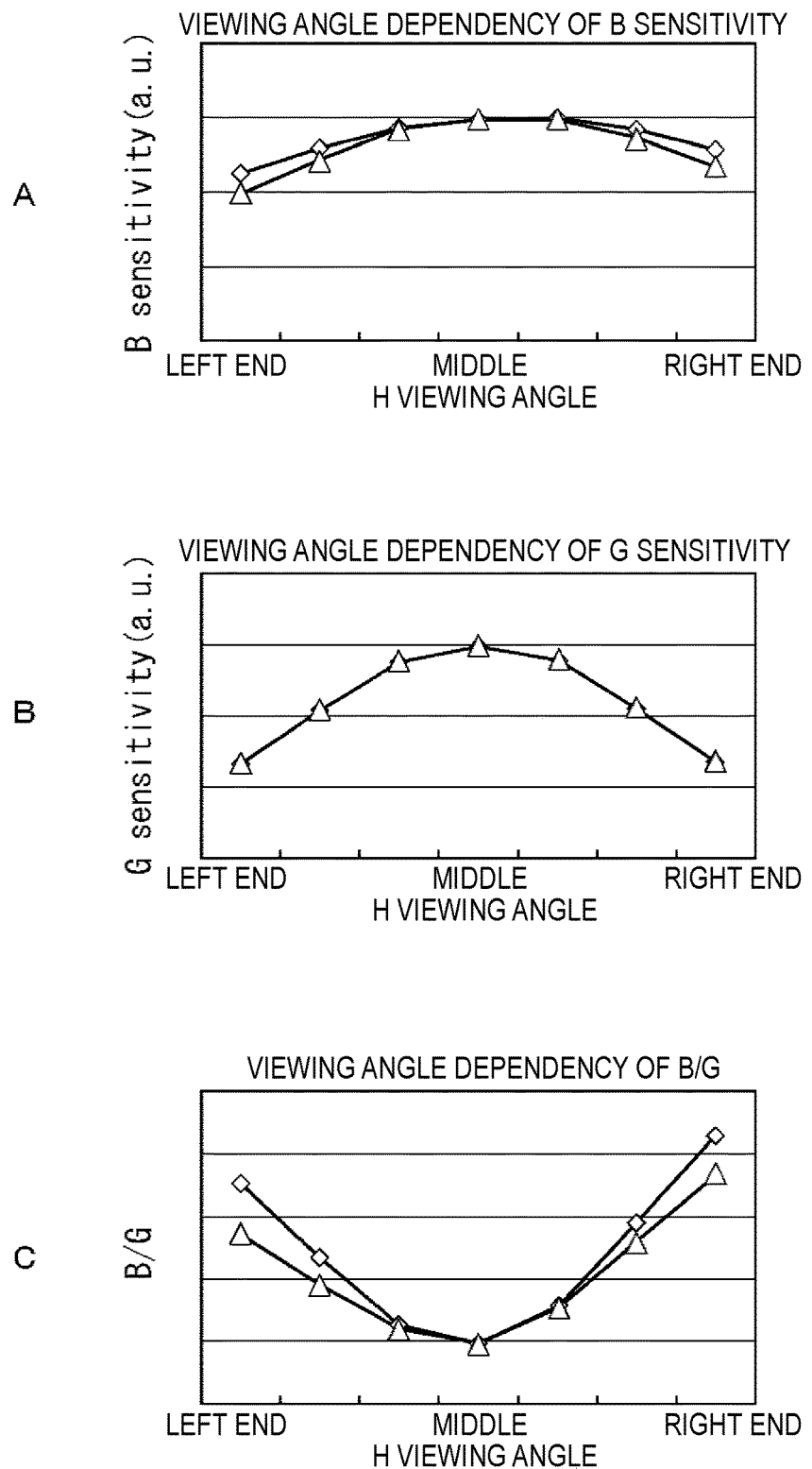
FIG. 6 is a diagram for explaining color shading.

Meanwhile, if both the widths of the waveguide core 153 and the opening of the light shielding film 118 are formed to be narrow in a similar way to the example of FIG. 3, the viewing angle dependency becomes like that shown in the graph indicated by the triangle plot of FIG. 6A.

Thus, the width of the waveguide core 153 and the width of the opening of the light shielding film 118 are formed to be narrow, and thus the sensitivity of a pixel in the end of the effective pixel region is significantly reduced as compared with the central pixel. As described above, in the case of the example of FIG. 3, the width of the waveguide core 153 and the width of the opening of the light shielding film 118 are formed to be narrow in B pixel as compared with G pixel or R pixel. Thus, the reduction in sensitivity at the end of the effective pixel region is greater than that of G pixel or R pixel.

For example, the viewing angle dependency of G pixel becomes like that shown in the graph of FIG. 6B. As illustrated in FIG. 6B, for the G pixel, in the case where the width of the waveguide core 153 and the width of the opening of the light shielding film 118 are formed to be common as in the related art and the case where the width of the waveguide core 153 and the width of the opening of the light shielding film 118 are formed to be narrow as in the example of FIG. 3, each viewing angle dependency is substantially the same.

Thus, the ratio of viewing angle dependency in the G pixel and B pixel is smaller for the case where the width of the waveguide core 153 and the width of the opening of the light shielding film 118 are formed to be narrow than for the case where the width of the waveguide core 153 and the width of the opening of the light shielding film 118 are formed to be common as in the related art, as shown in the graph of FIG. 6C.

As described above, the width of the waveguide core 153 and the width of the opening of the light shielding film 118 are formed to be narrow as in the example of FIG. 3, and thus the viewing angle dependency of B pixel can be approximated to the viewing angle dependency of G pixel. Also, for a similar reason, the viewing angle dependency of G pixel (B pixel) is approximated to the viewing angle dependency of R pixel. That is, it is possible to reduce the difference in the viewing angle dependency due to the difference in wavelength region of incident light. Therefore, it is possible to suppress the occurrence of color shading.

In the example of FIG. 3, both the widths of the waveguide core 153 and the opening of the light shielding film 118 in G pixel may be formed to be greater than or equal to those of the waveguide core 153 and the opening of the light shielding film 118 in B pixel, and may be formed to be smaller than or equal to those of the waveguide core 153 and the opening of the light shielding film 118 in R pixel. For example, the width of the waveguide core 153 and the width of the opening of the light shielding film 118 in G pixel may be formed to be intermediate between the widths of the waveguide core 153 and the opening of the light shielding film 118 in B pixel and the widths of the waveguide core 153 and the opening of the light shielding film 118 in R pixel.

Furthermore, the width of the waveguide core 153 and the width of the opening of the light shielding film 118 in G pixel may be formed to be the same as the width of the waveguide core 153 and the width of the opening of the light shielding film 118 in R pixel. That is, with respect to the waveguide core 153 and the opening of the light shielding film 118, their widths only in B pixel may be formed to be narrow and their widths in G pixel and R pixel may be formed to be common (that is, the widths in G pixel and R pixel are wider than those in B pixel).

Moreover, the width of the waveguide core 153 and the width of the opening of the light shielding film 118 in G pixel may be formed to be the same as the width of the waveguide core 153 and the width of the opening of the light shielding film 118 in B pixel. That is, with respect to the waveguide core 153 and the opening of the light shielding film 118, their widths only in R pixel may be formed to be wider and their widths in G pixel and B pixel may be formed to be common (that is, the widths in G pixel and B pixel are narrower than those in R pixel).

[Control of Waveguide Core Width in Light Emitting Side]

Although the above description has been made based on the example in which the width of the waveguide core 153 may be constant from the light incident surface (the upper side in FIG. 3) to the light emitting surface (the lower side in FIG. 3) of the waveguide, the width may not be constant. In other words, the width of the waveguide core 153 may be changed between the light incident surface and the light emitting surface of the waveguide. For example, the width of the waveguide core 153 in the light incident surface of the waveguide may be different from the width of the waveguide core 153 in the light emitting surface of the waveguide.

In this case, at least in the light emitting surface of the waveguide, as described above with reference to FIG. 3, the width of the waveguide core 153 may be controlled according to the wavelength of light incident on a target pixel. That is, at least in the light emitting surface of the waveguide, the width of the waveguide core and the width of the opening of the light shielding film may be formed to be wider as incident light having a longer wavelength is incident on the target pixel.

In this way, in a similar way to the exemplary case of FIG. 3, it is possible to suppress the increase in noise components.

[Control of Waveguide Core Width in Light Incident Side]

Furthermore, in this case, the width of the waveguide core 153 in the light incident surface other than the light emitting surface of the waveguide may be controlled independently of the width of the waveguide core 153 in the light emitting surface. As described above, the width of the waveguide core 153 from the light incident surface to the light emitting surface of the waveguide may not be constant, and may be changed continuously or discontinuously by the position (depth) thereof. For this reason, in any position between the light incident surface and the light emitting surface of the waveguide, the width of the waveguide core 153 may be different from the width thereof in the light emitting surface. However, the width of the waveguide core 153 at least in the light incident surface of the waveguide may be controllable independently of the width of the waveguide core 153 in the light emitting surface.

In the following, for simplicity and clarity of illustration, the width of the waveguide core 153 is assumed to be compared in two positions. In addition, of the two positions to be compared, a light incident surface side of the waveguide is referred to as an "upper portion of the waveguide", and a light emitting surface side of the waveguide is referred to as a "lower portion of the waveguide". That is, the upper portion of the waveguide may be the light incident surface of the waveguide. In addition, the lower portion of the waveguide may be the light emitting surface of the waveguide.

In other words, in such a case, the width of the waveguide core 153 in the upper portion of the waveguide can be set independently of the width of the waveguide core 153 in the lower portion of the waveguide. For example, the width of the waveguide core 153 in the upper portion of the waveguide may be different from the width of the waveguide core 153 in the lower portion of the waveguide.

Figure 7:
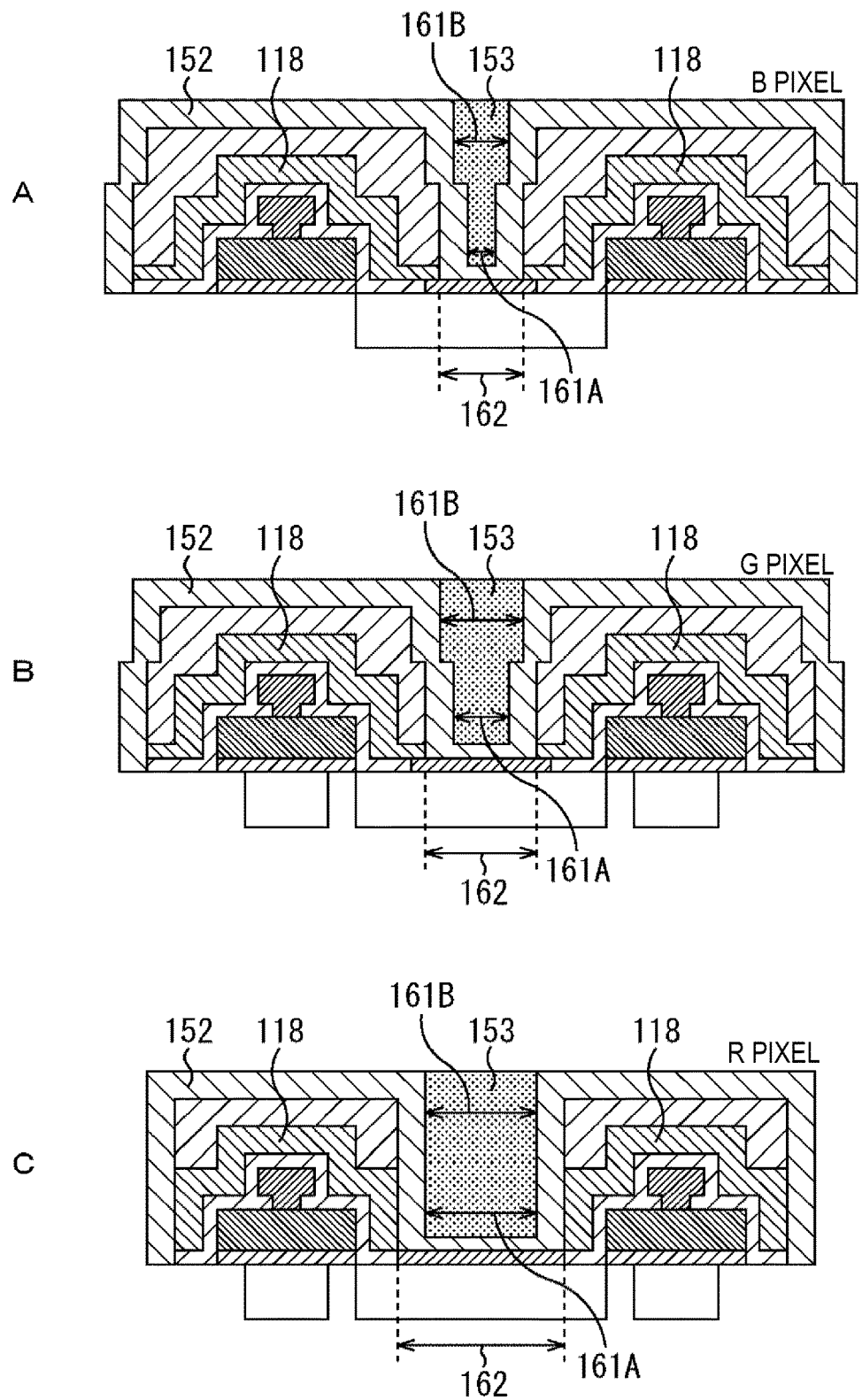
FIG. 7 is a diagram illustrating an example of the width of a core.

The above example is illustrated in FIG. 7. FIG. 7A illustrates an example of a cross section of B pixel in a similar way to FIG. 3A. FIG. 7B illustrates an example of a cross section of G pixel in a similar way to FIG. 3B. FIG. 7C illustrates an example of a cross section of R pixel in a similar way to FIG. 3C.

As illustrated in FIGS. 7A to 7C, the width of the waveguide core 153 in the lower portion of the waveguide (the length of a double arrow 161A) is controlled in a similar way to the cases of FIGS. 3A to 3C. That is, the width of the waveguide core 153 in the lower portion of the waveguide is set to be narrow in B pixel and is set to be wide in R pixel. In case of G pixel, the width of the waveguide core 153 in the lower portion of the waveguide may be set to be intermediate between the case of B pixel and the case of R pixel, or may be set to be the same as the case of B pixel or the case of R pixel.

In each pixel, the width of the opening of the light shielding film 118 (the length of a double arrow 162)

corresponds to the width of the waveguide core 153 in the lower portion of the waveguide (the length of the double arrow 161A), in a similar way to the case of FIG. 3.

Meanwhile, the width of the waveguide core 153 in the upper portion of the waveguide (the length of a double arrow 161B) is set independently of the width of the waveguide core 153 in the lower portion of the waveguide (the length of the double arrow 161A) or the width of the opening of the light shielding film 118 (the length of the double arrow 162), as illustrated in FIGS. 7A to 7C.

In the case of the example illustrated in FIG. 7, as illustrated in FIG. 7A and FIG. 7B, in B pixel and G pixel, the width of the waveguide core 153 in the upper portion of the waveguide is set to be wider than the width of the waveguide core 153 in the lower portion of the waveguide. However, as illustrated in FIG. 7C, in R pixel, the width of the waveguide core 153 in the upper portion of the waveguide is set to be the same as the width of the waveguide core 153 in the lower portion of the waveguide.

In the upper portion of the waveguide, in order to suppress reduction in sensitivity of the light receiving portion 102, the width of the waveguide core 153 is preferably controlled for each pixel according to the wavelength region (color) of incident light to be guide efficiently to the lower portion of the waveguide. Especially, this could be effective with reduced pixel size.

However, in the waveguide, the permeation (vignetting) of incident light from the waveguide core 153 to the clad 152 occurs. The amount of permeated light (evanescent light) is directly proportional to the wavelength, and thus the width of the clad in the upper portion of the waveguide is preferably set to be wider as the wavelength of light incident on a target pixel becomes longer (B pixel<G pixel<R pixel). In other words, the width of the waveguide core 153 is preferably set to be wide as the wavelength of light incident on a target pixel becomes shorter (B pixel>G pixel>R pixel).

Figure 8:
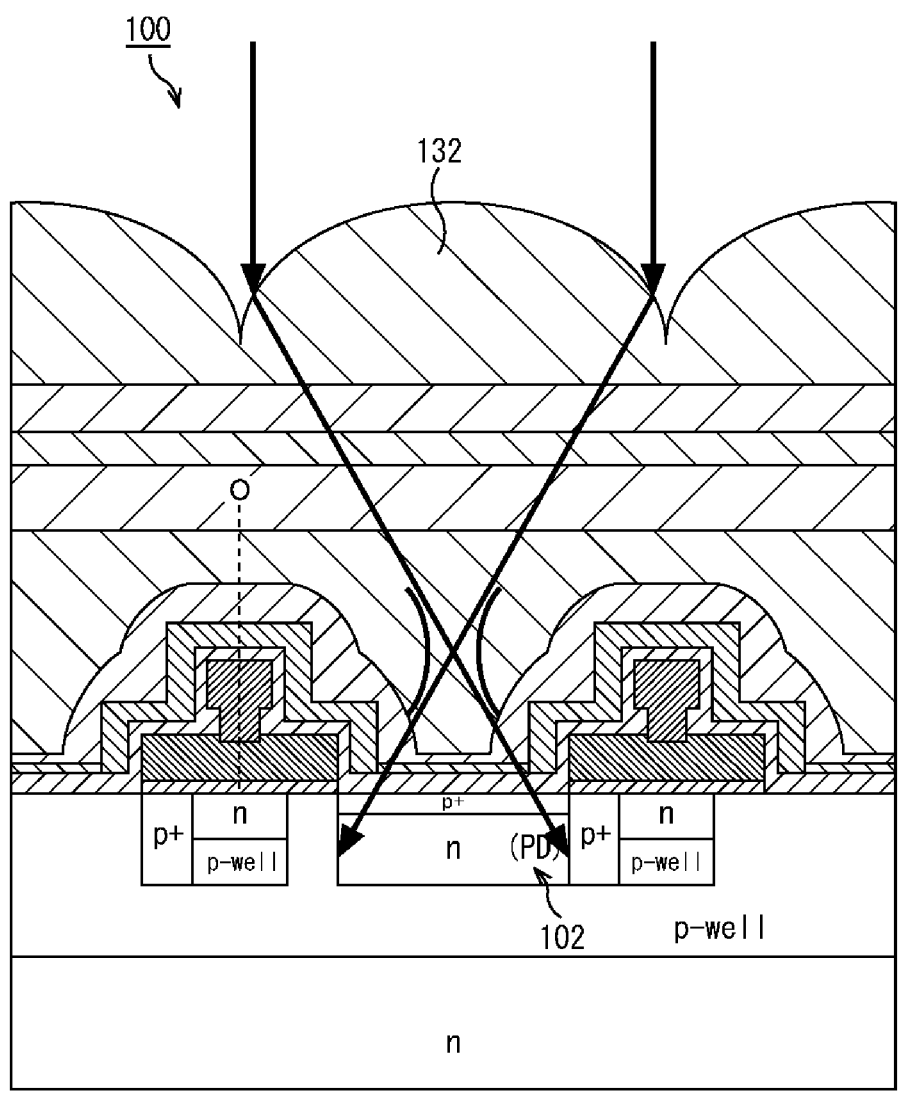
FIG. 8 is a diagram for explaining sensitivity.

In addition, in the waveguide, as illustrated in FIG. 8, focus has width rather than a point due to diffraction limit (airy disk). Because width is proportional to a wavelength, in order to suppress vignetting in the upper portion of the waveguide, the width of the waveguide core is preferably set to be wider as the wavelength of light incident on a pixel becomes longer (B pixel<G pixel<R pixel).

In other words, there is a trade-off relationship between the diffraction limit and the evanescent light in the design of the waveguide core width.

Meanwhile, in the lower portion of the waveguide, as described above, to improve sensitivity and reduce noise, it is desirable that the width of the waveguide core 153 is formed to be wider as the wavelength of light incident on a target pixel becomes longer (the width of the waveguide core in B pixel is preferably formed to be narrow, and the width of the waveguide core in R pixel is preferably formed to be wide).

Thus, as described above, the width of the waveguide core in the upper portion and the width of the waveguide core in the lower portion of the waveguide can be set independently of each other, thereby suppressing occurrence of noise and reduction in sensitivity.

In FIG. 7, the above description has been made based on the example in which the width of the waveguide core 153 in the upper portion of the waveguide is set to satisfy the relationship of B pixel≤G pixel≤R pixel, but is not limited thereto. The width of the waveguide core in the upper portion of the waveguide may be set to satisfy the relationship of B pixel≥G pixel≥R pixel. That is, the width of the waveguide core 153 in the upper portion of the waveguide may be formed to be wider in B pixel than in R pixel.

Moreover, in FIG. 7, the description has been made based on the example in which the width of the waveguide core 153 is set discontinuously in two stages of the upper portion and lower portion of the waveguide, but the width of the waveguide core 153 may be set to be changed in three or more stages, or may be set to be continuously changed. The waveguide core 153 is formed in a stepwise manner (more continuous change) from the light incident surface to the light emitting surface of the waveguide, and thus it is possible to mitigate the interference, thereby suppressing variation in the spectral ripple.

Figure 9:
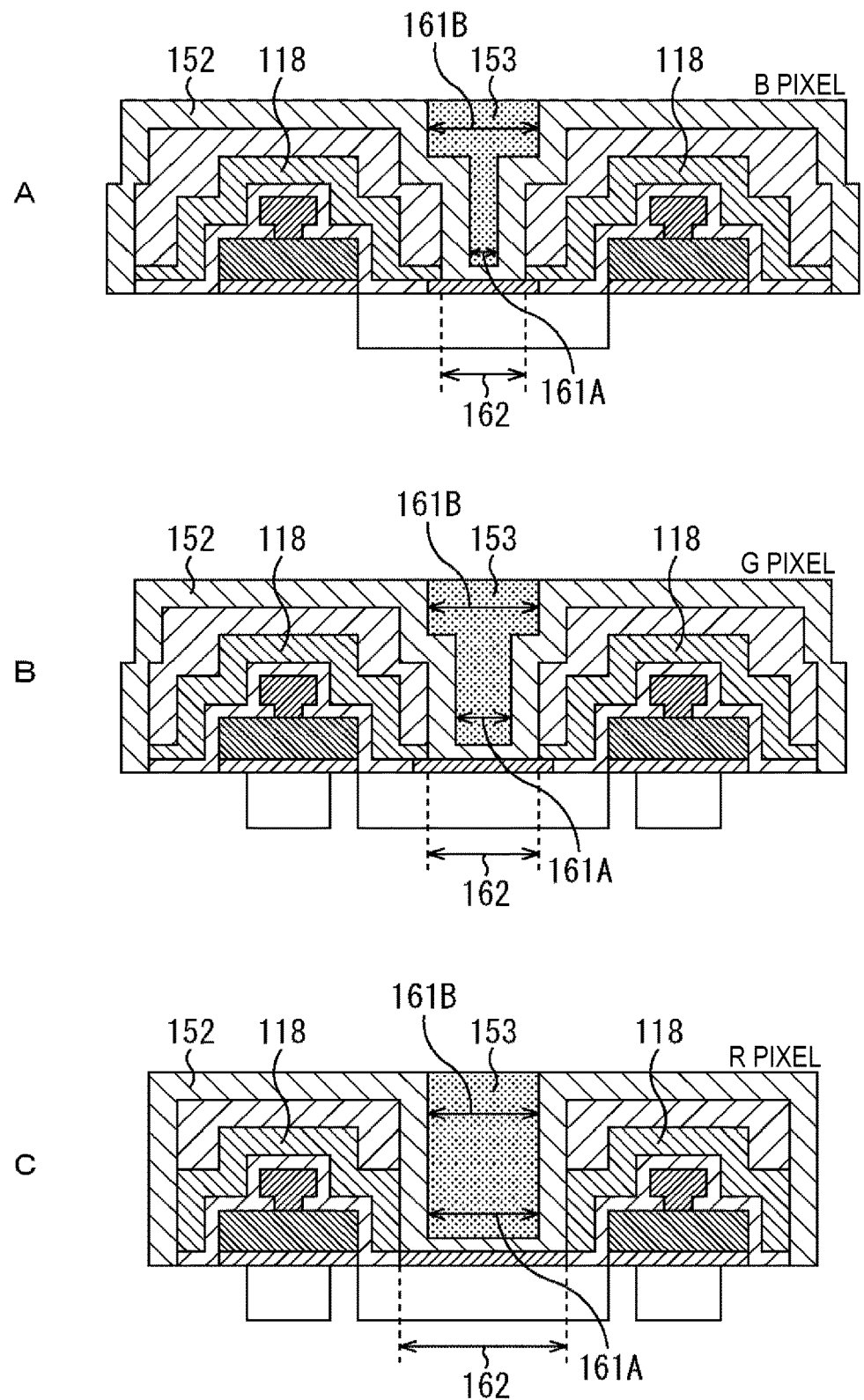
FIG. 9 is a diagram illustrating an example of the width of a core.

As illustrated in FIGS. 9A to 9C, the width of the waveguide core 153 in the upper portion of the waveguide may be set to be constant independently of the wavelength range of incident light. In any cases of B pixel illustrated in FIG. 9A, G pixel illustrated in FIG. 9B, and R pixel illustrated in FIG. 9C, the width of the waveguide core 153 in the lower portion of the waveguide (the length of the double arrow 161A) in each case is different from the width of the opening of the light shielding film 118 (the length of the double arrow 162), but the width of the waveguide core 153 in the upper portion of the waveguide (the length of the double arrow 161B) in each case is same as each other (is set to be uniformly wide enough).

In the upper portion of the waveguide, it is preferable that the width of the waveguide core 153 is formed to be wider to suppress vignetting (regardless of color). In addition, in the upper portion of the waveguide, it is preferable that the width of the waveguide core 153 is formed to be wider to stabilize the embedding characteristics of the waveguide core. Additionally, in the lower portion of the waveguide, it is preferable that the width of the waveguide core 153 is controlled according to the wavelength region of incident light to suppress the occurrence of noise and the reduction in sensitivity.

As described above, the width of the waveguide core 153 in the upper portion of the waveguide is formed to be a predetermined size regardless of the wavelength region of incident light, and the width of the waveguide core 153 in the lower portion of the waveguide is formed to be controlled according to the wavelength region of incident light, thereby suppressing the occurrence of noise and the reduction in sensitivity.

Figure 10:
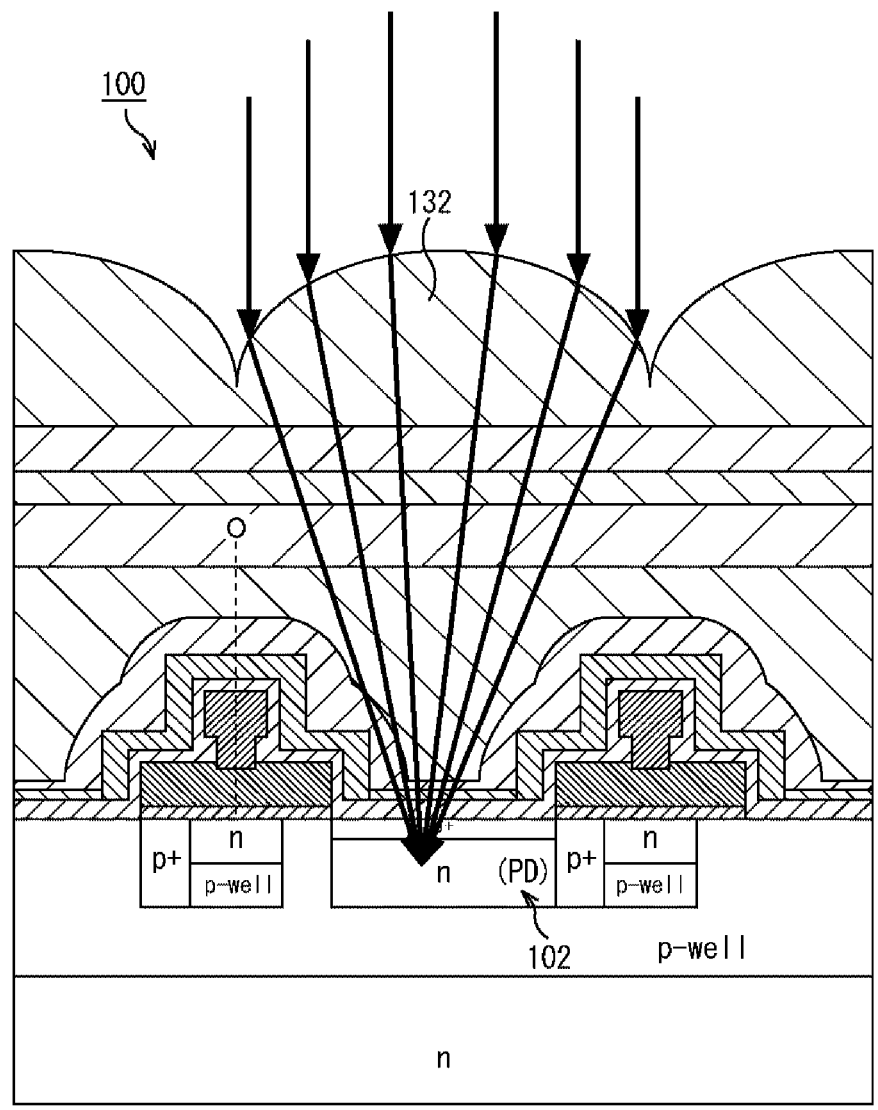
FIG. 10 is a diagram for explaining how light is condensed.

Furthermore, even in this case, the waveguide core 153 is formed in a stepwise manner (more continuous change) from the light incident surface to the light emitting surface of the waveguide, and thus it is possible to gradually condense the incident light, as illustrated in FIG. 10. Accordingly, it is possible to mitigate the interference, thereby suppressing variation in the spectral ripple.

[Specific Example of Opening Width between Light Shielding Films]

Although it is just an illustrative example, the width of the opening of the light shielding film 118 is preferably formed to be greater than or equal to [wavelength of incident light/refractive index of clad]. For example, the following relationship may be established.

B pixel: 400/clad refractive index of nm or more
G pixel: 500/clad refractive index of nm or more
R pixel: 600/clad refractive index of nm or more

[Specific Example of Waveguide Core Width in Lower Portion of Waveguide]

Similarly, although it is just an illustrative example, the width of the waveguide core 153 in the lower portion of the waveguide is preferably formed to be greater than or equal to [wavelength of incident light/refractive index of waveguide core 153/2]. For example, the following relationship may be established.

B pixel: 200/core refractive index of nm or more
G pixel: 250/core refractive index of nm or more
R pixel: 300/core refractive index of nm or more

[Central Positions of Waveguide and Opening]

As illustrated in FIG. 11, the waveguide core 153 may have a center axis which is set in a position determined for each wavelength region of incident light with respect to a center axis of the opening of the light shielding film 118.

FIGS. 11A to 11C illustrate an example of a cross section of B pixel, an example of a cross section of G pixel, and an example of a cross section of R pixel, respectively, in a similar way to FIGS. 3A to 3C.

As illustrated in FIG. 11A, the center (axis) of the waveguide core 153, i.e., the position of the center of the double arrow 161 indicated by an alternate long and short dash line 171 may be different from the center (axis) of the opening of the light shielding film 118, i.e., the position of the center of the double arrow 162 indicated by an alternate long and two short dashes line 172. In addition, the positional relationship between the alternate long and short dash line 171 and the alternate long and two short dashes line 172 may be determined for each wavelength region of incident light.

For example, as illustrated in FIG. 11B, in R pixel, the positional relationship between the alternate long and short dash line 171 and the alternate long and two short dashes line 172 may be different from the case of B pixel illustrated in FIG. 11A. Of course, as illustrated in FIG. 11C, even in G pixel, the positional relationship between the alternate long and short dash line 171 and the alternate long and two short dashes line 172 may be different from the case of B pixel or the case of R pixel. For example, as the wavelength of light incident on a target pixel becomes longer, the center axis of the waveguide core 153 may be away from the center axis of the opening of the light shielding film 118.

In addition, for the positional relationship between the alternate long and short dash line 171 and the alternate long and two short dashes line 172, it may be different only in B pixel, it may be different only in G pixel, or it may be different only in R pixel.

Further, as illustrated FIG. 11C, in the positional relationship between the alternate long and short dash line 171 and the alternate long and two short dashes line 172, their positions may be the same as each other. That is, as indicated by a dotted line 173, the center axis of the waveguide core 153 may be the same as (common to) the center axis of the opening of the light shielding film 118.

Moreover, as illustrated in FIG. 12, the center axis of the waveguide core 153 and the center axis of the opening of the light shielding film 118 may be formed in a position determined for each wavelength region of incident light with respect to the center of a target pixel. FIG. 12A illustrates an example of a cross section of B pixel, in a similar way to FIG. 3A. FIG. 12B illustrates an example of a cross section of R pixel, in a similar way to FIG. 3C.

In the following, for simplicity and clarity of illustration, in a similar way to the case of FIG. 11C, the center axis of the waveguide core 153 and the center axis of the opening of the light shielding film 118 are assumed to be the same as (common to) each other (as indicated by the dotted line 173). Of course, as in the example of FIG. 11A or FIG. 11B, the center axis of the waveguide core 153 may be set to a position different from the center axis of the opening of the light shielding film 118 (they has a predetermined positional relationship).

Furthermore, the position of the center of a pixel may be optionally defined. For example, as illustrated in FIG. 12, a middle position (indicated by a dotted line 175) between (a double arrow 174) the centers of the transfer electrodes 107 on either side of the pixel may be set to a center of the pixel.

As illustrated in FIG. 12A, a position of the center axis (indicated by a dotted line 173) of the waveguide core 153 and a position of the center (indicated by a dotted line 175) of the pixel may not coincide with each other. In addition, the positional relationship between the dotted line 173 and the dotted line 175 may be determined for each wavelength range of incident light.

For example, as illustrated in FIG. 12B, in R pixel, the positional relationship between the dotted line 173 and the dotted line 175 may be different from the case of B pixel illustrated in FIG. 12A. For example, the distance between the dotted line 173 and the dotted line 175 may be set to be longer as the wavelength of light incident on a pixel becomes longer.

Furthermore, among the pixels in each wavelength range, the positional relationship between the dotted line 173 and the dotted line 175 may be different from each other only in the pixels having some wavelength ranges. For example, only in B pixel, the positional relationship between the dotted line 173 and the dotted line 175 may be different from the case of R pixel or G pixel. Similarly, only in R pixel or G pixel, the positional relationship between the dotted line 173 and the dotted line 175 may be different from the other pixels.

Figure 13:
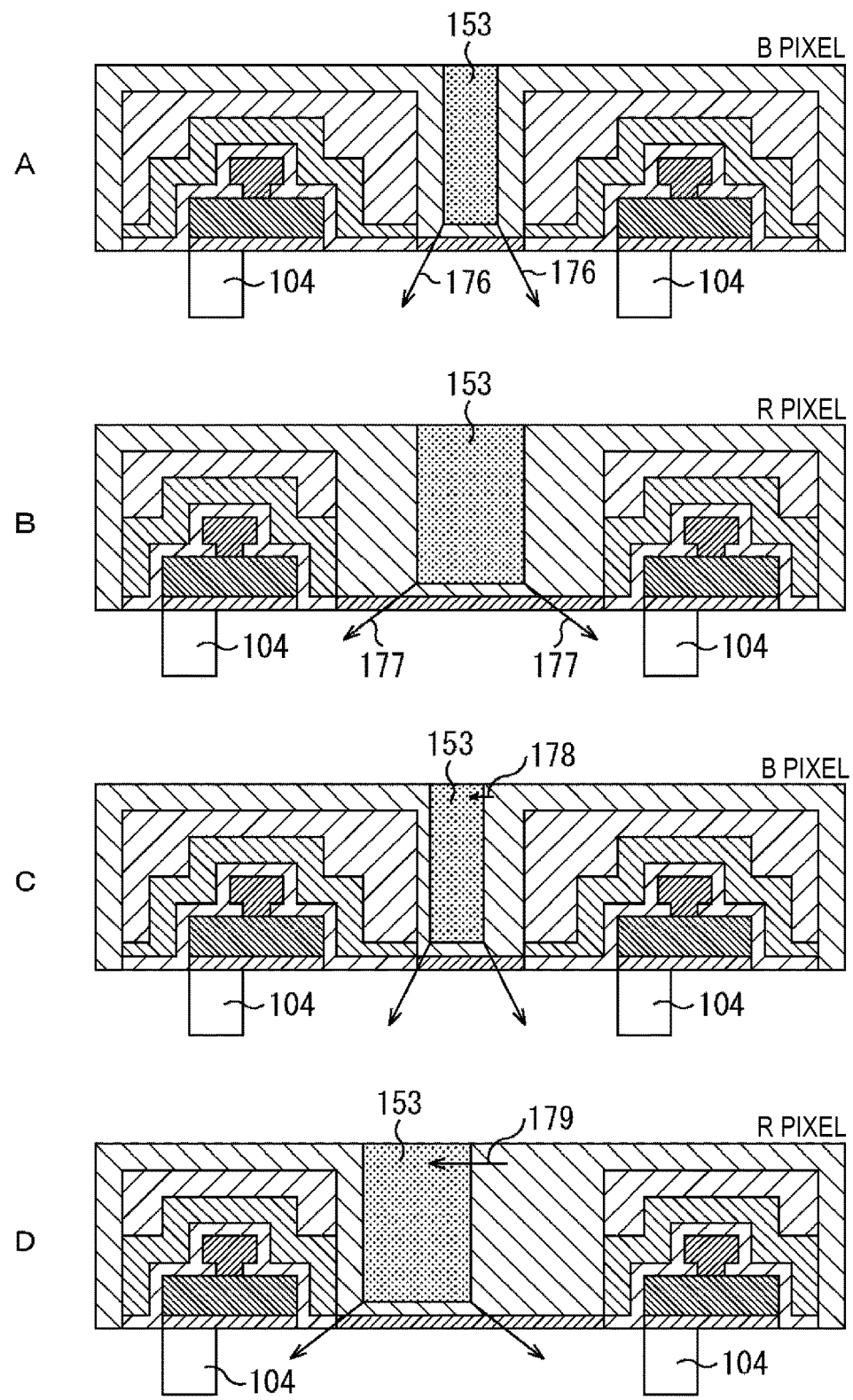
FIG. 13 is a diagram for explaining how light is diffracted.

As illustrated in FIG. 13, the n-type transfer channel region 104 is formed in the lower part of the transfer electrode 107 in the figure, but the center axis of the n-type transfer channel region 104 may not be necessary to coincide with the center axis of the transfer electrode 107. For example, as illustrated in FIG. 13, the center axis of the n-type transfer channel region 104 may be deviated from the center axis of the transfer electrode 107.

In this case, the distance from the end of the light emitting surface of the waveguide core 153 to the n-type transfer channel region 104 at the left side of the waveguide core 153 is different from the distance from the end of the light emitting surface of the waveguide core 153 to the n-type transfer channel region 104 at the right side of the waveguide core 153. In this reason, there is concern that diffracted light from the end of the light emitting surface of the waveguide core 153 may be easily permeated into the n-type transfer channel region 104 nearer to the waveguide core 153.

Thus, as described above with reference to FIG. 11 or FIG. 12, the center axis of the waveguide core 153 or the center axis of the opening of the light shielding film 118 is shifted from the center of a pixel depending on the deviation of arrangement of the n-type transfer channel region 104. Thus, it is possible to prevent the n-type transfer channel region 104 from approaching the end of the light emitting surface of the waveguide core 153, thereby further suppressing the occurrence of noise.

Moreover, as illustrated in FIGS. 13A and 13B, the diffracted light (the arrows 176 and 177) in the end of the light emitting surface of the waveguide core 153 has a large diffraction angle as the wavelength of light incident on a pixel becomes longer. That is, as the wavelength of light incident on a pixel becomes longer, the incident light may be easily permeated into the n-type transfer channel region 104.

Thus, as illustrated in FIGS. 13C and 13D, the center axis of the waveguide core 153 or the center axis of the opening of the light shielding film 118 may be shifted significantly from the center of the pixel as the wavelength of light incident on a pixel becomes longer. For example, in the case of B pixel illustrated in FIG. 13C, as indicated by an arrow 178, the center axis of the waveguide core 153 or the center axis of the opening of the light shielding film 118 may be shifted slightly from the center of a pixel. In the case of R pixel illustrated in FIG. 13D, as indicated by an arrow 179, the center axis of the waveguide core 153 or the center axis of the opening of the light shielding film 118 may be shifted significantly from the center of a pixel. By doing so, it is possible to suppress the occurrence of noise.

For example, during manufacturing, by depositing the clad 151 or the clad 152 by tilting a wafer, the thickness of one side wall of the clad may be controlled to be different from that of the other side wall of the clad. That is, the position of the center axis of the waveguide core 153 or the position of the center axis of the opening of the light shielding film 118 as described above can be easily controlled.

[Manufacturing]

Figure 14:
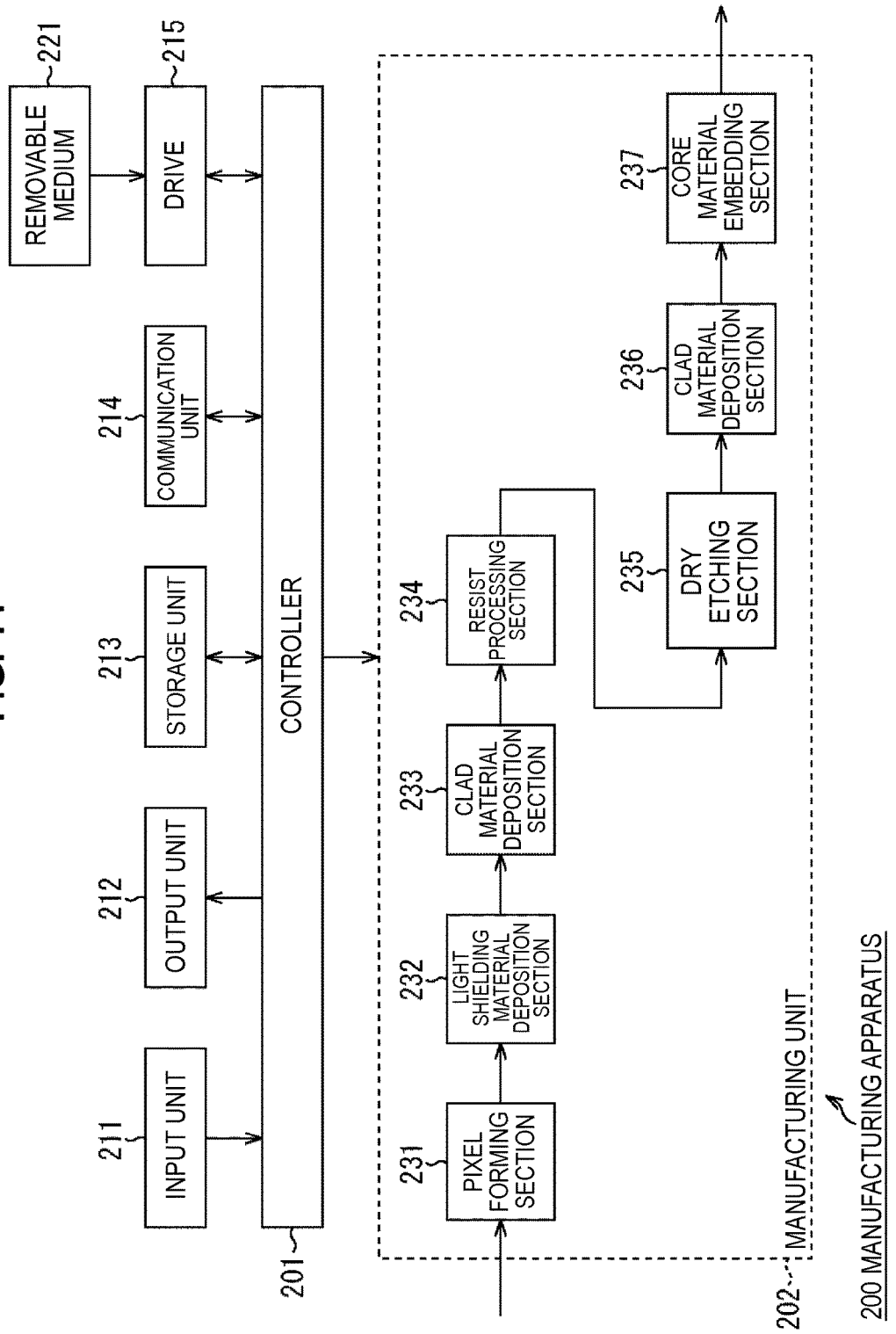
FIG. 14 is a block diagram illustrating a main configuration example of a manufacturing apparatus.

FIG. 14 is a block diagram illustrating a main configuration example of a manufacturing apparatus according to an embodiment of the manufacturing apparatus to which the present technology is applied. A manufacturing apparatus 200 illustrated in FIG. 14 is the manufacturing apparatus for manufacturing the CCD image sensor 100, and includes a controller 201 and a manufacturing unit 202.

The controller 201 may include a central processing unit (CPU), a read only memory (ROM), a random access memory (RAM), and so on. The controller 201 controls each component of the manufacturing unit 202 and performs a control process for manufacturing the CCD image sensor 100. For example, the CPU of the controller 201 executes various processes according to the program stored in the ROM. In addition, the CPU executes various processes according to the program loaded into the RAM from a storage unit 213. Additionally, the RAM stores appropriately data necessary for the CPU to execute various processes.

The manufacturing unit 202 is controlled by the controller 201 and performs a process for manufacturing the CCD image sensor 100. The manufacturing unit 202 may include a pixel forming section 231, a light shielding material deposition section 232, a clad material deposition section 233, a resist processing section 234, a dry etching section 235, a clad material deposition section 236, and a core material embedding section 237. These components from the pixel forming section 231 to the core material embedding section 237 are controlled by the controller 201, and perform a process of each step for manufacturing an image sensor as described later.

For simplicity and clarity of illustration, only steps related to an embodiment of the present technology will be described herein. In practice, in order to manufacture the CCD image sensor 100, steps other than those performed by these components are necessary and the manufacturing unit 202 may include a processing unit for the other steps. However, the other steps are similar to those necessary for the case of manufacturing a typical CCD image sensor, and thus detailed descriptions of the other steps will be omitted herein.

The manufacturing apparatus 200 may include an input unit 211, an output unit 212, a storage unit 213, a communication unit 214, and a drive 215.

The input unit 211 may include a keyboard, a mouse, a touch panel, an external input terminal, or the like. The input unit 211 receives a user instruction or information from the external and supplies it to the controller 201. The output unit 212 may include a display such as cathode ray tube (CRT) display or liquid crystal display (LCD), a speaker, an external output terminal, or the like. The output unit 212 outputs various types of information supplied from the controller 201 as images, sounds, or an analog signal or digital data.

The storage unit 213 may include a solid-state drive (SSD) such as flash memory, a hard disk, or the like, and store information supplied from the controller 201. The storage unit 213 reads and supplies the stored information in response to the request from the controller 201.

The communication unit 214 may include an interface or modem for a wired local area network (LAN) or wireless LAN. The communication unit 214 performs a communication process with external devices via a network including the Internet. For example, the communication unit 214 transmits information supplied from the controller 201 to a communication partner and supplies information received from the communication partner to the controller 201.

The drive 215 is connected to the controller 201 as necessary. A removable medium 221 such as a magnetic disk, an optical disk, a magneto-optical disk, or a semiconductor memory is suitably attached to the drive 215. A computer program read out from the removable medium 221 via the drive 215 is installed in the storage unit 213 as necessary.

Figure 15:
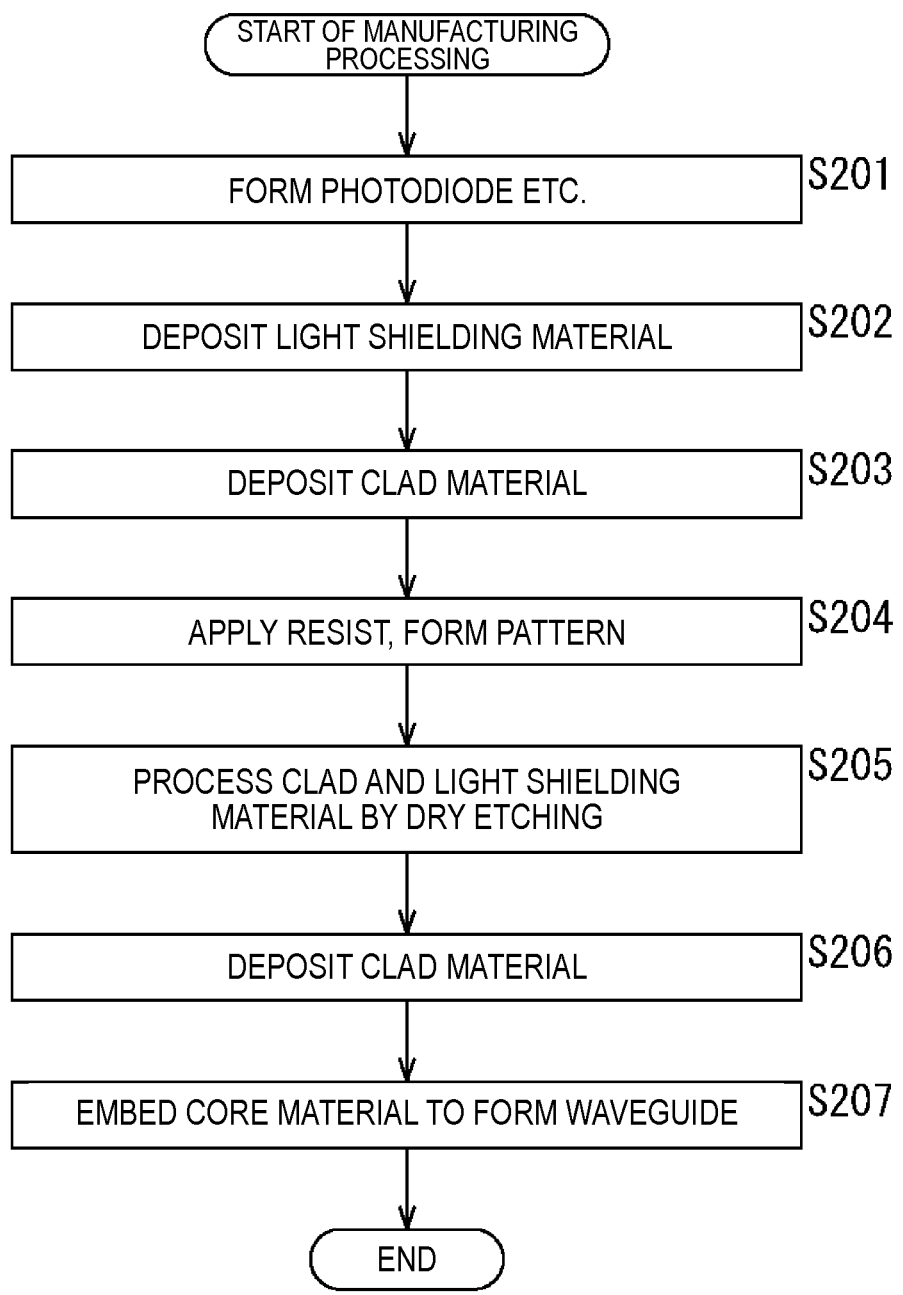
FIG. 15 is a flowchart for explaining an exemplary flow of a manufacturing process.
Figure 16:
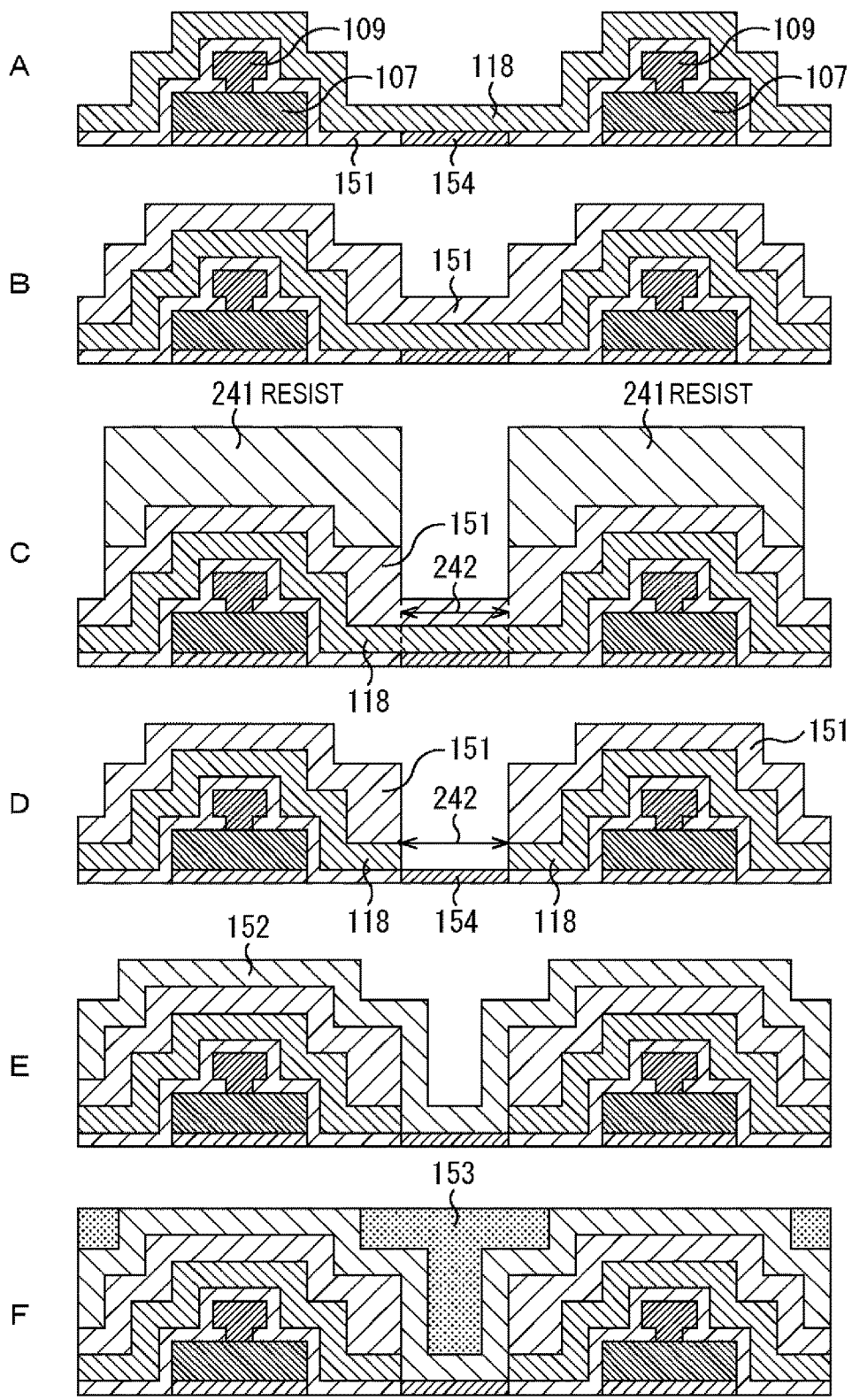
FIG. 16 is a diagram for explaining an example of how to manufacture.

Referring to the flowchart of FIG. 15, an exemplary flow of manufacturing process will be described. In addition, the description will be given with reference to FIG. 16 as appropriate. FIG. 16 is a diagram for explaining each step for the manufacturing process.

When the manufacturing process is started, in step S201, the pixel forming section 231 forms a photodiode, the transfer electrode 107, the connecting wire 109, the clad 151, or the like on a semiconductor substrate prepared from the external. This process is performed under the control of the controller 201.

In step S202, the light shielding material deposition section 232 deposits a light shielding material (the light shielding film 118) on the semiconductor substrate in which a photodiode or the like is formed under the control of the controller 201 (FIG. 16A). The light shielding material may include, but not limited to, metal such as tungsten (W) or aluminum (Al) and organic material such as carbon black or titanium black, and so on.

In step S203, the clad material deposition section 233 deposits a cladding material (the clad 151) under the control of the controller 201 (FIG. 16B). The cladding material uses materials having a refractive index lower than a material of the waveguide core 153. For example, the cladding material may include silicon oxide (SiO), silicon oxynitride (SiON), and so on.

In step S204, the resist processing section 234 applies a resist 241 and forms a pattern on the resist 241 (FIG. 16C). That is, the resist processing section 234 forms the pattern in which the resist 241 is removed from only a portion for forming the waveguide (the portion indicated by a double arrow 242). The width (the length of the double arrow 242) of the portion from which the resist is removed is set by the resist processing section 234 according to the length of the wavelength of incident light. Thus, it is possible to control the width of the waveguide core 153 and the width of the opening of the light shielding film 118, as described above with reference to FIG. 3.

Therefore, for example, in the case of B pixel, the spacing of the resist 241 may be set to be narrow so that the width of the waveguide core 153 or the width of the opening of the light shielding film 118 is set to be narrow. In addition, in the case of R pixel, the spacing of the resist 241 may be set to be wide so that the width of the waveguide core 153 or the width of the opening of the light shielding film 118 is set to be wide.

In step S205, the dry etching section 235 performs a dry etching, and processes the light shielding material (the light shielding film 118) deposited by the process of step S202 and the clad 151 deposited by the process of step S203 (FIG. 16D). More specifically, the portion indicated by the double arrow 242 of the clad 151 and the light shielding material (the light shielding film 118) is removed. That is, the clad 151 and the light shielding material (the light shielding film 118) are cut to the width according to the control in the step S204. During the dry etching, it is possible to reduce the plasma damage by performing an isotropic etching.

After removing the resist, in step S206, the clad material deposition section 236 deposits a cladding material (the clad 152) (FIG. 6E).

In step S207, the core material embedding section 237 embeds a core material in a recessed portion formed as described above to form the waveguide core 153 (FIG. 16F). In this way, the waveguide including the waveguide core 153 and the clad (the clad 151 and the clad 152) is formed. The core material may be any material having a refractive index higher than that of the material of the clad 151. For example, the core material may include silicon nitride (SiN), silicon oxynitride (SiON), and so on.

After the process of step S207 is completed, the manufacturing process is finished. In practice, thereafter, a wiring layer, color filter, focusing lens or the like may be formed.

As described above, the manufacturing apparatus 200 can manufacture the CCD image sensor 100. Specifically, the manufacturing apparatus 200 can control simultaneously both the widths of the waveguide core 153 and the opening of the light shielding film 118 by using the self-alignment process in steps S204 and S205. In addition, this simultaneous control makes it possible to reduce the noise variance and improve the yield.

[Refractive Index of Clad]

The refractive index of the clad may not be uniform in all parts. For example, a peripheral part of the clad may have a refractive index lower than that of an inner part of the clad. For example, a clad near the waveguide core 153 may have a higher refractive index as it gets away from the waveguide core 153.

For example, the clad may be formed in a multi-layer structure, and the refractive index thereof may be different for each layer. For example, a clad near the waveguide core 153 may have a lower refractive index as it closes to the waveguide core 153.

As described above, for the clad near the waveguide core 153, the clad 151 and the clad 152 are deposited in separated process steps, i.e. the deposition is performed two times. The clad 151 and the clad 152 may be different in refractive index from each other. In this case, the deposition step of the clad 151 and the clad 152 may be different from each other, and thus it is possible to change easily the refractive index by simply changing the clad material to be deposited.

For example, if the refractive index of the waveguide core 153 is set as nc, the refractive index of the clad 152 is set as n1, and the refractive index of the clad 151 is set as n2, the relationship nc>n2>n1 may be established.

Figure 17:
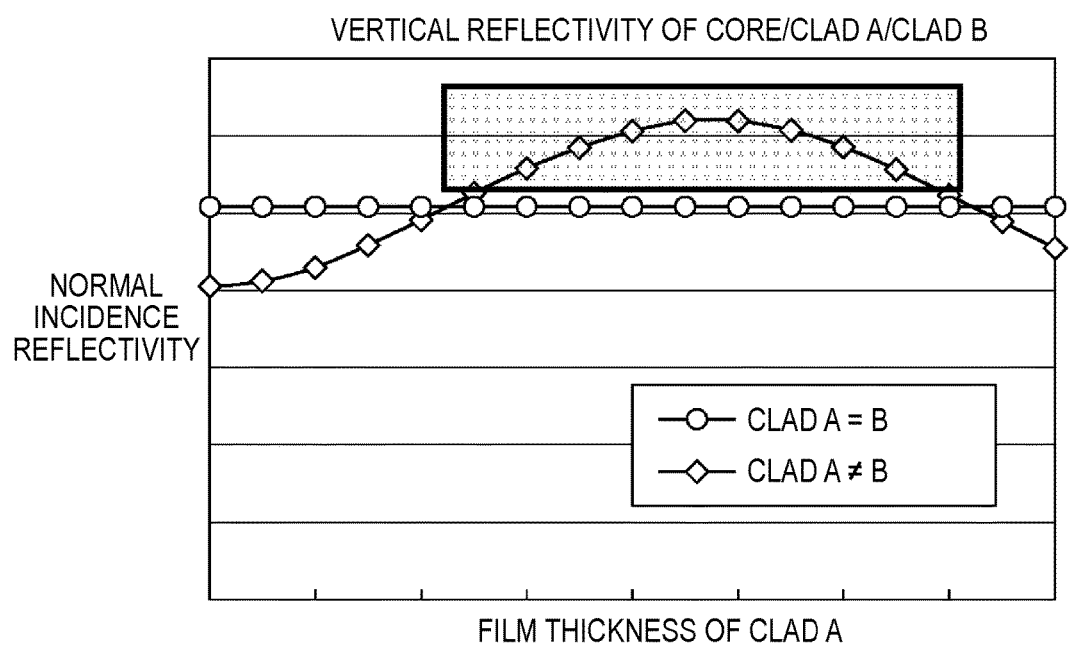
FIG. 17 is a diagram for explaining an example of a refractive index of a clad.

FIG. 17 is a graph showing the relationship between the film thickness of the clad 152 and the normal incidence reflectivity. The graph of FIG. 17 shows the relationship between the film thickness of the clad 152 and the normal incidence reflectivity for the light with a wavelength of 550 nm. The refractive index n c of the waveguide core 153 is set to be 2.00, the refractive index n1 of the clad 152 is set to be 1.45, and the refractive index n2 of the clad 151 is set to be 1.45 or 1.50.

In the graph illustrated in FIG. 17, in the case where the refractive index n2 of the clad 151 and the refractive index n1 of the clad 152 are equal to each other (n2=1.45), as shown in the curve plotted with a circle (o), the normal incidence reflectivity is substantially constant regardless of the film thickness of the clad 152.

Meanwhile, in the case where the refractive index n2 of the clad 151 and the refractive index n1 of the clad 152 are different from each other (n2=1.50), the normal incidence reflectivity becomes a curve plotted with a square (◇) as illustrated in FIG. 17. That is, in the portion of the film thickness shown in gray, the waveguide characteristics are improved.

In practice, in a condition where light is condensed by the on-chip lens or the like, the incident angle is not vertical. Thus, the film thickness of the clad 152 having the improved waveguide characteristics is shifted to the thickness thinner than the example of FIG. 17.

As described above, the refractive index may be set to be nc>n2>n1, thus it is possible to improve the waveguide characteristics rather than the case where the refractive index is set to be n1>n2=n3.

[Anti-Reflection Film]

The width of the anti-reflection film 154 may be set to a size depending on the width of the waveguide core 153 (or the width of the opening of the light shielding film 118). That is, for example, as illustrated in FIGS. 18A to 18C, the width of the anti-reflection film 154 (the length of the double arrow 243) may be set to a size (for example, B pixel≤G pixel≤R pixel) depending on the wavelength of incident light.

The anti-reflection film 154 is made of, for example, silicon nitride (SiN) or silicon oxynitride (SiON). The anti-reflection film 154 is preferably formed to be wider to improve the sensitivity and is preferably formed to be narrower to reduce the occurrence of noise. Based on such a trade-off relationship, the anti-reflection film 154 is preferably formed, for example, at a distance of 50 nm to 100 nm from the end of the opening of the light shielding film, or is preferably formed to have a width comparable to the width of the waveguide core 153.

[Pupil Correction]

Furthermore, in the photoelectric conversion region of a pixel, pupil correction may be performed according to the position of a target pixel. That is, as illustrated in FIGS. 19A to 19C, in the photoelectric conversion region (effective pixel region) of a pixel, the position of the dotted line 173 indicating the center of the light emitting surface of the waveguide core 153 (or the center of the opening of the light shielding film 118) may be controlled according to the position of a target pixel.

FIG. 19A illustrates an example of a cross section of a pixel near the left end of the effective pixel region (left viewing angle). FIG. 19B illustrates an example of a cross section of a pixel near the center of the effective pixel region (middle viewing angle). FIG. 19C illustrates an example of a cross section of a pixel near the right end of the effective pixel region (right viewing angle).

In the example of FIG. 19A (left viewing angle), the dotted line 173 indicating the center of the light emitting surface of the waveguide core 153 and the center of the opening of the light shielding film 118 is shifted to the right in the figure from the center of the pixel. In addition, in the example of FIG. 19B (middle viewing angle), the dotted line 173 indicating the center of the light emitting surface of the waveguide core 153 and the center of the opening of the light shielding film 118 is located near the center of the pixel. Further, in the example of FIG. 19C (right viewing angle), the dotted line 173 indicating the center of the light emitting surface of the waveguide core 153 and the center of the opening of the light shielding film 118 is shifted to the left in the figure from the center of the pixel.

In this way, the pupil correction is performed on the waveguide core 153 or the opening of the light shielding film 118, and thus it is possible to improve the shading characteristics. In addition, as described above, the opening of the light shielding film and the waveguide are formed in self-alignment, and thus the pupil correction amount are the same.

<2. Second Embodiment>

[Back-illuminated CMOS Image Sensor]

The above description has been made based on the example of using the CCD image sensor, but an embodiment of the present technology can be also applied to the back-illuminated complementary metal oxide semiconductor (CMOS) image sensor.

Figure 20:
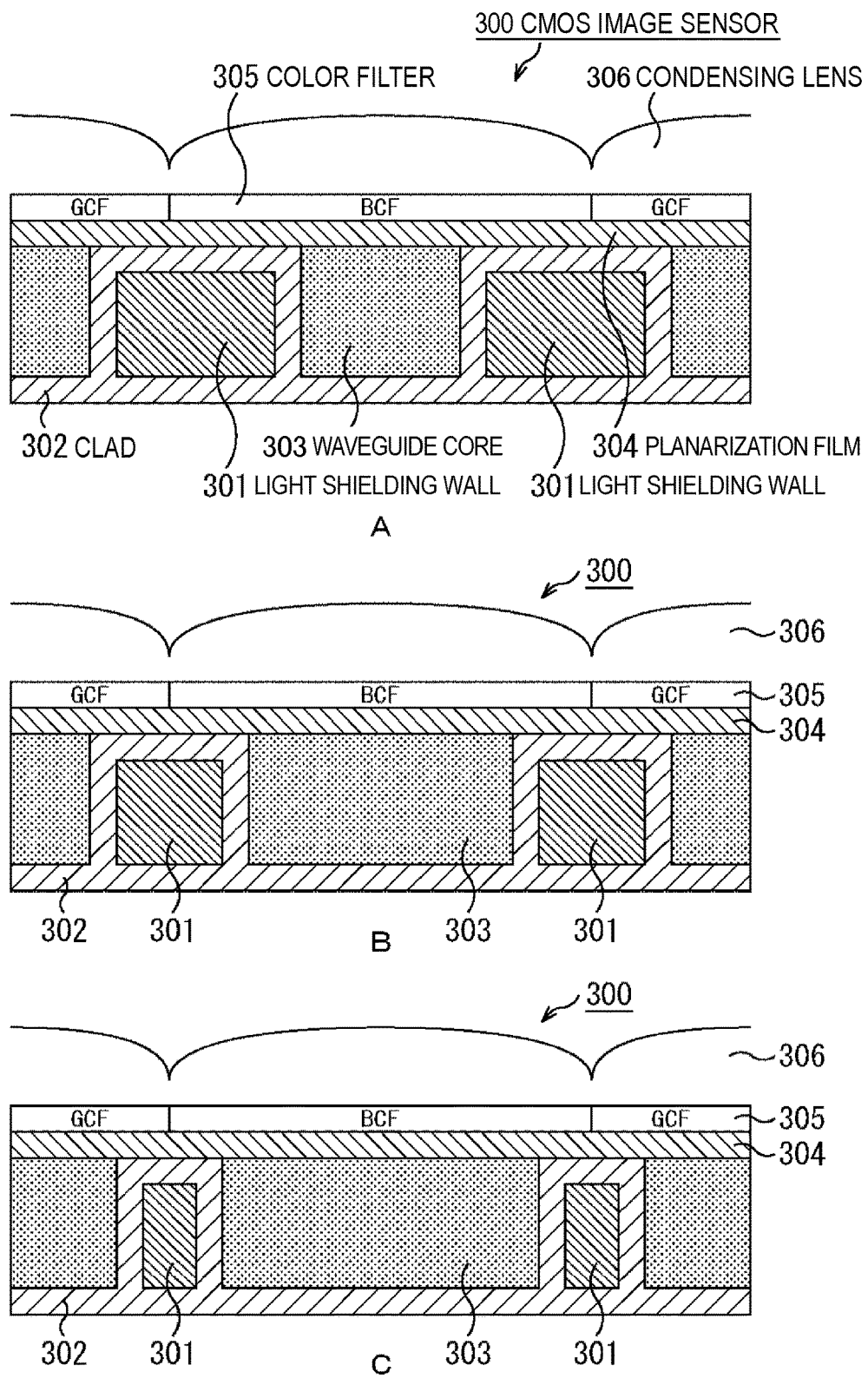
FIG. 20 is a diagram illustrating an example of a cross section of a CMOS image sensor.

The FIG. 20 illustrates an example of a cross section of a pixel having different wavelength regions of incident light of a CMOS image sensor 300 to which the present technology is applied. FIGS. 20A to 20C correspond to FIGS. 3A to 3C showing the CCD image sensor 100, respectively. Some components such as a light receiving portion have well-known configurations, and a detailed description thereof will be omitted.

FIG. 20A illustrates an exemplary configuration of B pixel. In case of the CCD image sensor 100, the transfer electrode 107, the connecting wire 109, the insulating film 117, the light shielding film 118, the clad 126, and so on are formed between the pixels. In case of the CMOS image sensor 300, a light shielding wall 301 made of a light shielding material is formed between the pixels as illustrated in FIG. 20A. A clad 302 is stacked on the light shielding wall 301. In addition, a waveguide core 303 is embedded in a waveguide at the center of the pixel. The waveguide made of the waveguide core 303 and its neighboring clad 302 is formed. A planarization film 304 is stacked on the waveguide core 303 and the clad 302. A color filter 305 (a blue color filter BCF in B pixel or the like) or a condensing lens 306 is formed on the planarization film 304.

FIG. 20B illustrates an exemplary configuration of G pixel. FIG. 20C illustrates an exemplary configuration of R pixel. B pixel, G pixel, and R pixel have a basically similar structure.

However, in each of B pixel, G pixel, and R pixel, the width of the waveguide core 303 and the width of the opening between the light shielding walls 301 (i.e., the opening of the light shielding film) are different from each other, as in the case of the CCD image sensor.

That is, even in the CMOS image sensor 300, the width of the waveguide core and the width of the opening between the light shielding walls are controlled depending on the wavelength of incident light of the pixel. That is, the width of the waveguide core and the width of the opening between the light shielding walls are set to be wider as the wavelength of light incident on the pixel becomes longer.

More specifically, as illustrated in FIG. 20A, the width of the waveguide core 303 and the width of the opening between the light shielding walls 301 are formed to be narrowest for the B pixel on which light having the shortest wavelength region is incident. In addition, as illustrated in FIG. 20C, the width of the waveguide core 303 and the width of the opening between the light shielding walls 301 are formed to be widest for the R pixel on which light having the longest wavelength region is incident. As illustrated in FIG. 20B, for the G pixel, the waveguide core 303 and the opening between the light shielding walls 301 are formed to have a middle-sized width between B pixel and R pixel.

In this way, according to the CMOS image sensor 300, in a similar way to the case of the CCD image sensor 100, it is possible to suppress the reduction in sensitivity of the light receiving portion and the occurrence of noise, and further reduce the occurrence of color shading.

[Control of Waveguide Core Width in Light Emitting Side]

Even in the CMOS image sensor 300, in a similar way to the case of the CCD image sensor 100, the width of the waveguide core 303 may be changed between the light incident surface and the light emitting surface of the waveguide. For example, the width of the waveguide core 303 in the light incident surface of the waveguide may be different from the width of the waveguide core 303 in the light emitting surface of the waveguide.

In this case, at least in the light emitting surface of the waveguide, as described above with reference to FIG. 20, the width of the waveguide core 303 may be controlled depending on the wavelength of light incident on a target pixel. That is, at least in the light emitting surface of the waveguide, the width of the waveguide core 303 and the width of the opening between the light shielding walls 301 are set to be wider as the wavelength of light incident on a target pixel becomes longer.

In this way, in the CMOS image sensor 300, in a similar way to the case of the CCD image sensor 100, it is possible to suppress the increase of noise.

[Control of Waveguide Core Width in Light Incident Side]

The width of the waveguide core 303 in the upper portion of the waveguide can be set independently of the width of the waveguide core 303 in the lower portion of the waveguide. For example, the width of the waveguide core 303 in the upper portion of the waveguide can be set to be different from the width of the waveguide core 303 in the lower portion of the waveguide.

In each pixel, the width of the opening between the light shielding walls 301 is corresponded to the width of the waveguide core 303 in the lower portion of the waveguide, in a similar way to the case of FIG. 20.

Meanwhile, the width of the waveguide core 303 in the upper portion of the waveguide is set independently of the width of the waveguide core 303 in the lower portion of the waveguide or the width of the opening between the light shielding walls 301.

With this configuration, it is possible to suppress the occurrence of noise and the reduction in sensitivity.

The width of the waveguide core 303 in the upper portion of the waveguide may be set to satisfy any of the conditions of B pixel≤G pixel≤R pixel, B pixel≥G pixel≥R pixel, and B pixel=G pixel=R pixel.

Furthermore, the width of the waveguide core 303 in each pixel may be changed in three stages or more, or may be changed continuously. The waveguide core 303 is formed in a stepwise manner (more continuous change) between the light incident surface and the light emitting surface of the waveguide, and thus it is possible to mitigate the interference, thereby suppressing variation in the spectral ripple.

Moreover, even in the CMOS image sensor 300, in a similar way to the case of the CCD image sensor 100, the waveguide core 303 may have a center axis formed in a position to be determined for each wavelength region of incident light with respect to the center of the opening between the light shielding walls 301.

Further, even in the CMOS image sensor 300, in a similar way to the case of the CCD image sensor 100, the center axis of the waveguide core 303 and the center axis of the opening between the light shielding walls 301 may be formed in a position to be determined for each wavelength region of incident light with respect to the center of a target pixel.

[Refractive Index of Clad]

Even in the CMOS image sensor 300, in a similar way to the case of the CCD image sensor 100, the refractive index of the clad 302 may not be uniform in all parts. For example, a peripheral part of the clad may have a refractive index lower than that of an inner part of the clad 302. For example, a clad 302 near the waveguide core 303 may have a higher refractive index as it gets away from the waveguide core 303.

For example, the clad 302 may be formed in a multi-layer structure, and the refractive index thereof may be different for each layer. For example, a clad near the waveguide core 303 may have a lower refractive index as it closes to the waveguide core 303.

[Anti-Reflection Film]

Moreover, even in the CMOS image sensor 300, in a similar way to the case of the CCD image sensor 100, an anti-reflection film similar to the anti-reflection film 154 may be provided near the opening between the light shielding walls 301. Further, the width of the anti-reflection film may be set to a size depending on the width of the waveguide core 303 (or the width of the opening between the light shielding walls 301).

[Pupil Correction]

Further, even in the CMOS image sensor 300, in a similar way to the CCD image sensor 100, the pupil correction may be performed according to a position of a pixel in the photoelectric conversion region of the pixel. Thus, the pupil correction is performed on the waveguide core 303 or the opening between the light shielding walls 301, and thus it is possible to improve the shading characteristics.

[Manufacturing]

Figure 21:
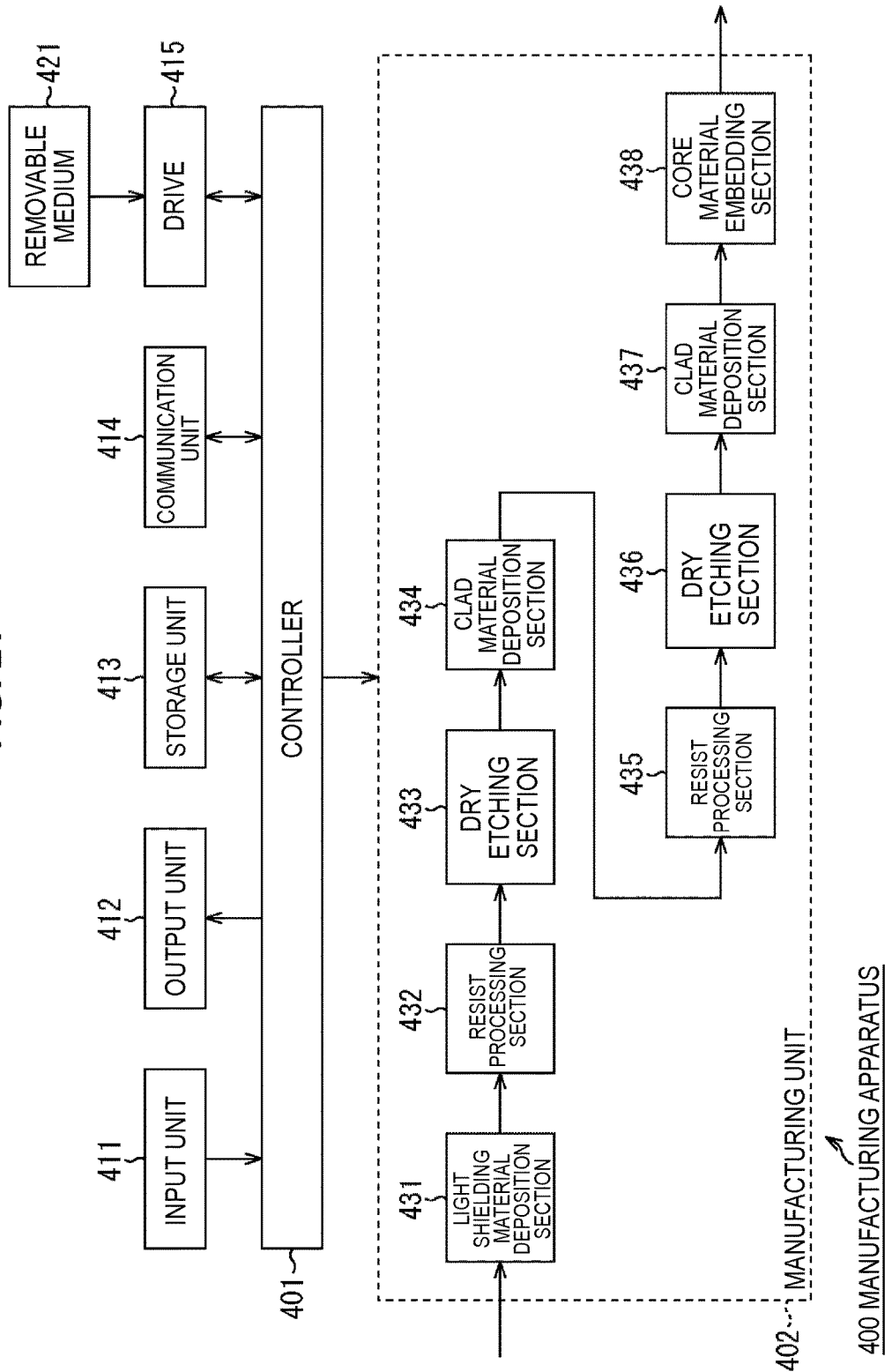
FIG. 21 is a block diagram illustrating a main configuration example of a manufacturing apparatus.

FIG. 21 is a block diagram illustrating a main configuration example of a manufacturing apparatus according to an embodiment of the manufacturing apparatus to which the present technology is applied. A manufacturing apparatus 400 illustrated in FIG. 21 is the manufacturing apparatus for fabricating the CMOS image sensor 300, and includes a controller 401 and a manufacturing unit 402.

The manufacturing apparatus 400 may include an input unit 411, an output unit 412, a storage unit 413, a communication unit 414, and a drive 415.

The controller 401, the input unit 411, the output unit 412, the storage unit 413, the communication unit 414, and the drive 415 are, respectively, similar processing components to the controller 201, the input unit 211, the output unit 212, the storage unit 213, the communication unit 214, and the drive 215 in the manufacturing apparatus 200. A removable medium 421 having a similar configuration to the removable medium 221, such as a magnetic disk, an optical disk, a magneto-optical disk, or a semiconductor memory is suitably attached to the drive 415 as necessary.

The manufacturing unit 402 is controlled by the controller 401 and performs a process for manufacturing the CMOS image sensor 300. The manufacturing unit 402 may include, for example, a light shielding material deposition section 431, a resist processing section 432, a dry etching section 433, a clad material deposition section 434, a resist processing section 435, a dry etching section 436, a clad material deposition section 437, and a core material embedding section 438. These components from the light shielding material deposition section 431 to the core material embedding section 438 are controlled by the controller 401, and perform a process of each step for manufacturing the CMOS image sensor 300 as described later.

For simplicity and clarity of illustration, only steps related to an embodiment of the present technology will be described herein. In practice, in order to manufacture the CMOS image sensor 300, steps other than those performed by these components are necessary and the manufacturing unit 402 may include a processing unit for the other steps. However, the other steps are similar to those necessary for the case of manufacturing a typical CMOS image sensor, and thus detailed descriptions of the other steps will be omitted herein.

Figure 22:
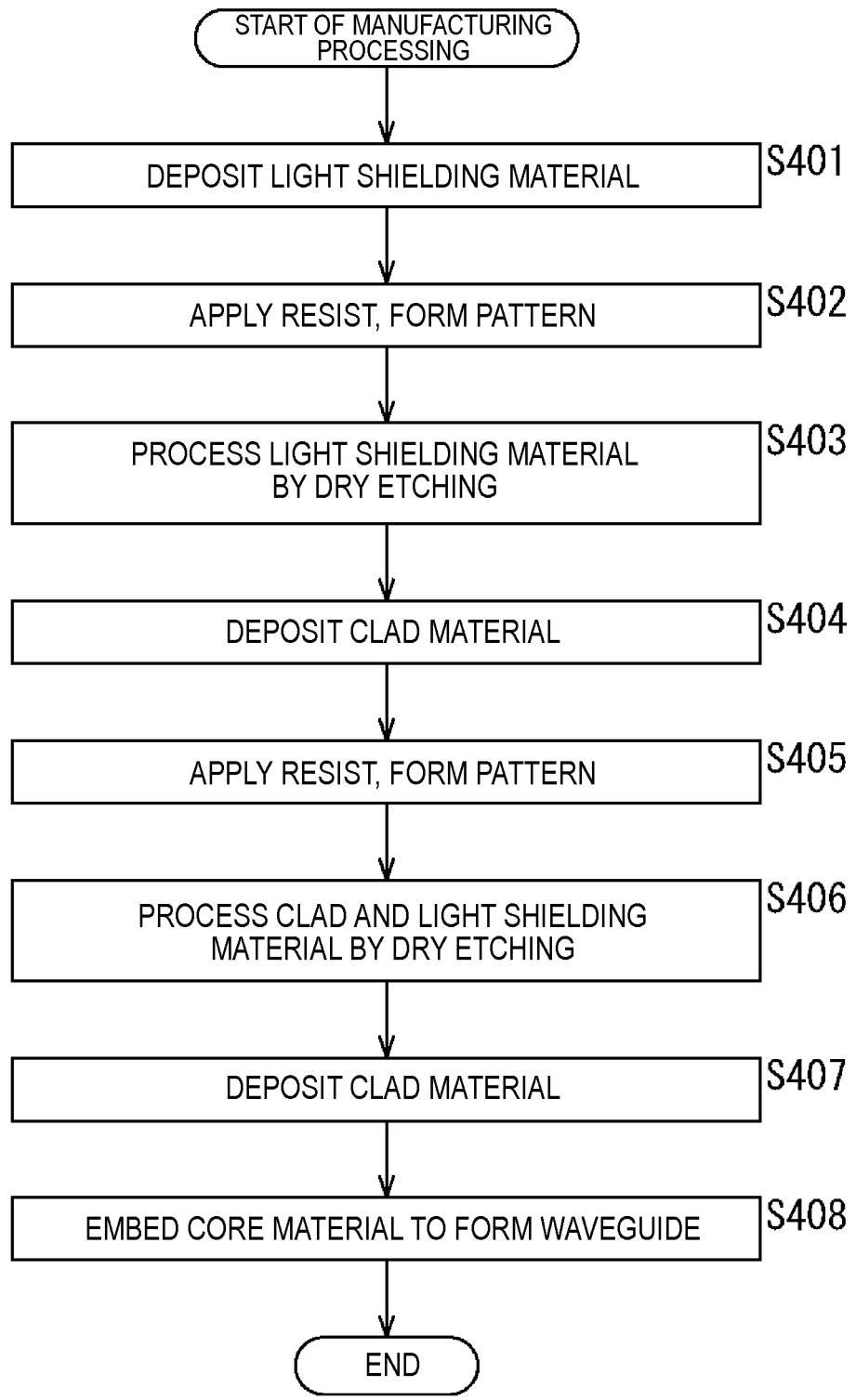
FIG. 22 is a flowchart for explaining an exemplary flow of a manufacturing process.
Figure 23:
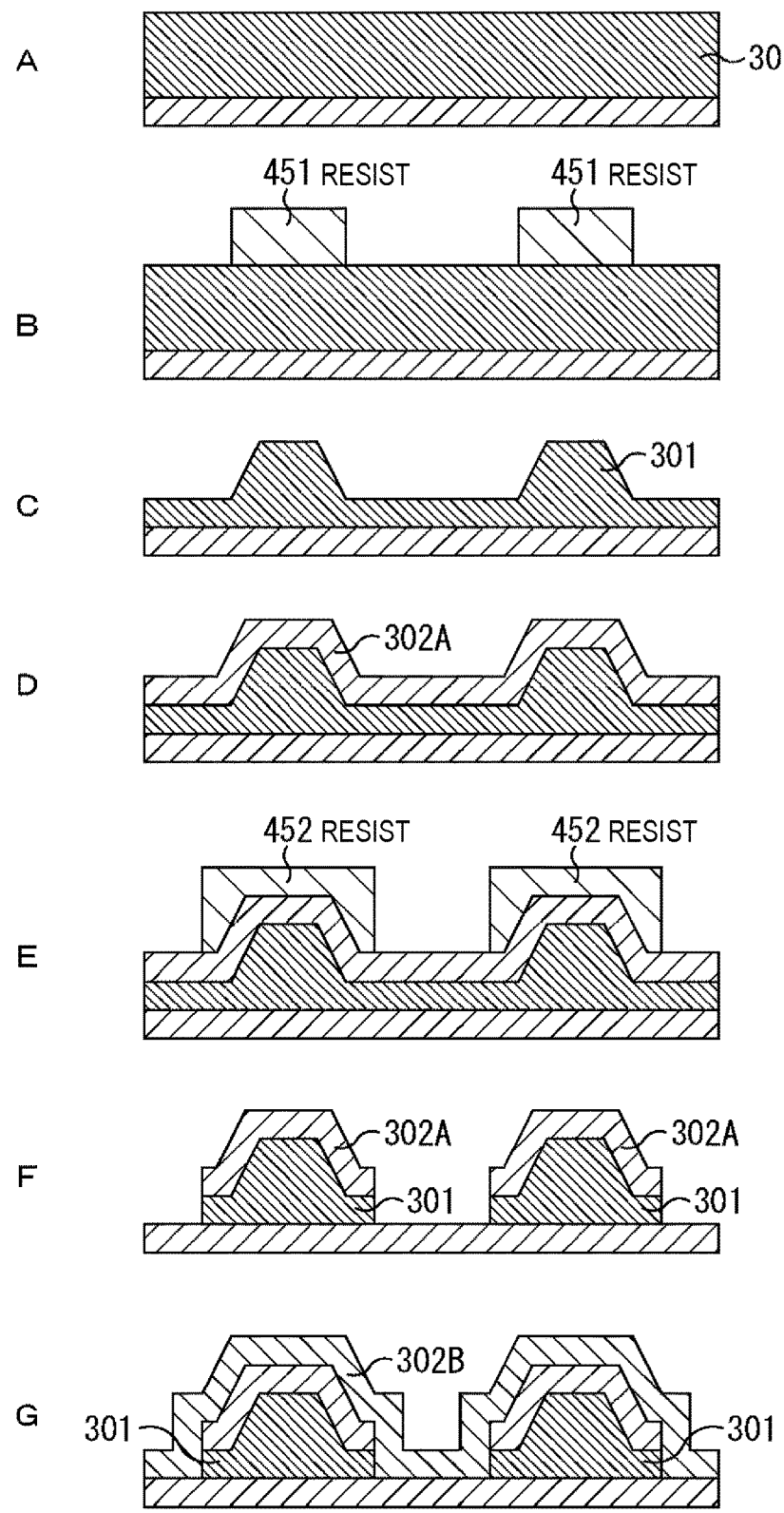
FIG. 23 is a diagram for explaining an example of how to manufacture.

Referring to the flowchart of FIG. 22, an exemplary flow of manufacturing process will be described. In addition, the description will be given with reference to FIG. 23 as appropriate. FIG. 23 is a diagram for explaining each step for the manufacturing process.

When the manufacturing process is started, in step S401, the light shielding material deposition section 431 deposits a light shielding material on a semiconductor substrate (not shown) in which a photodiode or the like is formed under the control of the controller 401 (FIG. 23A). The light shielding material may include, but not limited to, metal such as tungsten (W) or aluminum (Al), organic material such as carbon black or titanium black, and so on.

In step S402, the resist processing section 432 applies a resist 451 on the light shielding material and forms a pattern on the resist 451 under the control of the controller 401 (FIG. 23B). That is, the resist processing section 432 forms the pattern in which the resist 451 is removed from only a portion for forming the waveguide. In this time, the resist processing section 432 may cause the width of each resist 451 to be constant, but the resist processing section 432 may cause the width of each resist 451 to be set depending on the wavelength of incident light (for example, the width of the resist 451 may be set to be narrower as the wavelength of light incident on a target pixel becomes longer). With this configuration, as illustrated in FIG. 20, the width of the light shielding wall 301, i.e., the width of the opening between the light shielding walls 301 can be controlled for each pixel.

In step S403, the dry etching section 433 performs a dry etching (half etching), processes the light shielding material deposited by the process of step S401, and thus forms the light shielding wall 301 (FIG. 23C). In this case, side walls of the light shielding wall 301 (surfaces in the vertical direction in the figure) may be formed as vertical surfaces as in the example of FIG. 20, or may have a taper (angle) to be thicker toward the lower portion of the figure as in the example of FIG. 23C.

After the resist is removed, in step S404, the clad material deposition section 434 deposits a cladding material (the clad 302A) (FIG. 23D). The clad 302A is a portion of the clad 302 illustrated in FIG. 20. The cladding material uses materials having a refractive index lower than the material of the waveguide core 303. For example, the cladding material may include silicon oxide (SiO), silicon oxynitride (SiON), and so on.

In step S405, the resist processing section 435 applies a resist 452 and forms a pattern on the resist 452 (FIG. 23E). That is, the resist processing section 435 forms the pattern in which the resist 452 is removed from only a portion for forming the waveguide. The width of the portion from which the resist is removed is set by the resist processing section 435 according to the length of the wavelength of incident light. Thus, it is possible to control the width of the waveguide core 303 or the width of the opening between the light shielding walls 301, as described above with reference to FIG. 20.

Therefore, for example, in the case of B pixel, the spacing of the resist 452 may be set to be narrow so that the width of the waveguide core 303 or the width of the opening between the light shielding walls 301 is set to be narrow. In addition, in the case of R pixel, the spacing of the resist 452 may be set to be wide so that the width of the waveguide core 303 or the width of the opening between the light shielding walls 301 is set to be wide.

In step S406, the dry etching section 436 performs a dry etching, and processes the light shielding material (light shielding material between the light shielding walls 301) deposited by the process of step S401 and the clad 302A deposited by the process of step S404 (FIG. 23F). More specifically, the clad 302A and the light shielding material between the resist 452 are removed. That is, the clad 302A and the light shielding material are cut to the width according to the control in the step S404. During the dry etching, it is possible to reduce the plasma damage by performing an isotropic etching.

After the resist is removed, in step S407, the clad material deposition section 437 deposits a cladding material (the clad 302B) (FIG. 23G). This clad 302B is a portion of the clad 302 illustrated in FIG. 20.

In step S408, the core material embedding section 438 embeds a core material in a recessed portion formed as described above to form the waveguide core 303. In this way, the waveguide including the waveguide core 303 and the clad 302 is formed. The core material may be any material having a refractive index higher than that of the material of the clad 302. For example, the core material may include silicon nitride (SiN), silicon oxynitride (SiON), and so on.

After the process of step S408 is completed, the manufacturing process is finished. In practice, thereafter, a wiring layer, color filter, focusing lens or the like may be formed.

As described above, the manufacturing apparatus 400 can manufacture the CMOS image sensor 300. Specifically, the manufacturing apparatus 400 can control simultaneously both the widths of the waveguide core 303 and the opening between the light shielding walls 301 by using the self-alignment process. In addition, this simultaneous control makes it possible to reduce the noise variance and improve the yield.

<3. Third Embodiment>
[Back-Illuminated CMOS Image Sensor]

Figure 24:
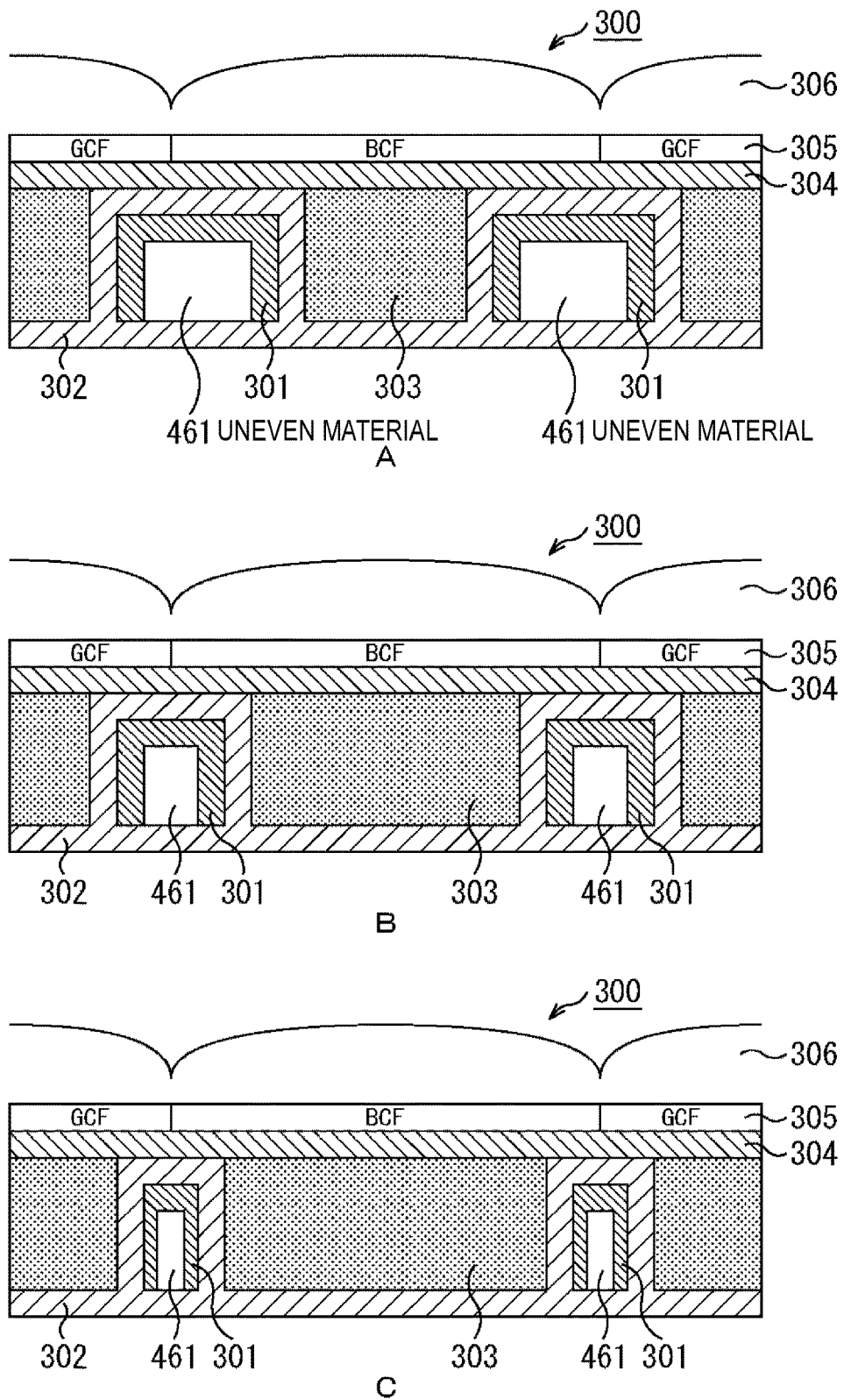
FIG. 24 is a diagram illustrating an example of a cross section of a CMOS image sensor.

In the back-illuminated CMOS image sensor 300 described above with reference to FIG. 20, instead of forming the light shielding wall 301 made of only a light shielding material, the light shielding wall 301 may be formed by using a predetermined uneven material that can easily form it in a three-dimensional shape. The example thereof is illustrated in FIG. 24. The FIGS. 24A to 24C are corresponded to FIGS. 20A to 20C, respectively.

In the example of FIG. 24, the light shielding wall forms its three-dimensional shape using the uneven material, and the light shielding wall 301 is formed on a surface thereof. Even in such a case, in a similar way to the case of FIG. 20, both the widths of the waveguide core and the opening between the light shielding walls can be controlled according to the wavelength of light incident on a target pixel. That is, both the widths of the waveguide core and the opening between the light shielding walls can be set to be wider as the wavelength of light incident on a target pixel becomes longer.

Therefore, even in this case, the CMOS image sensor 300 can suppress the reduction in sensitivity of the light receiving portion or the occurrence of noise, and further reduce the occurrence of color shading.

Control of Waveguide Core Width in Light Emitting Side

Even in this case, the width of the waveguide core 303 may be changed between the light incident surface and the light emitting surface of the waveguide. In this case, at least in the light emitting surface of the waveguide, both the widths of the waveguide core 303 and the opening between the light shielding walls may be set to be wider as the wavelength of light incident on a target pixel becomes longer. Thus, even in this case, the CMOS image sensor 300 can suppress the increase in noise components.

[Control of Waveguide Core Width in Light Incident Side]

Furthermore, also in this case, the width of the waveguide core 303 in the upper portion of the waveguide can be set independently of the width of the waveguide core 303 in the lower portion of the waveguide. In addition, also in this case, in each pixel, the width of the opening between the light shielding walls corresponds to the width of the waveguide core 303 in the lower portion of the waveguide, in a similar way to the case of FIG. 20. On the other hands, the width of the waveguide core 303 in the upper portion of the waveguide is set independently of the width of the waveguide core 303 in the lower portion of the waveguide or the width of the opening between the light shielding walls. With this configuration, it is possible to suppress the occurrence of noise and the reduction in sensitivity.

The width of the waveguide core 303 in the upper portion of the waveguide may be set to satisfy any of the conditions of B pixel≤G pixel≤R pixel, B pixel≥G pixel≥R pixel, and B pixel=G pixel=R pixel. Furthermore, the width of the waveguide core 303 in each pixel may be changed in three stages or more, or may be changed continuously. The waveguide core 303 is formed in a stepwise shape (more continuous change) between the light incident surface and the light emitting surface of the waveguide, and thus it is possible to mitigate the interference, thereby suppressing variation in the spectral ripple.

Furthermore, also in this case, a center axis of the waveguide core 303 may be formed in a position to be determined for each wavelength region of incident light with respect to the center of the opening between the light shielding walls 301. In addition, the center axis of the waveguide core 303 and the center axis of the opening between the light shielding walls may be formed in a position to be determined for each wavelength region of incident light with respect to the center of a target pixel.

[Refractive Index of Clad]

Moreover, also in this case, the refractive index of the clad 302 may not be uniform in all parts. For example, a peripheral part of the clad may have a refractive index lower than that of an inner part of the clad 302. For example, the clad 302 near the waveguide core 303 may have a higher refractive index as it gets away from the waveguide core 303.

For example, the clad 302 may be formed in a multi-layer structure, and the refractive index thereof may be different for each layer. For example, a clad near the waveguide core 303 may have a lower refractive index as it closes to the waveguide core 303.

[Anti-Reflection Film]

Moreover, also in this case, an anti-reflection film similar to the anti-reflection film 154 may be provided near the opening between the light shielding walls. Further, the width of the anti-reflection film may be set to a size depending on the width of the waveguide core 303 (or the width of the opening between the light shielding walls).

[Pupil Correction]

Further, also in this case, the pupil correction may be performed according to a position of a target pixel in the photoelectric conversion region of the pixel. In this way, the pupil correction is performed on the waveguide core 303 or the opening between the light shielding walls, and thus it is possible to improve the shading characteristics.

[Manufacturing]

Figure 25:
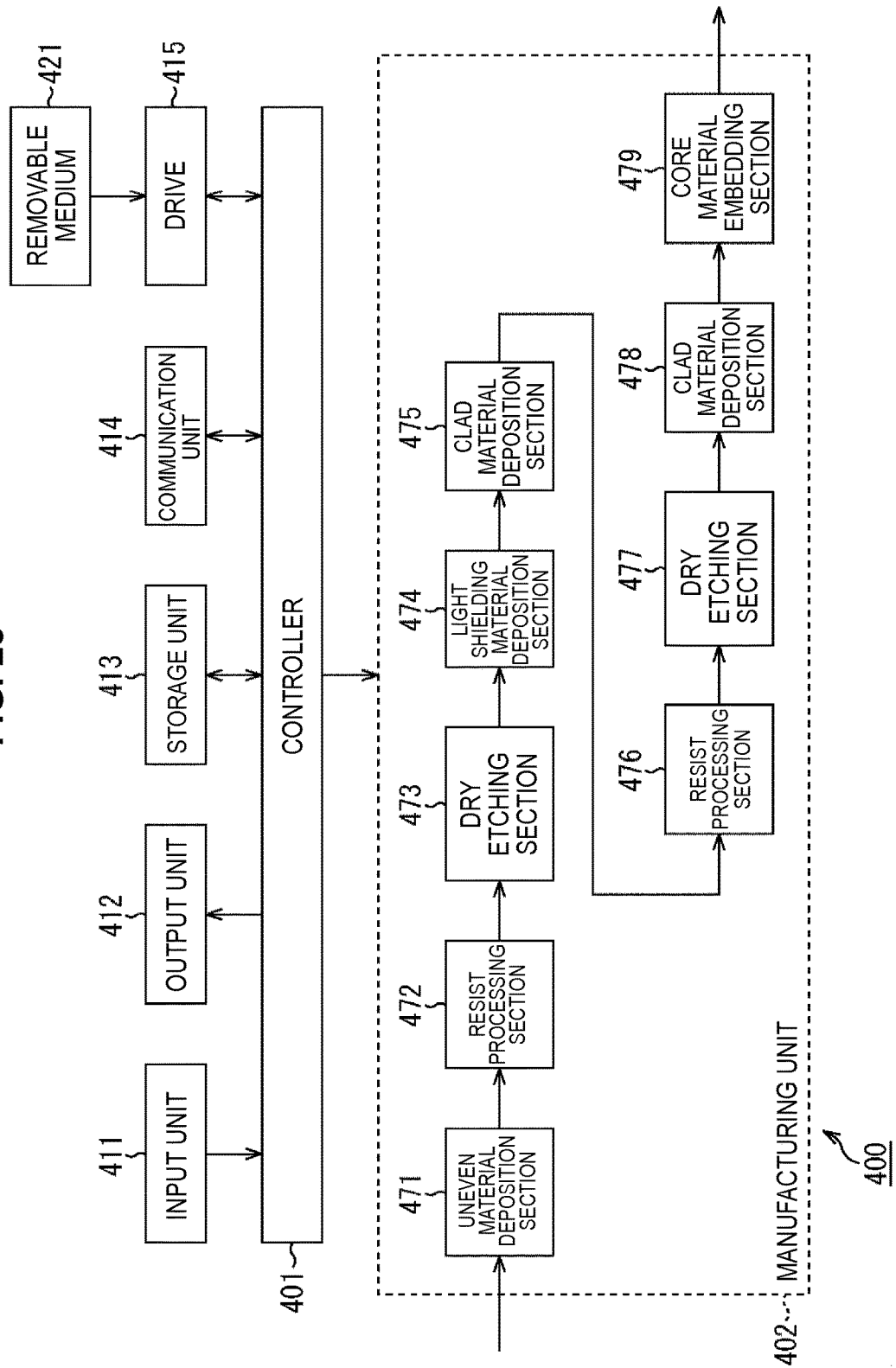
FIG. 25 is a block diagram illustrating a main configuration example of a manufacturing apparatus.

FIG. 25 is a block diagram illustrating a main configuration example of a manufacturing apparatus according to an embodiment of the manufacturing apparatus to which the present technology is applied. Also in the case of an example illustrated in FIG. 25, the manufacturing apparatus 400 has a basically similar configuration to the case of the example illustrated in FIG. 21.

The manufacturing unit 402 may include, for example, an uneven material deposition section 471, a resist processing section 472, a dry etching section 473, a light shielding material deposition section 474, a clad material deposition section 475, a resist processing section 476, a dry etching section 477, a clad material deposition section 478, and a core material embedding section 479. These components from the uneven material deposition section 471 to the core material embedding section 479 are controlled by the controller 401, and perform a process of each step for manufacturing the CMOS image sensor 300 as described later.

For simplicity and clarity of illustration, only steps related to an embodiment of the present technology will be described herein. In practice, in order to manufacture the CMOS image sensor 300, steps other than those performed by these components are necessary and the manufacturing unit 402 may include a processing unit for the other steps. However, the other steps are similar to those necessary for the case of manufacturing a typical CMOS image sensor, and thus detailed descriptions of the other steps will be omitted herein.

Figure 26:
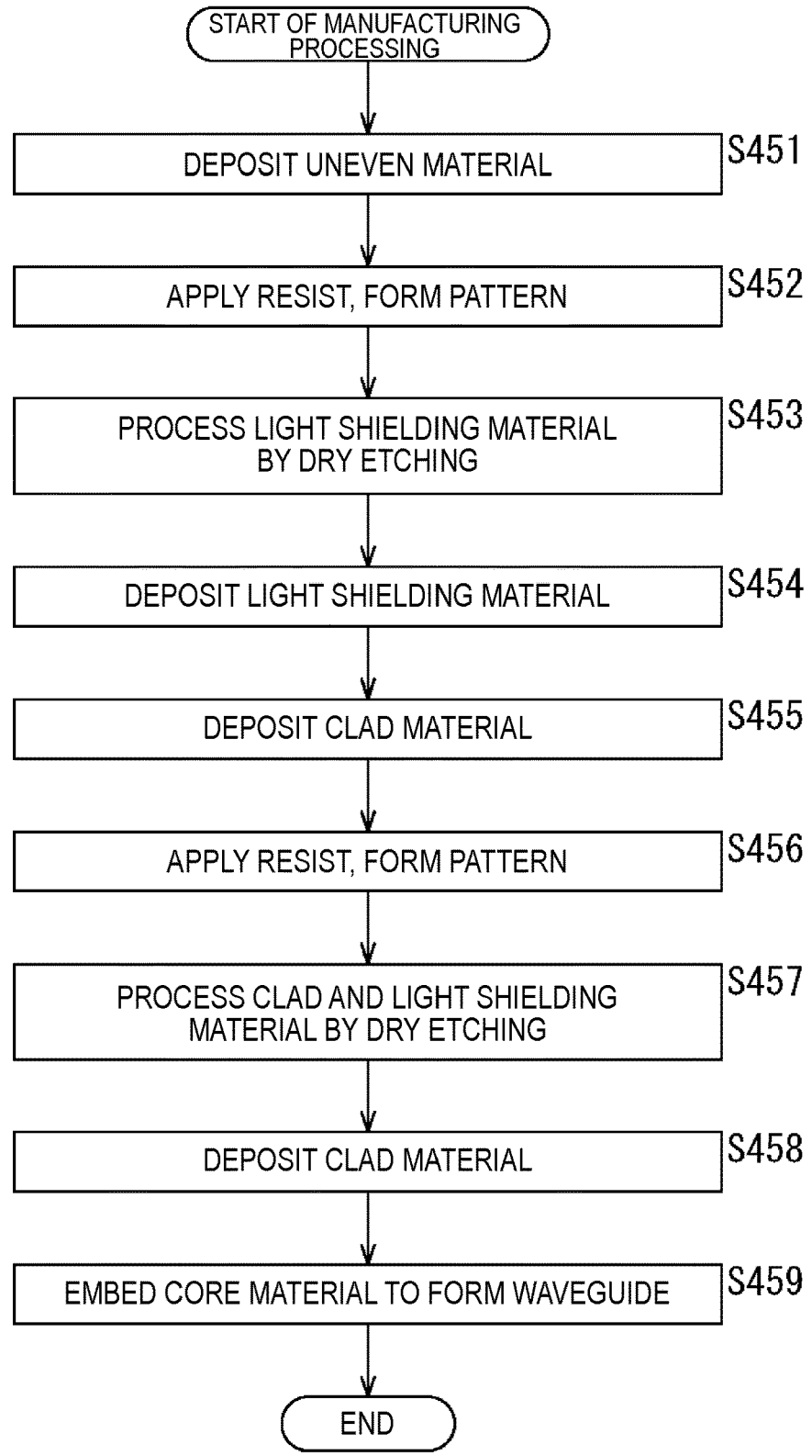
FIG. 26 is a flowchart for explaining an exemplary flow of a manufacturing process.

Referring to the flowchart of FIG. 26, an exemplary flow of manufacturing process will be described. In addition, the description will be given with reference to FIG. 27 as appropriate. FIG. 26 is a diagram for explaining each step for the manufacturing process.

When the manufacturing process is started, in step S451, the uneven material deposition section 471 deposits an uneven material 461 on a semiconductor substrate (not shown) in which a photodiode or the like is formed under the control of the controller 401 (FIG. 27A). The uneven material 461 may include, but not limited to, silicon (Si), silicon nitride (SiN), silicon oxide (SiO), metal, and so on.

Figure 27:
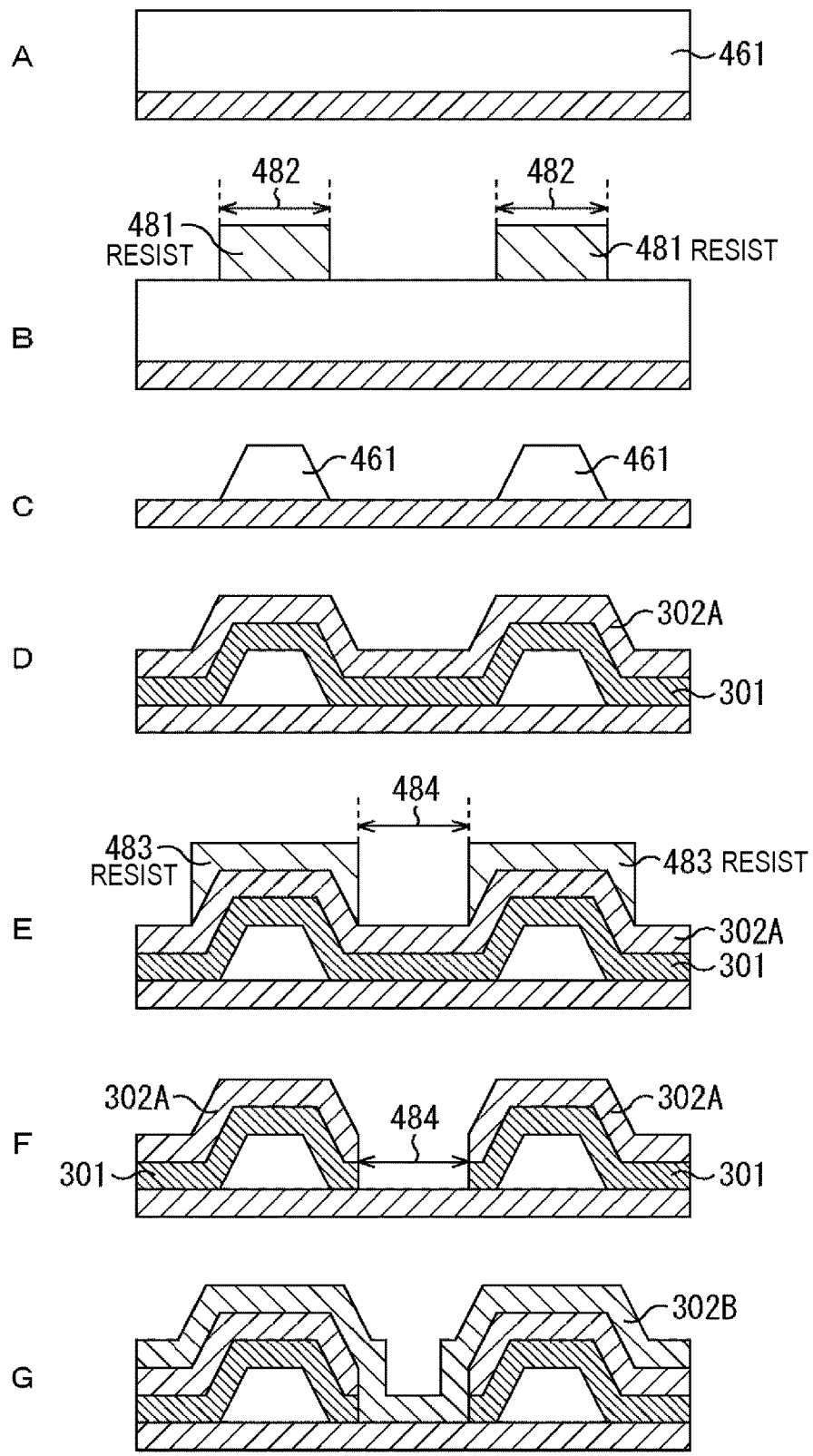
FIG. 27 is a diagram for explaining an example of how to manufacture.

In step S452, the resist processing section 472 applies a resist 481 on the uneven material 461 and forms a pattern on the resist 481 under the control of the controller 401 (FIG. 27B). That is, the resist processing section 472 forms the pattern in which the resist 481 is removed from only a portion for forming the waveguide. In this time, the resist processing section 472 may cause the width (the length of a double arrow 482) of each resist 481 to be constant, but the resist processing section 472 may cause the width of each resist 481 to be set depending on the wavelength of incident light (for example, the width of the resist 481 may be set to be narrow (the double arrow 482 is short) for a pixel on which light with a longer wavelength is incident). With this configuration, as illustrated in FIG. 27, the width of the uneven material 461, i.e., the width of the opening between the light shielding walls can be controlled for each pixel.

In step S453, the dry etching section 473 performs a dry etching, processes the uneven material 461 deposited by the process of step S451, and thus forms the light shielding wall (FIG. 27C). In this case, side walls of the light shielding wall (surfaces in the vertical direction in the figure) may be formed as vertical surfaces as in the example of FIG. 24, or may have a taper (angle) to be thicker toward the lower portion of the figure as in the example of FIG. 27C.

After the resist is removed, in step S454, the light shielding material deposition section 474 deposits a light shielding material (the light shielding wall 301). The light shielding material may include, but not limited to, metal such as tungsten (W) or aluminum (Al), organic material such as carbon black or titanium black, and so on. Further, in step S455, the clad material deposition section 475 deposits a cladding material (the clad 302A) (FIG. 27D). The clad 302A is a portion of the clad 302 illustrated in FIG. 24. The cladding material uses materials having a refractive index lower than the material of the waveguide core 303. For example, the cladding material may include silicon oxide (SiO), silicon oxynitride (SION), and so on.

In step S456, the resist processing section 476 applies a resist 483 and forms a pattern on the resist 483 (FIG. 27E). That is, the resist processing section 476 forms the pattern in which the resist 483 is removed from only a portion for forming the waveguide. The width (a double arrow 484) of the portion from which the resist is removed is set by the resist processing section 476 according to the length of the wavelength of incident light. Thus, as described above with reference to FIG. 24, it is possible to control the width of the waveguide core 303 or the width of the opening between the light shielding walls.

Therefore, for example, in the case of B pixel, the spacing of the resist 483 may be set to be narrow so that the width of the waveguide core 303 or the width of the opening between the light shielding walls is set to be narrow. In addition, in the case of R pixel, the spacing of the resist 483 may be set to be wide so that the width of the waveguide core 303 or the width of the opening between the light shielding walls is set to be wide.

In step S457, the dry etching section 477 performs a dry etching, and processes the light shielding wall 301 deposited by the process of step S454 and the clad 302A deposited by the process of step S455 (FIG. 27F). More specifically, the clad 302A and the light shielding wall 301 between the resist 483 described above are removed. That is, the clad 302A and the light shielding wall 301 are cut to the width according to the control in the step S456. During the dry etching, it is possible to reduce the plasma damage by performing an isotropic etching.

After the resist is removed, in step S458, the clad material deposition section 478 deposits a cladding material (the clad 302B) (FIG. 27G). This clad 302B is a portion of the clad 302 illustrated in FIG. 24.

In step S459, the core material embedding section 479 embeds a core material in a recessed portion formed as described above and forms the waveguide core 303. Thus, the waveguide including the waveguide core 303 and the clad 302 is formed. The core material may be any material having the refractive index higher than that of the material of the clad 302. For example, the core material may include silicon nitride (SiN), silicon oxynitride (SiON), and so on.

After the process of step S459 is completed, the manufacturing process is finished. In practice, thereafter, a wiring layer, color filter, focusing lens or the like may be formed.

Similarly, as described above, the manufacturing apparatus 400 can control simultaneously both the widths of the waveguide core 303 and the opening between the light shielding walls 301 by using the self-alignment process. In addition, this simultaneous control makes it possible to reduce the noise variance and improve the yield.

[4. Fourth Embodiment]
[Global Shutter CMOS Image Sensor]

An embodiment of the present technology is also applicable to the global shutter CMOS image sensor. FIG. 28 is a diagram illustrating an exemplary configuration of a cross section of the global shutter CMOS image sensor to which the present technology is applied. FIG. 28A is a cross sectional view of an B pixel and corresponds to FIG. 3A showing the case of the CCD image sensor 100. FIG. 28B is a cross sectional view of an R pixel and corresponds to FIG. 3C showing the case of the CCD image sensor 100.

A CMOS image sensor 500 illustrated in FIG. 28 is the global shutter CMOS image sensor according to an embodiment of the image sensor on which the present technology is applied. As illustrated in FIG. 28A, the CMOS image sensor 500 may include a photodiode (PD) 511 serving as the photoelectric conversion element. The photodiode 511 is, for example, the embedded photodiode which is formed by forming a P-type layer 521 (P+) on a substrate surface side and embedding an N-type buried layer 522 (N+) in the P-type well layer 502 formed on the N-type substrate (N-Sub) 501. In the present embodiment, N-type is set as a first conductivity and P-type is set as a second conductivity. Additionally, in the present embodiment, the N-type impurity concentration is higher in the order of N−, N, N+, and N++. Similarly, the P-type impurity concentration is higher in the order of P and P+.

The CMOS image sensor 500 includes a first transfer gate 512, a memory portion (MEM) 513, a second transfer gate 514, and a floating diffusion (FD) region 515, in addition to the photodiode 511.

The first transfer gate 512 transfers the charge that is photoelectrically converted and accumulated in the photodiode 511 to the gate electrode 523 by the application of a transfer pulse (TRX). The memory portion 513 is formed by the N-type buried channel 524 (N+) formed below the gate electrode 523 and holds the charge that is transferred from the photodiode 511 by the first transfer gate 512. The memory portion 513 is formed by the buried channel 524, and thus it is possible suppress to the occurrence of dark current at the substrate interface, thereby contributing improvement of the image quality.

In the memory portion 513, modulation can be applied to the memory portion 513 by placing a gate electrode 523 above the memory portion 513 and applying a transfer pulse (TRX) to the gate electrode 523. In other words, by applying a transfer pulse (TRX) to the gate electrode 523, the memory portion 513 has a deeper potential. This makes it possible to increase the saturation charge amount of the memory portion 513 than when it is not subjected to modulation.

The second transfer gate 514 transfers the charge held in the memory portion 513 to the gate electrode 526 by the application of a transfer pulse (TRG). The floating diffusion region 515 is the charge-voltage converter made of an N-type layer (N++), and converts the charge transferred from the memory portion 513 by the second transfer gate 514 into voltage.

The CMOS image sensor 500 may further include a reset transistor, an amplification transistor, and a selection transistor (any of these transistors is not shown).

The CMOS image sensor 500 may further include a charge discharging portion 516 configured to discharge the charge accumulated in the photodiode 511. The charge discharging portion 516 discharges the charge of the photodiode 511 to an N-type drain portion 528 (N++) by the application of a control pulse (ABG) to a gate electrode 527 at the start of exposure. The charge discharging portion 516 is further configured to prevent charge from being overflowed due to the saturation of photodiode 511 in the readout period after the end of exposure. A predetermined voltage (VDA) is applied to the drain portion 528.

The CMOS image sensor 500 may further include a P-type well layer 525 and an N-type layer region 531 (N−1) with a low concentration. The P-type well layer 525 is formed immediately below the memory portion 513. The N-type layer region 531 is a portion of the N-type substrate 501, which is formed as a protrusion in a portion of a deep region below the memory portion 513.

A wiring layer 503 with a readout circuit or the like formed therein is formed in the upper side in the figure of the P-type well layer 502. A light shielding film 541 is formed in the upper side in the figure of the wiring layer 503. An opening of the light shielding film 541 is formed above the photodiode 511 of the wiring layer 503. A waveguide made of a clad 542 and a waveguide core 543 is formed in the opening. The waveguide guides light incident from the upper side in the figure to the photodiode 511. The light shielding film 541 prevents the incident light from permeating into portions other than the photodiode 511.

In this way, even in the global shutter CMOS image sensor 500, it is possible to form the waveguide made of a clad and a waveguide core in each pixel, in a similar way to the CCD image sensor 100 or the back-illuminated CMOS image sensor 300 described above.

As illustrated in FIGS. 28A and 28B, in each of B pixel, G pixel (not shown), and R pixel, the width of the waveguide core 543 and the width of the opening of the light shielding film 541 can be different from each other, in a similar way to the CCD image sensor 100.

Thus, even in the global shutter CMOS image sensor 500, in a similar way to the CCD image sensor 100, the width of the waveguide core 543 and the width of the opening of the light shielding film 541 can be set to a size depending on the wavelength of light incident on a target pixel. In other words, both the widths of the waveguide core 543 and the opening of the light shielding film 541 may be set to be wider as the wavelength of light incident on a target pixel becomes longer.

More specifically, as illustrated in FIG. 28A, the width the waveguide core 543 and the width of the opening of the light shielding film 541 are formed to be narrowest for the B pixel on which light having the shortest wavelength region is incident. In addition, as illustrated in FIG. 28B, the widths of the waveguide core 543 and the opening of the light shielding film 541 are formed to be widest for the R pixel on which light having the longest wavelength region is incident. Although not illustrated in figure, for the G pixel, the waveguide core 543 and the opening of the light shielding film 541 are formed to have a middle-sized width between B pixel and R pixel.

With this configuration, in a similar way to the CCD image sensor 100, the CMOS image sensor 500 can suppress the reduction in sensitivity of the light receiving portion or the occurrence of noise, and further reduce the occurrence of color shading.

[Control of Waveguide Core Width in Light Emitting Side]

Even in the CMOS image sensor 500, in a similar way to the CCD image sensor 100, the width of the waveguide core 543 may be changed between the light incident surface and the light emitting surface of the waveguide. In this case, at least in the light emitting surface of the waveguide, the width of the waveguide core 543 and the width of the opening of the light shielding film 541 may be set to be wider as the wavelength of light incident on a target pixel becomes longer.

In this way, in a similar way to the CCD image sensor 100, the CMOS image sensor 500 can suppress the increase in noise components.

[Control of Waveguide Core Width in Light Incident Side]

Furthermore, also in the CMOS image sensor 500, in a similar way to the CCD image sensor 100, the width of the waveguide core 543 in the upper portion of the waveguide can be set independently of the width of the waveguide core 543 in the lower portion of the waveguide or the width of the opening of the light shielding film 541. In this way, in a similar way to the CCD image sensor 100, the CMOS image sensor 500 can suppress the occurrence of noise and the reduction in sensitivity.

The width of the waveguide core 543 in the upper portion of the waveguide may be set to satisfy any of the conditions of B pixel≤G pixel≤R pixel, B pixel≥G pixel≥R pixel, and B pixel=G pixel=R pixel.

Furthermore, the width of the waveguide core 543 in each pixel may be changed in three stages or more, or may be changed continuously. The waveguide core 543 is formed in a stepwise manner (more continuous change) between the light incident surface and the light emitting surface of the waveguide, and thus it is possible to mitigate the interference, thereby suppressing variation in the spectral ripple.

Moreover, even in the CMOS image sensor 500, in a similar way to the CCD image sensor 100, a center axis of the waveguide core 543 may be formed in a position to be determined for each wavelength region of incident light with respect to the center of the opening of the light shielding film 541.

Further, even in the CMOS image sensor 500, in a similar way to the CCD image sensor 100, the center axis of the waveguide core 543 and the center axis of the opening of the light shielding film 541 may be formed in the position to be determined for each wavelength region of incident light with respect to the center of a target pixel.

[Refractive Index of Clad]

Even in the CMOS image sensor 500, in a similar way to the CCD image sensor 100, the refractive index of the clad 542 may not be uniform in all parts. For example, a peripheral part of the clad may have a refractive index lower than that of an inner part of the clad 542. For example, the clad 542 near the waveguide core 543 may have a higher refractive index as it gets away from the waveguide core 543.

For example, the clad 542 may be formed in a multi-layer structure, and the refractive index thereof may be different for each layer. For example, a clad near the waveguide core 543 may have a lower refractive index as it closes to the waveguide core 543.

[Anti-Reflection Film]

Moreover, even in the CMOS image sensor 500, in a similar way to the CCD image sensor 100, an anti-reflection film may be provided near the opening of the light shielding film 541. Further, the width of the anti-reflection film may be set to a size depending on the width of the waveguide core 543 (or the width of the opening of the light shielding film 541).

[Pupil Correction]

Further, even in the CMOS image sensor 500, in a similar way to the CCD image sensor 100, the pupil correction may be performed according to a position of a target pixel in the photoelectric conversion region of the target pixel. In this way, the pupil correction is performed on the waveguide core 543 or the opening of the light shielding film 541, and thus it is possible to improve the shading characteristics.

[Manufacturing]

Figure 29:
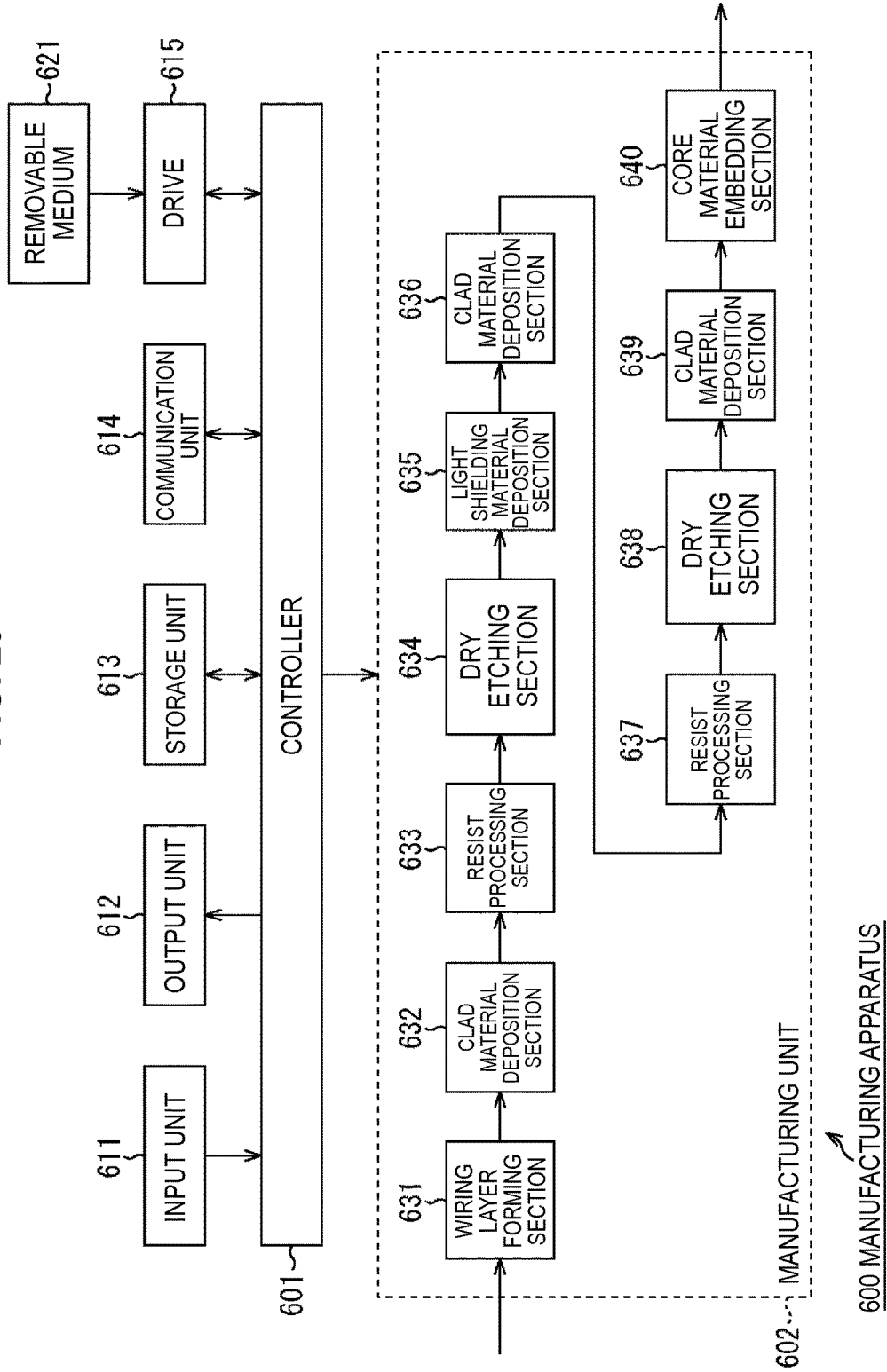
FIG. 29 is a block diagram illustrating a main configuration example of a manufacturing apparatus.

FIG. 29 is a block diagram illustrating a main configuration example of a manufacturing apparatus according to an embodiment of the manufacturing apparatus to which the present technology is applied. A manufacturing apparatus 600 illustrated in FIG. 29 is the manufacturing apparatus for fabricating the CMOS image sensor 500, and includes a controller 601 and a manufacturing unit 602.

The manufacturing apparatus 600 may include an input unit 611, an output unit 612, a storage unit 613, a communication unit 614, and a drive 615.

The controller 601, the input unit 611, the output unit 612, the storage unit 613, the communication unit 614, and the drive 615 are, respectively, similar processing components to the controller 201, the input unit 211, the output unit 212, the storage unit 213, the communication unit 214, and the drive 215 in the manufacturing apparatus 200. A removable medium 621 having a similar configuration to the removable medium 221, such as a magnetic disk, an optical disk, a magneto-optical disk, or a semiconductor memory is suitably attached to the drive 615 as necessary.

The manufacturing unit 602 is controlled by the controller 601 and performs a process for manufacturing the CMOS image sensor 500. The manufacturing unit 602 may include a wiring layer forming section 631, a clad material deposition section 632, a resist processing section 633, a dry etching section 634, a light shielding material deposition section 635, a clad material deposition section 636, a resist processing section 637, a dry etching section 638, a clad material deposition section 639, and a core material embedding section 640. These components from the wiring layer forming section 631 to the core material embedding section 640 are controlled by the controller 601, and perform a process of each step for manufacturing the CMOS image sensor 500 as described later.

For simplicity and clarity of illustration, only steps related to an embodiment of the present technology will be described herein. In practice, in order to manufacture the CMOS image sensor 500, steps other than those performed by these components are necessary and the manufacturing unit 602 may include a processing unit for the other steps. However, the other steps are similar to those necessary for the case of manufacturing a typical CMOS image sensor, and thus detailed descriptions of the other steps will be omitted herein.

Figure 30:
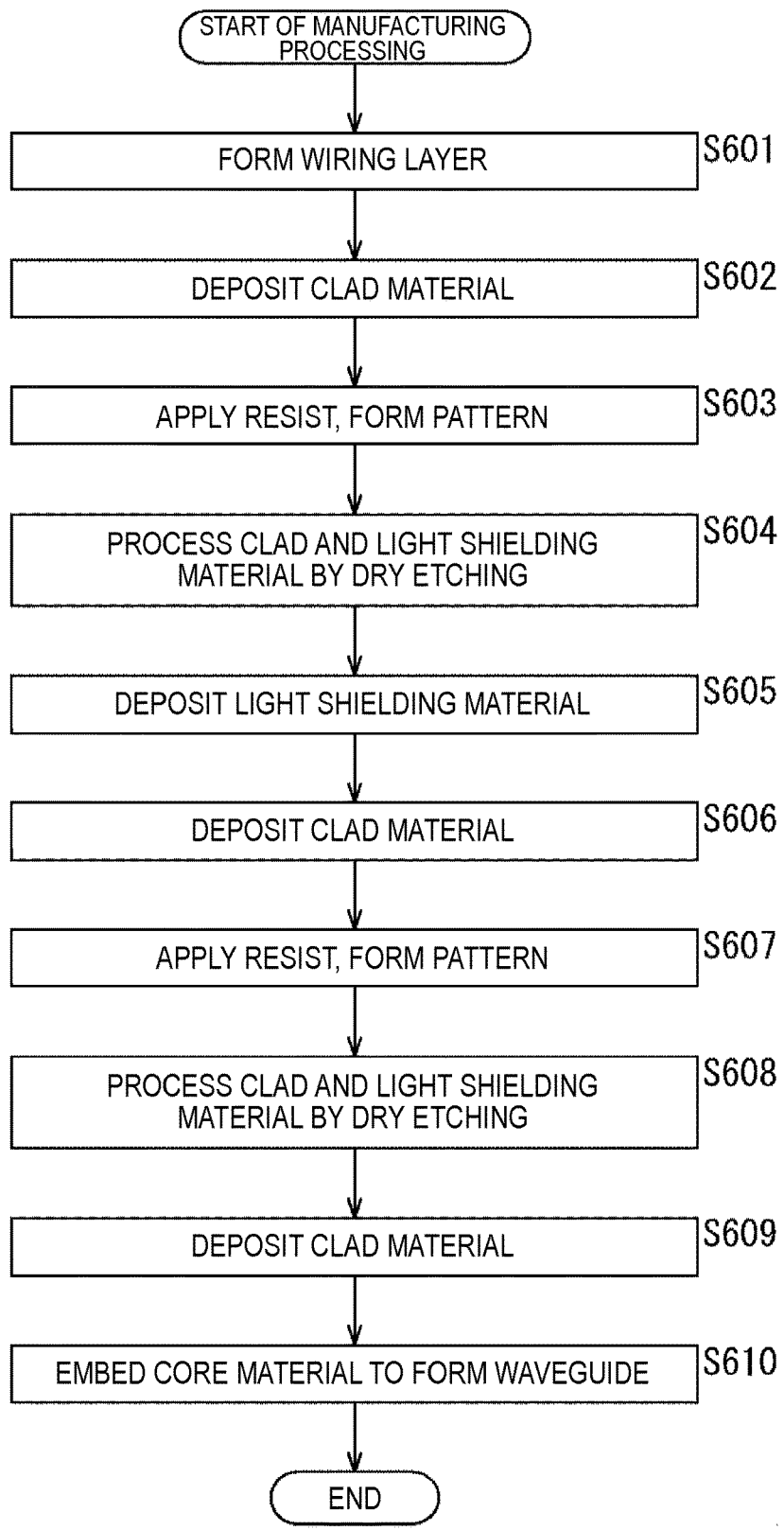
FIG. 30 is a flowchart for explaining an exemplary flow of a manufacturing process.

Referring to the flowchart of FIG. 30, an exemplary flow of manufacturing process will be described. In addition, the description will be given with reference to FIGS. 31 and 32 as appropriate. FIGS. 31 and 32 are diagrams for explaining each step for the manufacturing process.

When the manufacturing process is started, in step S601, the wiring layer forming section 631 forms the wiring layer 503 on the upper side in the figure of the P-type well layer 502 with a photodiode or other components formed therein (FIG. 31A).

In step S602, the clad material deposition section 632 deposits a clad 542A on a surface of the wiring layer 503 (FIG. 31B). The clad 542A is a portion of the clad 542 illustrated in FIG. 28. The cladding material uses materials having a refractive index lower than that of a material of the waveguide core 543. For example, the cladding material may include silicon oxide (SiO), silicon oxynitride (SiON), and so on.

In step S603, the resist processing section 633 applies a resist 651 on the light shielding material and forms a pattern on the resist 651 under the control of the controller 601 (FIG. 23B). That is, the resist processing section 633 forms the pattern in which the resist 651 is removed from only a portion for forming the waveguide. In this time, the resist processing section 633 may cause the width between the resists 651 to be set depending on the wavelength of incident light (for example, the width of the resist 651 may be set to be narrower as the wavelength of light incident on a target pixel becomes longer). In this way, as illustrated in FIG. 28, the width of the waveguide core 543 or the width of the opening of the light shielding film 541 can be controlled for each pixel.

In step S604, the dry etching section 634 performs a dry etching (half etching), processes the clad 542A and the wiring layer 503, and thus forms a recessed portion (depression) to form the waveguide (FIG. 31C).

The processes such as the resist patterning of step S603 and the half etching of step S604 are repeated while gradually narrowing the width between the resists 651, and thus the recessed portion (depression) is formed as illustrated in FIG. 32A. The deeper the depth of the recessed portion, the narrower the width of the recessed portion (depression).

The shape of the recessed portion (depression) could be optional. For example, the recessed portion may be formed in a stepwise shape. For example, the side faces of the recessed portion (depression) may be formed in a tapered shape so that its width is more continuously changed.

If the recessed portion (depression) reaches the P-type well layer 502, in step S605, the light shielding material deposition section 635 deposits the light shielding film 541. The light shielding material may include, but not limited to, metal such as tungsten (W) or aluminum (Al), organic material such as carbon black or titanium black, and so on. In step S606, the clad material deposition section 636 deposits the clad 542B (FIG. 32B). The clad 542B is a portion of the clad 542 illustrated in FIG. 28.

In step S607, the resist processing section 637 applies a resist and forms a pattern in which the resist is removed from only a bottom part of the recessed portion (depression). The controller 601 can control the width of the waveguide core 543 or the width of the opening of the light shielding film 541 by controlling the size of the spacing between the resists.

Subsequently, in step S608, the dry etching section 638 performs a dry etching to remove the clad 542B and the light shielding film 541 at the bottom part of the recessed portion (depression).

After the resist is removed, in step S609, the clad material deposition section 639 deposits a clad 542C. The clad 542C is a portion of the clad 542 illustrated in FIG. 28 (FIG. 32C).

In step S610, the core material embedding section 640 embeds a core material in the recessed portion (depression) formed as described above to form the waveguide core 543. In this way, the waveguide made of the waveguide core 543 and the clad 542 is formed. The core material may be any material having a refractive index higher than that of the material of the clad 542. For example, the core material may include silicon nitride (SiN), silicon oxynitride (SiON), and so on.

After the process of step S610 is completed, the manufacturing process is finished. In practice, thereafter, a wiring layer, color filter, focusing lens or the like may be formed.

As described above, the manufacturing apparatus 600 can manufacture the CMOS image sensor 500. Specifically, the manufacturing apparatus 600 can control simultaneously the width of the waveguide core 543 and the opening of the light shielding film 541 by using the self-alignment process. In addition, this simultaneous control makes it possible to suppress the noise variance and improve the yield.

<5. Fifth Embodiment>
<Imaging Apparatus>

Figure 33:
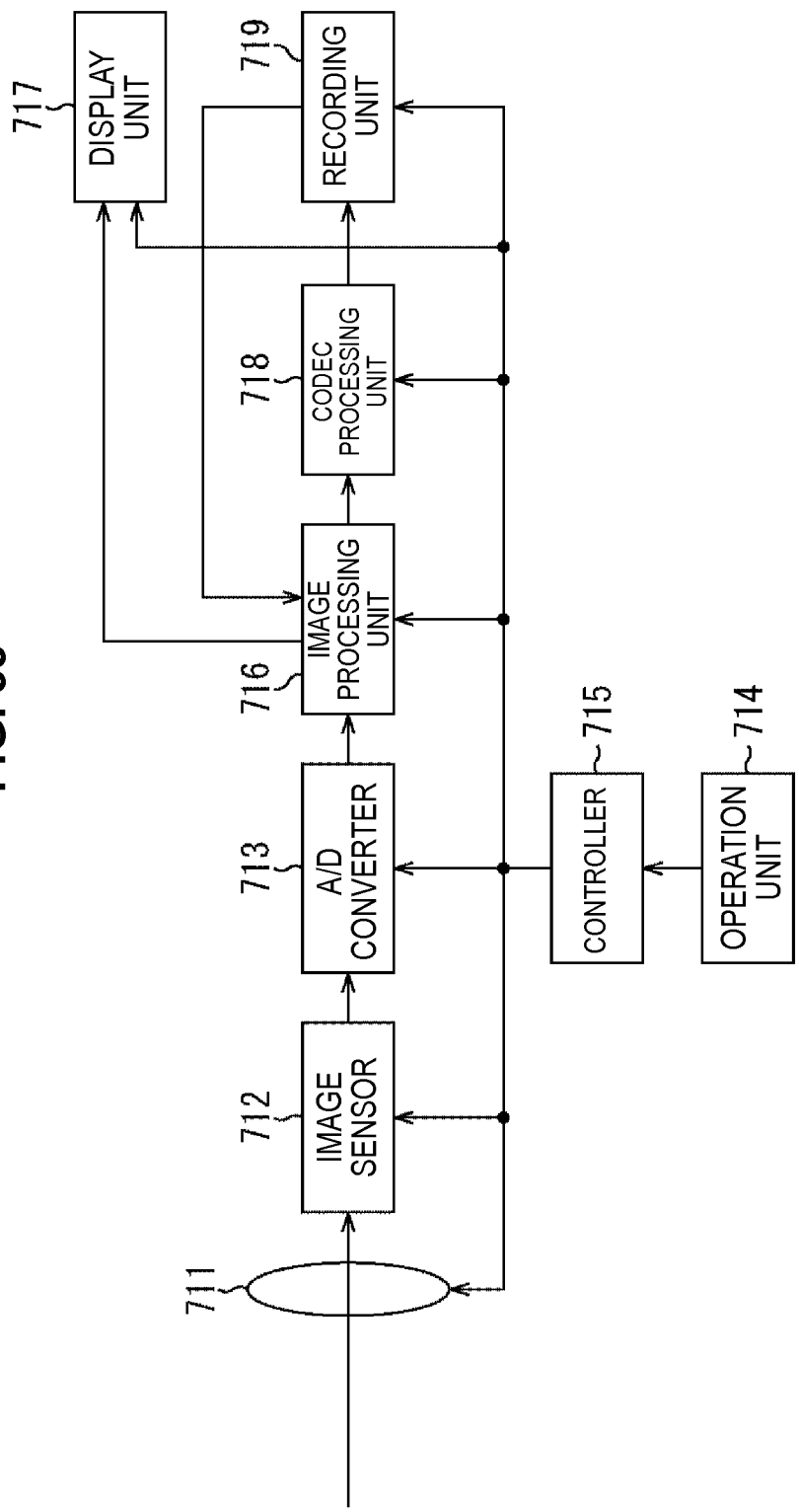
FIG. 33 is a block diagram illustrating a main configuration example of an imaging apparatus.

FIG. 33 is a block diagram illustrating an exemplary configuration of an imaging apparatus employing the above-described image sensor. An imaging apparatus 700 illustrated in FIG. 33 is a device which captures a subject and outputs an image of the subject as electrical signals.

As shown in FIG. 33, the imaging apparatus 700 includes an optical unit 711, an image sensor 712, an A/D converter 713, an operation unit 714, a controller 715, an image processing unit 716, a display unit 717, a codec processing unit 718 and a recording unit 719.

The optical unit 711 adjusts focal distance to a subject. The optical unit 711 includes a lens for condensing light from a position in focus, an aperture for adjusting exposure, a shutter for controlling the timing of an image, and so on. The optical unit 711 transmits light (incident light) from a subject and supplies it to the image sensor 712.

The image sensor 712 photoelectrically converts incident light into electric signal and supplies the signal (pixel signal) for each pixel to the A/D converter 713.

The A/D converter 713 converts the pixel signal supplied from the image sensor 712 at a predetermined timing into digital data (image data) and supplies it sequentially to the image processing unit 716 at a predetermined timing.

The operation unit 714 may include, for example, Jog Dial (registered trademark), keys, buttons, or a touch panel. The operation unit 714 receives a user's operation input and supplies a signal corresponding to the user's operation input to the controller 715.

The controller 715 controls the optical unit 711, the image sensor 712, the A/D converter 713, the image processing unit 716, the display unit 717, the codec processing unit 718, and the recording unit 719, based on the signal corresponding to the user's operation input inputted to the operation unit 714. The controller 715 causes each component unit to perform a process relevant to imaging.

The image processing unit 716 performs various types of image processing for image data supplied from the A/D converter 713, such as the color mixing correction, black level correction, white balance adjustment, demosaic processing, matrix processing, gamma correction, YC conversion, and so on. The image processing unit 716 supplies image data subjected to image processing to the display unit 717 and codec processing unit 718.

The display unit 717 may include a liquid crystal display, and displays an image of a subject based on image data supplied from the image processing unit 716.

The codec processing unit 718 performs a coding process of a predetermined scheme for image data supplied from the image processing unit 716 and supplies coded data obtained by the coding process to the recording unit 719.

The recording unit 719 stores coded data supplied from the codec processing unit 718. The image processing unit 716 reads out and decodes the coded data stored in the recording unit 719, as necessary. Image data obtained by the decoding process is supplied to the display unit 717 for displaying an image corresponding to image data.

The embodiment of the present technology is applicable to the image sensor 712 of the imaging apparatus 700 as described above. In other words, examples of the image sensor 712 include the CCD image sensor 100, CMOS image sensor 300, CMOS image sensor 500 or the like, as described above. Thus, according to the image sensor 712, it is possible to suppress the occurrence of noise. Accordingly, the imaging apparatus 700, when capturing a subject, can obtain a higher quality image.

Examples of the image apparatus to which embodiments of the present technology are applicable are not limited to the above-described example, and other configurations may be possible. Examples of the image apparatus may include digital still camera or video camera, or information processing apparatus (electronic device) having an imaging function, such as mobile phones, smart phones, tablet devices, personal computers. In addition, examples of the image apparatus may include a camera module which is used with being attached (or mounted as a built-in device) to another information processing apparatus.

The series of processes described above can be executed in hardware or in software. In the case of executing the series of processes in software as described above, a program constituting software is installed from a network or recording medium.

This recording medium may be configured to include the removable media 221 in which the programs distributed to deliver to a user are stored independently of the apparatus as shown in FIGS. 14, 23, 25, and 29, the removable media 421, and a removable media 621. Examples of the removable media 221, the removable media 421, and a removable media 621 include a magnetic disk (including a flexible disk) or an optical disk (including a CD-ROM or DVD). Further, examples of the removable media 221 include a magneto-optical disk (including MD (Mini-Disc)) or a semiconductor memory. The recording medium may be configured as the ROM in which programs distributed to a user in a state pre-incorporated in the apparatus as well as the removable media 221, the removable media 421, and a removable media 621 are stored or may be configured as a hard disk included in the storage unit 213, the storage unit 413, or the storage unit 613.

It should be noted that the program executed by a computer may be a program that is processed in time series according to the sequence described in this specification or a program that is processed in parallel or at necessary timing such as upon calling.

It should be also noted that, in this specification, the steps describing the program stored in the recording medium include not only a process performed in time series according to the sequence shown therein but also a process executed in parallel or individually, not necessarily performed in time series.

Further, in the present disclosure, a system has the meaning of a set of a plurality of configured elements (such as an apparatus or a module (part)), and does not take into account whether or not all the configured elements are in the same casing. Therefore, the system may be either a plurality of apparatuses, stored in separate casings and connected through a network, or a plurality of modules within a single casing.

Further, an element described as a single device (or processing unit) above may be configured as a plurality of devices (or processing units). On the contrary, elements described as a plurality of devices (or processing units) above may be configured collectively as a single device (or processing unit). Further, an element other than those described above may be added to each device (or processing unit). Furthermore, a part of an element of a given device (or processing unit) may be included in an element of another device (or another processing unit) as long as the configuration or operation of the system as a whole is substantially the same.

It should be understood by those skilled in the art that various modifications, combinations, sub-combinations and alterations may occur depending on design requirements and other factors insofar as they are within the scope of the appended claims or the equivalents thereof.

For example, the present disclosure can adopt a configuration of cloud computing which processes by allocating and connecting one function by a plurality of apparatuses through a network.

Further, each step described by the above-mentioned flow charts can be executed by one apparatus or by allocating a plurality of apparatuses.

In addition, in the case where a plurality of processes is included in one step, the plurality of processes included in this one step can be executed by one apparatus or by allocating a plurality of apparatuses.

Additionally, the present technology may also be configured as below.

(1) An image sensor having a plurality of pixels, each pixel including:
- a light receiving portion configured to receive incident light;
- a waveguide configured to guide the incident light from a light incident surface to the light receiving portion; and
- a light shielding portion disposed between the light incident surface and the light receiving portion, for blocking the incident light,
- wherein the light shielding portion has an opening formed near a light emitting surface of the waveguide,
- wherein the light receiving portion receives the incident light passing through the waveguide and the opening, and
- wherein a width of a core of the waveguide and a width of the opening are set so that the widths increase as a wavelength of the light incident on a pixel becomes longer.

(2) The image sensor according to (1), wherein the width of the core and the width of the opening are set to have a size such that oblique incident light is blocked by the light shielding portion and an amount of light in diffracted light at both ends of the opening is decreased, the oblique incident light passing through the opening and being incident on an outside of the light receiving portion.

(3) The image sensor according to (1) or (2), wherein a width of the core in the light emitting surface of the waveguide is set to be wider as the wavelength of the light incident on a pixel becomes longer.

(4) The image sensor according to (3), wherein a width of the core in the light incident surface of the waveguide is set to have a size different from the width of the core in the light emitting surface of the waveguide.

(5) The image sensor according to (4), wherein the width of the core in the light incident surface of the waveguide is set to be wider as the wavelength of the light incident on a pixel becomes longer.

(6) The image sensor according to (4) or (5), wherein the width of the core in the light incident surface of the waveguide is set to be wider as the wavelength of the light incident on a pixel becomes shorter.

(7) The image sensor according to any one of (4) to (6), wherein the width of the core in the light incident surface of the waveguide is set to have a predetermined size regardless of a wavelength of the incident light.

(8) The image sensor according to any one of (1) to (7), wherein a center of the core is located at a position determined for each wavelength range of the incident light with respect to a center of the opening.

(9) The image sensor according to any one of (1) to (8), wherein a center of the core and a center of the opening are each located at a position determined for each wavelength range of the incident light with respect to a center of a pixel.

(10) The image sensor according to any one of (1) to (9), wherein the waveguide includes the core with a high refractive index and a clad with a lower refractive index than the core, the clad with a lower refractive index being formed near the core.

(11) The image sensor according to (10), wherein the clad includes a plurality of layers and has refractive indexes lowered from an outer layer to an inner layer of the waveguide.

(12) The image sensor according to any one of (1) to (11), further including:
an anti-reflection film disposed between the opening and the light receiving portion.

(13) The image sensor according to any one of (1) to (12), wherein an anti-reflection film is formed to have a size corresponding to the width of the core.

(14) The image sensor according to any one of (1) to (13), wherein a pupil correction is performed on a position of a center of the core and a position of a center of the opening with respect to a center of the light receiving portion, the pupil correction being performed depending on a position of a target pixel in a photoelectric conversion region.

(15) The image sensor according to any one of (1) to (14), further including:
a condensing lens configured to condense the incident light; and
a filter configured to extract a predetermined wavelength range component from the incident light transmitted through the condensing lens,
wherein the incident light of the wavelength range component transmitted through the condensing lens and the filter is incident on the waveguide.

(16) An imaging apparatus including:
an image sensor having a plurality of pixels; and
an image processing portion configured to perform an image processing on an image of a subject obtained by photoelectric conversion in the image sensor,
wherein each of the pixels includes
a light receiving portion configured to receive incident light;
a waveguide configured to guide the incident light from a light incident surface to the light receiving portion; and
a light shielding portion disposed between the light incident surface and the light receiving portion, for blocking the incident light,
wherein the light shielding portion has an opening formed near a light emitting surface of the waveguide,
wherein the light receiving portion receives the incident light passing through the waveguide and the opening, and
wherein a width of a core of the waveguide and a width of the opening are set so that the widths increase as a wavelength of the light incident on a pixel becomes longer.

(17) An apparatus for manufacturing an image sensor, the apparatus including:
a patterning portion configured to perform patterning of a resist so that a light shielding material and a clad are etched as a wavelength of light incident on a pixel becomes longer with respect to the image sensor formed by stacking the light shielding material and the clad;
an etching portion configured to etch the light shielding material and the clad based on the resist patterned by the patterning portion;
a clad deposition portion is configured to deposit a clad on a surface of the image sensor, the surface being etched by the etching portion; and
an embedding portion configured to embed a material with a high refractive index for forming a core of a waveguide in a portion etched by the etching portion.

(18) A method of manufacturing an image sensor in a manufacturing apparatus, the method including:
performing patterning of a resist so that a light shielding material and a clad are etched as a wavelength of light incident on a pixel becomes longer with respect to the image sensor formed by stacking the light shielding material and the clad;
etching the light shielding material and the clad based on the resist;
depositing a clad on an etched surface of the image sensor; and
embedding a material with a high refractive index for forming a core of a waveguide in a etched portion.

(19) The method according to (18), further including:
prior to depositing the clad, processing the light shielding material and widening a width of a portion having a thin thickness of the light shielding material as the wavelength of the light incident on the pixel becomes longer.

(20) The method according to (18) or (19), further including:
depositing an uneven material;
processing for causing a width of a portion having a thin thickness of the uneven material to be wider as the wavelength of the light incident on the pixel becomes longer; and
depositing the light shielding material and the clad on a surface of the processed uneven material.

The present disclosure contains subject matter related to that disclosed in Japanese Priority Patent Application JP 2012-190661 filed in the Japan Patent Office on Aug. 30, 2012, the entire content of which is hereby incorporated by reference.

What is claimed is:
1. An image sensor, comprising:
a plurality of pixels, wherein each of the plurality of pixels comprises:
a light incident surface;

a light receiving portion configured to receive light incident on the light incident surface;

a vertical waveguide between the light incident surface and the light receiving portion, wherein the vertical waveguide is configured to guide the light from the light incident surface to the light receiving portion, wherein the vertical waveguide includes a first end that extends toward the light incident surface and a second end that extends toward the light receiving portion, and wherein a width of a core of the vertical waveguide between the light incident surface and the light receiving portion is uniform; and a light shielding portion between the light incident surface and the light receiving portion, wherein the light shielding portion is configured to block the light, wherein
the light shielding portion includes an opening, wherein the second end of the vertical waveguide extends into the opening, the light receiving portion is further configured to receive the light that passes through the vertical waveguide and the opening, a first position of a first center axis of the core of the vertical waveguide is at a specific distance from a second position of a second center axis of the opening, and wherein the first center axis is in a vertical direction of the vertical waveguide and the second center axis is in the vertical direction of the opening.

2. The image sensor according to claim 1, wherein a first width of a light incident surface side of the vertical waveguide and a second width of the opening are set to have a size such that oblique incident light is blocked by the light shielding portion and an amount of light in diffracted light at both of the first and second end of the opening is decreased, and wherein the oblique incident light is configured to pass through the opening and is incident on an outside of the light receiving portion.

3. The image sensor according to claim 1, wherein a third width of a light incident surface side of the vertical waveguide, of each of the plurality of pixels, is proportional to a specific wavelength of the light incident on a corresponding pixel of the plurality of pixels.

4. The image sensor according to claim 1, wherein the first center axis of the core of the vertical waveguide is at the first position, and wherein the first position is specific for each wavelength range of the light with respect to the second center axis of the opening.

5. The image sensor according to claim 1, wherein the first position and the second position are specific for each wavelength range of the light with respect to a center of a corresponding pixel of the plurality of pixels.

6. The image sensor according to claim 1, wherein the vertical waveguide further includes the core with a first refractive index and a clad with a second refractive index lower than the first refractive index, and wherein the clad is at a specific proximity to the core.

7. The image sensor according to claim 6, wherein the clad further includes a plurality of layers, and wherein a corresponding refractive index of each of the plurality of layers is lowered from an outer layer of the plurality of layers to an inner layer of the plurality of layers of the vertical waveguide.

8. The image sensor according to claim 1, further comprising
an anti-reflection film between the opening and the light receiving portion.

9. The image sensor according to claim 8, wherein a size of the anti-reflection film corresponds to the width of the core of the vertical waveguide.

10. The image sensor according to claim 1, wherein a pupil correction process is on a position of a center of the core of the vertical waveguide and on a position of a center of the opening with respect to a center of the light receiving portion, and wherein the pupil correction process is based on a position of a target pixel in a photoelectric conversion region.

11. The image sensor according to claim 1, further comprising:
a condensing lens configured to condense the light; and
a filter configured to extract a specific wavelength range component from the light transmitted through the condensing lens, wherein the light of the specific wavelength range component transmitted through the condensing lens and the filter is incident on the vertical waveguide.

12. An imaging apparatus, comprising:
an image sensor that has a plurality of pixels; and
an image processing portion configured to process an image of a subject obtained by photoelectric conversion in the image sensor,
wherein each of the plurality of pixels includes:
a light incident surface;
a light receiving portion configured to receive light incident on the light incident surface;
a vertical waveguide between the light incident surface and the light receiving portion, wherein the vertical waveguide is configured to guide the light from the light incident surface to the light receiving portion, wherein the vertical waveguide includes a first end that extends toward the light incident surface and a second end that extends toward the light receiving portion, and wherein a width of a core of the vertical waveguide between the light incident surface and the light receiving portion is uniform; and
a light shielding portion, between the light incident surface and the light receiving portion, configured to block the incident light,
wherein the light shielding portion includes an opening, wherein the second end of the vertical waveguide extends into the opening,
wherein the light receiving portion is configured to receive the light that passes via the vertical waveguide and the opening,
wherein a position of a first center axis of the core of the vertical waveguide is at a specific distance from a position of a second center axis of the opening, and
wherein the first center axis is in a vertical direction of the vertical waveguide and the second center axis is in the vertical direction of the opening.

* * * * *